United States Patent
Song et al.

(10) Patent No.: US 11,955,078 B2
(45) Date of Patent: *Apr. 9, 2024

(54) DISPLAY DEVICE

(71) Applicant: Samsung Display Co., Ltd., Yongin-si (KR)

(72) Inventors: Heerim Song, Seoul (KR); Heejean Park, Suwon-si (KR); Yujin Lee, Suwon-si (KR); Cheol-Gon Lee, Suwon-si (KR); Mukyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/888,295

(22) Filed: Aug. 15, 2022

(65) Prior Publication Data

US 2023/0098891 A1   Mar. 30, 2023

(30) Foreign Application Priority Data

Sep. 29, 2021   (KR) .................. 10-2021-0129293

(51) Int. Cl.
*G09G 3/3233* (2016.01)
*H10K 59/13* (2023.01)
(Continued)

(52) U.S. Cl.
CPC ... *G09G 3/3233* (2013.01); *G09G 2300/0819* (2013.01); *G09G 2300/0842* (2013.01);
(Continued)

(58) Field of Classification Search
CPC ......... G09G 3/3233; G09G 2300/0819; G09G 2300/0842; G09G 2300/0861;
(Continued)

(56) References Cited

U.S. PATENT DOCUMENTS 6,690,000 B1 * 2/2004 Muramatsu ............ H04N 25/76
                                                            250/214 R
8,797,238 B2   8/2014 Kwak et al.
(Continued)

FOREIGN PATENT DOCUMENTS

KR         10-0761077 B1    9/2007
KR     10-2009-0076582 A    7/2009
(Continued)

OTHER PUBLICATIONS

International Search Report dated Oct. 20, 2022, issued in PCT/KR2022/010860, 3 pages.

*Primary Examiner* — Tom V Sheng
(74) *Attorney, Agent, or Firm* — Lewis Roca Rothgerber Christie LLP

(57) ABSTRACT

A display device includes: a pixel driving circuit configured to drive the light emitting elements of pixels; and sensors including a light sensing element and a sensor driving circuit connected with the light sensing element and configured to output a sensing signal corresponding to a light, the sensor driving circuit including: a reset transistor including a first electrode configured to receive a reset signal, a second electrode connected with a first sensing node, and a third electrode configured to receive a reset control signal; an amplification transistor including a first electrode configured to receive a sensing driving voltage, a second electrode connected with a second sensing node, and a third electrode connected with the first sensing node; and an output transistor including a first electrode connected with the second sensing node, a second electrode connected with a sensing line, and a third electrode configured to receive an output control signal.

40 Claims, 25 Drawing Sheets

(51) Int. Cl.
*H10K 59/60* (2023.01)
*H10K 59/65* (2023.01)

(52) U.S. Cl.
CPC ............... *G09G 2300/0861* (2013.01); *G09G 2310/0291* (2013.01); *G09G 2354/00* (2013.01); *G09G 2360/144* (2013.01); *G09G 2360/148* (2013.01); *H10K 59/13* (2023.02); *H10K 59/60* (2023.02); *H10K 59/65* (2023.02)

(58) Field of Classification Search
CPC ....... G09G 2310/0291; G09G 2354/00; G09G 2360/144; G09G 2360/148; H10K 59/13; H10K 59/60; H10K 59/65
USPC .......................................................... 345/207
See application file for complete search history.

(56) References Cited

U.S. PATENT DOCUMENTS

| | | | |
|---|---|---|---|
| 9,741,290 | B1* | 8/2017 | Lee ................... G09G 3/3233 |
| 11,087,679 | B2 | 8/2021 | Lim et al. |
| 11,158,258 | B2 | 10/2021 | Cha et al. |
| 2008/0054164 | A1* | 3/2008 | Johansson ............. H04N 25/00 250/214 R |
| 2009/0174731 | A1 | 7/2009 | Kim et al. |
| 2010/0231767 | A1* | 9/2010 | Kikuchi ................ H04N 25/76 348/301 |
| 2010/0238135 | A1* | 9/2010 | Brown .................... G06F 3/042 345/175 |
| 2012/0242621 | A1* | 9/2012 | Brown ............. H01L 27/14678 345/175 |
| 2018/0069068 | A1 | 3/2018 | Ka et al. |
| 2020/0035151 | A1* | 1/2020 | Feng .................. G06V 40/1318 |
| 2022/0012453 | A1* | 1/2022 | Choi .................. H10K 59/1213 |
| 2022/0036826 | A1* | 2/2022 | Cha .................... G06V 40/1318 |
| 2022/0336561 | A1* | 10/2022 | Cha ...................... H10K 59/131 |
| 2023/0069681 | A1* | 3/2023 | Jo ........................ G09G 3/3266 |
| 2023/0075463 | A1* | 3/2023 | Lee ....................... G09G 3/3233 |

FOREIGN PATENT DOCUMENTS

| | | |
|---|---|---|
| KR | 10-2017-0033496 A | 3/2017 |
| KR | 10-2019-0015159 A | 2/2019 |
| KR | 10-2020-0034890 A | 4/2020 |
| KR | 10-2020-0082663 A | 7/2020 |
| KR | 10-2021-0064483 A | 6/2021 |

\* cited by examiner

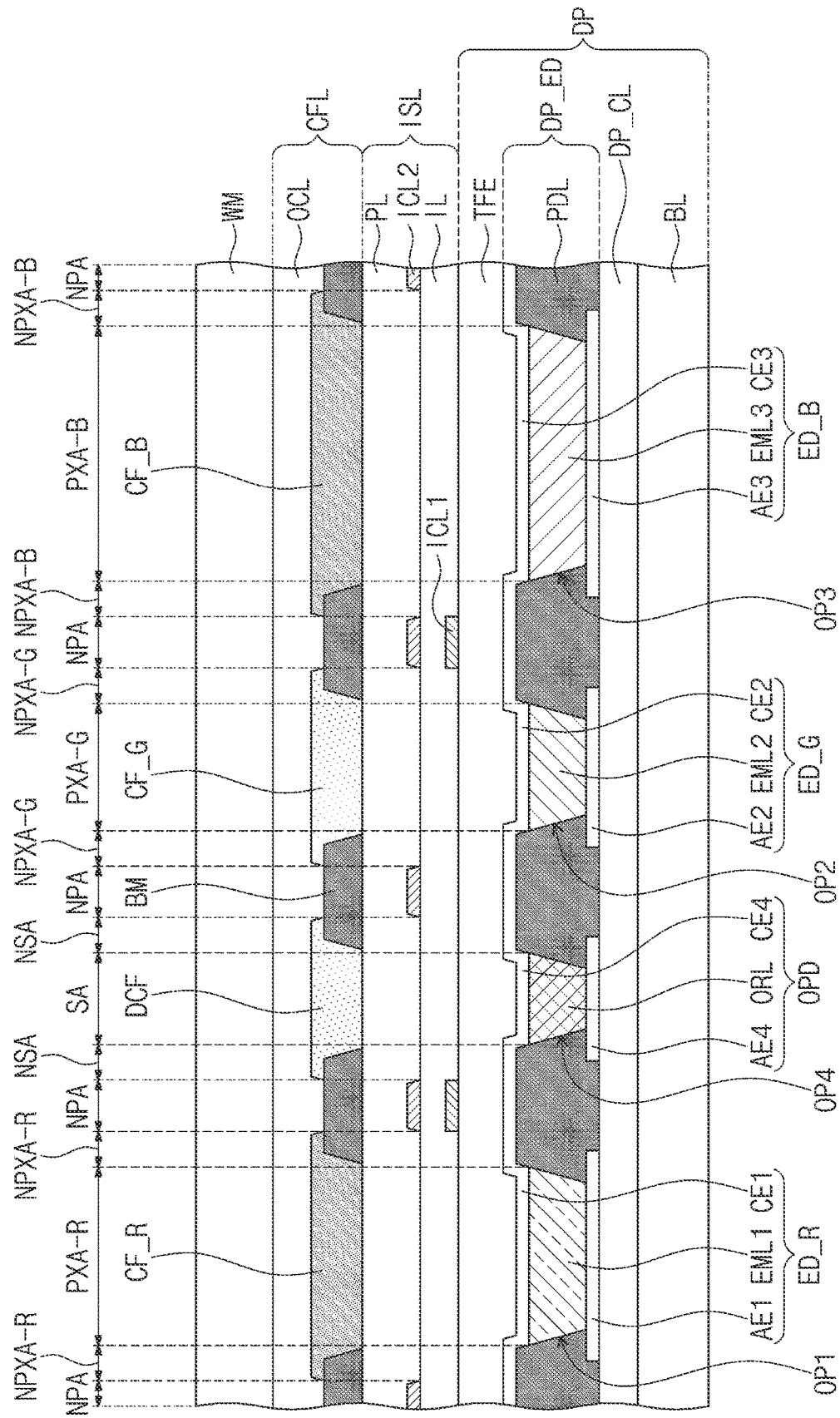

DISPLAY DEVICE

CROSS-REFERENCE TO RELATED APPLICATION

The present application claims priority to and the benefit of Korean Patent Application No. 10-2021-0129293 filed on Sep. 29, 2021, in the Korean Intellectual Property Office, the entire disclosure of which is incorporated by reference herein in their entireties.

BACKGROUND

Aspects of some embodiments of the present disclosure described herein relate to a display device.

A display device displays images to provide information to users or provides various functions, which enable organic communication with users, such as a function of sensing user input. Nowadays, display devices include a function for sensing biometric information of users.

A biometric information recognizing manner includes a capacitive manner of sensing a change in capacitance formed between electrodes, an optical manner of sensing an incident light by using a light sensor, an ultrasonic manner of sensing vibration by utilizing a piezoelectric body, or the like.

The above information disclosed in this Background section is only for enhancement of understanding of the background and therefore the information discussed in this Background section does not necessarily constitute prior art.

SUMMARY

Aspects of some embodiments of the present disclosure described herein relate to a display device, and for example, relate to a display device capable of recognizing biometric information.

Aspects of some embodiments of the present disclosure include a display device in which sensing performance of a sensor for recognizing biometric information is relatively improved.

According to some embodiments, a display device includes a plurality of pixels each of which includes a light emitting element and a pixel driving circuit connected with the light emitting element to drive the light emitting element, and a plurality of sensors each of which includes a light sensing element and a sensor driving circuit connected with the light sensing element to output a sensing signal corresponding to a light.

According to some embodiments, the sensor driving circuit includes a reset transistor, an amplification transistor, and an output transistor. The reset transistor may include a first electrode receiving a reset signal, a second electrode connected with a first sensing node, and a third electrode receiving a reset control signal. The amplification transistor may include a first electrode receiving a sensing driving voltage, a second electrode connected with a second sensing node, and a third electrode connected with the first sensing node. The output transistor may include a first electrode connected with the second sensing node, a second electrode connected with a sensing line, and a third electrode receiving an output control signal. The reset transistor may be an oxide semiconductor transistor.

According to some embodiments, a display device includes a base layer, a circuit layer that is located on the base layer and includes a pixel driving circuit and a sensor driving circuit, and an element layer that is located on the circuit layer and includes a light emitting element connected with the pixel driving circuit and a light sensing element connected with the sensor driving circuit.

According to some embodiments, the sensor driving circuit includes a reset transistor, an amplification transistor, and an output transistor. The reset transistor may include a first electrode receiving a reset signal, a second electrode connected with a first sensing node, and a third electrode receiving a reset control signal. The amplification transistor may include a first electrode receiving a sensing driving voltage, a second electrode connected with a second sensing node, and a third electrode connected with the first sensing node. The output transistor may include a first electrode connected with the second sensing node, a second electrode connected with a sensing line, and a third electrode receiving an output control signal. The reset transistor may be an oxide semiconductor transistor.

BRIEF DESCRIPTION OF THE FIGURES

The above and other characteristics and features of the present disclosure will become apparent by describing in more detail aspects of some embodiments thereof with reference to the accompanying drawings.

FIGS. 23A and 23B are cross-sectional views illustrating a light emitting element and a light sensing element of a display panel according to some embodiments of the present disclosure.

DETAILED DESCRIPTION

Figure 1:
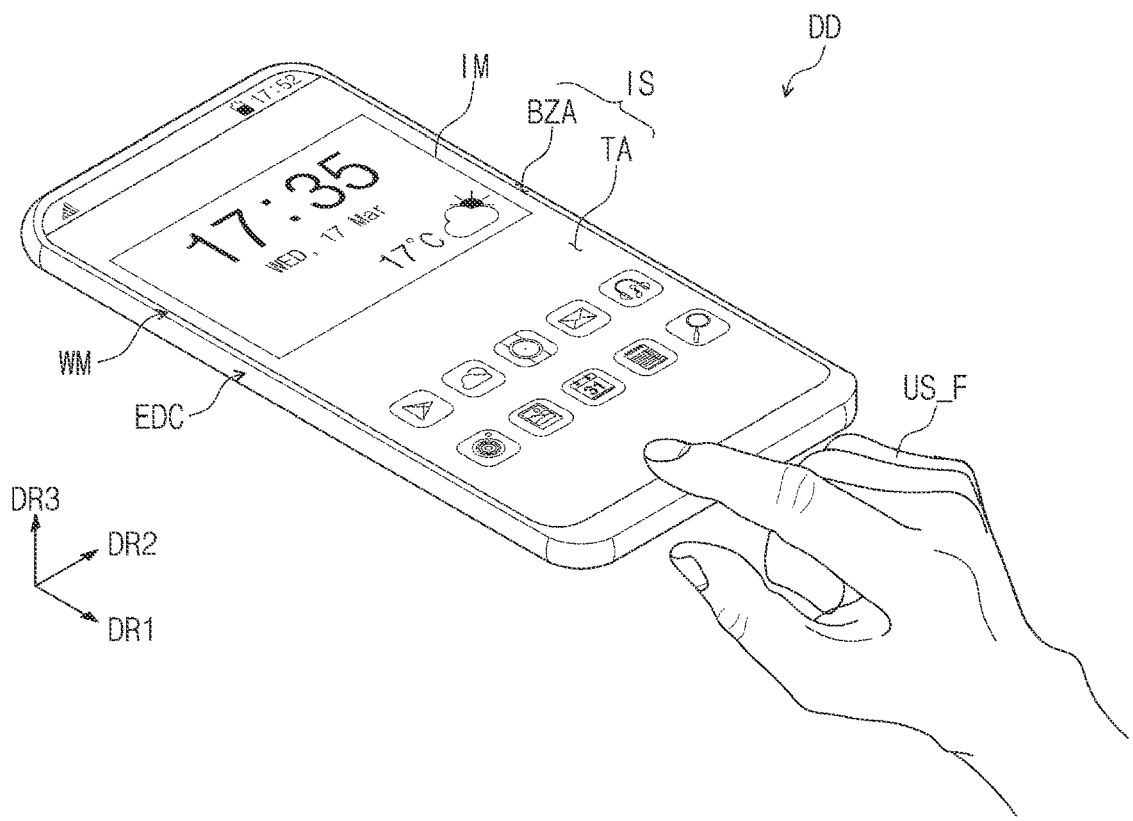
FIG. 1 is a perspective view of a display device according to some embodiments of the present disclosure.

In the specification, the expression that a first component (or area, layer, part, portion, etc.) is "on", "connected with", or "coupled to" a second component means that the first component is directly on, connected with, or coupled to the second component or means that a third component is interposed therebetween.

The same reference numeral refers to the same component. In addition, in drawings, thicknesses, proportions, and dimensions of components may be exaggerated to describe the technical features effectively. The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the invention, a first component may be referred to as a second component, and similarly, the second component may be referred to as the first component. The singular forms are intended to include the plural forms unless the context clearly indicates otherwise.

Also, the terms "under", "below", "on", "above", etc. are used to describe the correlation of components illustrated in drawings. The terms are relative and are described with reference to a direction indicated in the drawing.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Below, embodiments of the present disclosure will be described with reference to accompanying drawings.

Figure 2:
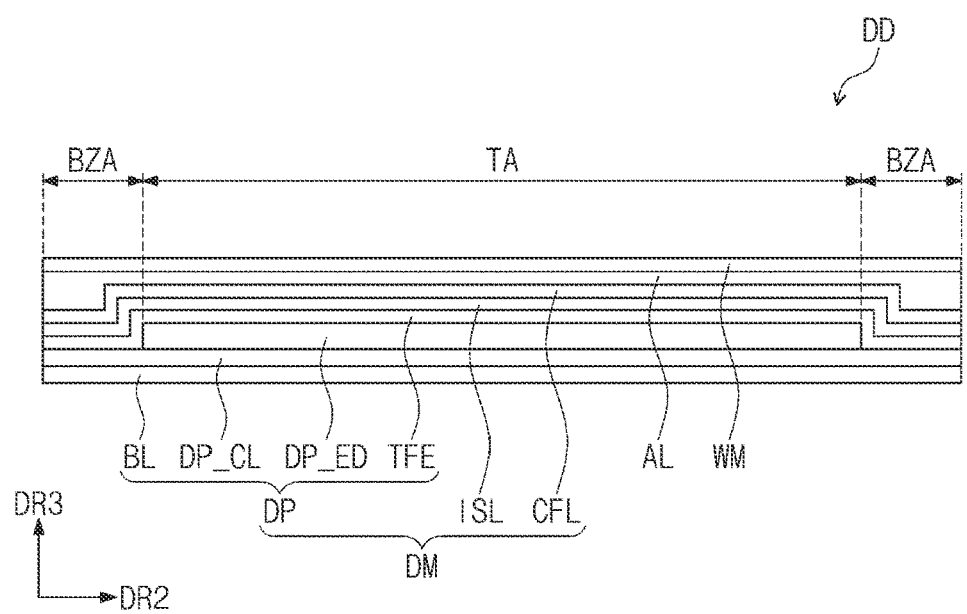
FIG. 2 is a cross-sectional view of a display device according to some embodiments of the present disclosure.

FIG. 1 is a perspective view of a display device according to some embodiments of the present disclosure, and FIG. 2 is a cross-sectional view of a display device according to some embodiments of the present disclosure.

Referring to FIGS. 1 and 2, a display device DD according to some embodiments of the present disclosure may have a shape of a rectangle having long edges parallel to a first direction DR1 and short edges parallel to a second direction DR2 intersecting with the first direction DR1. However, embodiments according to the present disclosure are not limited thereto. For example, the display device DD may have various shapes such as a circle and a polygon.

The display device DD may be a device that is activated depending on an electrical signal. The display device DD may include various embodiments. For example, the display device DD may be applied to an electronic device such as a smart watch, a tablet PC, a notebook computer, a computer, or a smart television.

Below, a normal direction that is substantially perpendicular to a plane defined by the first direction DR1 and the second direction DR2 is defined as a third direction DR3. In the specification, the meaning of "when viewed from above a plane" or "in a plan view" may refer to "when viewed in the third direction DR3".

An upper surface of the display device DD may be defined as a display surface IS and may have a plane defined by the first direction DR1 and the second direction DR2. Images IM generated by the display device DD may be provided to the user through the display surface IS.

The display surface IS may be divided into a transparent area TA and a bezel area BZA. The transparent area TA may be an area at which the images IM are displayed. The user visually perceives the images IM through the transparent area TA. According to some embodiments, the transparent area TA is illustrated in the shape of a quadrangle whose vertexes or corners are rounded. However, this is illustrated by way of an example. The transparent area TA may have any suitable shape according to the design of the display device DD, and may not be limited to any one embodiment.

The bezel area BZA is adjacent to the transparent area TA. The bezel area BZA may have a given color. The bezel area BZA may surround the transparent area TA. Accordingly, the shape of the transparent area TA may be defined substantially by the bezel area BZA. However, this is illustrated by way of an example. The bezel area BZA may be located adjacent to only one side of the transparent area TA or may be omitted.

The display device DD may sense external input applied from the outside. The external input may include various types of input that are provided from the outside of the display device DD. For example, as well as a contact by a part of a body such as the user's hand US_F, the external input may include an external input (e.g., hovering) that approaches the display device DD or is adjacent to the display device DD within a given distance. In addition, the external input may be provided in various types such as force, pressure, temperature, light, and the like.

The display device DD may sense biometric information of the user that is applied from the outside. A biometric information sensing area capable of sensing biometric information of the user may be provided on the display surface IS of the display device DD. The biometric information sensing area may be provided in the whole or entire area of the transparent area TA or may be provided in a partial area of the transparent area TA. An example in which the whole transparent area TA is utilized as the biometric information sensing area is illustrated in FIG. 1, but embodiments according to the present disclosure are not limited thereto. For example, the biometric information sensing area may be implemented with a portion of the transparent area TA.

The display device DD may include a window WM, a display module DM, and a housing EDC. According to some embodiments, the window WM and the housing EDC are coupled to each other and form the exterior of the display device DD.

A front surface of the window WM defines the display surface IS of the display device DD. The window WM may include an optically transparent insulating material. For example, the window WM may include glass or plastic. The window WM may include a multi-layer structure or a single-layer structure. For example, the window WM may include a plurality of plastic films bonded by an adhesive or may have a glass substrate and a plastic film bonded by an adhesive.

The display module DM may include a display panel DP and an input sensing layer ISL. The display panel DP may display an image depending on an electrical signal, and the input sensing layer ISL may sense an external input applied from the outside. The external input may be provided in various forms from the outside.

The display panel DP according to some embodiments of the present disclosure may be a light emitting display panel and is not particularly limited thereto. For example, the display panel DP may be an organic light emitting display panel, an inorganic light emitting display panel, or a quantum dot light emitting display panel. An emission layer of the organic light emitting display panel may include an organic light emitting material, and an emission layer of the inorganic light emitting display panel may include an inorganic light emitting material. An emission layer of the quantum dot light emitting display panel may include a quantum dot, a quantum rod, or the like. Below, the description will be given as the display panel DP is an organic light emitting display panel.

Referring to FIG. 2, the display panel DP includes a base layer BL, a circuit layer DP_CL, an element layer DP_ED, and an encapsulation layer TFE. The display panel DP according to some embodiments of the present disclosure may be a flexible display panel. However, embodiments according to the present disclosure are not limited thereto. For example, the display panel DP may be a foldable display panel, which is folded about to a folding axis, or a rigid display panel.

The base layer BL may include a synthetic resin layer. The synthetic resin layer may be a polyimide-based resin layer, and the material thereof is not particularly limited. Besides, the base layer BL may include a glass substrate, a metal substrate, an organic/inorganic composite substrate, or the like.

The circuit layer DP_CL is located on the base layer BL. The circuit layer DP_CL includes at least one insulating layer and a circuit element. Below, the insulating layer included in the circuit layer DP_CL is referred to as an "intermediate insulating layer". The intermediate insulating layer includes at least one intermediate inorganic film and at least one intermediate organic film. The circuit element may include a pixel driving circuit included in each of a plurality of pixels for displaying an image and a sensor driving circuit included in each of a plurality of sensors for recognizing external information. The external information may be biometric information. As an example of the present disclosure, the sensors may include a fingerprint recognition sensor, a proximity sensor, an iris recognition sensor, and the like. Also, the sensors may include an optical sensor that recognizes biometric information in an optical manner. The circuit layer DP_CL may further include signal lines connected with the pixel driving circuit and the sensor driving circuit.

The element layer DP_ED may include a light emitting element included in each of the pixels and a light sensing element included in each of the sensors. As an example of the present disclosure, the light sensing element may be a photodiode. The light sensing element may be a sensor that senses a light reflected by a fingerprint of the user or reacts to a light. The circuit layer DP_CL and the element layer DP_ED will be described in detail with reference to FIGS. 22, 23A, and 23B.

The encapsulation layer TFE encapsulates the element layer DP_ED. The encapsulation layer TFE may include at least one organic film and at least one inorganic film. The inorganic film may include an inorganic material and may protect the element layer DP_ED from moisture/oxygen. The inorganic film may include a silicon nitride layer, a silicon oxynitride layer, a silicon oxide layer, a titanium oxide layer, an aluminum oxide layer, or the like, but not limited particularly thereto. The organic film may include an organic material and may protect the element layer DP_ED from foreign objects such as dust particles.

The input sensing layer ISL may be formed on the display panel DP. The input sensing layer ISL may be directly located on the encapsulation layer TFE. According to some embodiments of the present disclosure, the input sensing layer ISL may be formed on the display panel DP through a subsequent process. That is, when the input sensing layer ISL is directly located on the display panel DP, an adhesive film is not located between the input sensing layer ISL and the encapsulation layer TFE. However, alternatively, an inner adhesive film may be located between the input sensing layer ISL and the display panel DP. In this case, the input sensing layer ISL may not be manufactured by a process continuous to that of the display panel DP. That is, the input sensing layer ISL may be manufactured through a process separate from that of the display panel DP and may then be fixed on an upper surface of the display panel DP by the inner adhesive film.

The input sensing layer ISL may sense an external input (e.g., a user's touch), may change the sensed input into an input signal, and may provide the input signal to the display panel DP. The input sensing layer ISL may include a plurality of sensing electrodes for sensing an external input. The sensing electrodes may sense the external input in a capacitive manner. The display panel DP may receive the input signal from the input sensing layer ISL and may generate an image corresponding to the input signal.

The display module DM may further include a color filter layer CFL. As an example of the present disclosure, the color filter layer CFL may be located on the input sensing layer ISL. However, embodiments according to the present disclosure are not limited thereto. The color filter layer CFL may be located between the display panel DP and the input sensing layer ISL. The color filter layer CFL may include a plurality of color filters and a black matrix.

A structure of the input sensing layer ISL and the color filter layer CFL will be described in more detail later.

The display device DD according to some embodiments of the present disclosure may further include an adhesive layer AL. The window WM may be attached to the input sensing layer ISL by the adhesive layer AL. The adhesive layer AL may include an optical clear adhesive, an optically clear adhesive resin, or a pressure sensitive adhesive (PSA).

The housing EDC is coupled to the window WM. The housing EDC is coupled to the window WM to provide an inner space. The display module DM may be accommodated in the inner space. The housing EDC may include a material having relatively high rigidity. For example, the housing EDC may include glass, plastic, or metal or may include a plurality of frames and/or plates that are composed of a combination thereof. The housing EDC may stably protect components of the display device DD accommodated in the inner space from an external impact. According to some embodiments, a battery module for supplying power necessary for an overall operation of the display device DD may be located between the display module DM and the housing EDC.

Figure 3:
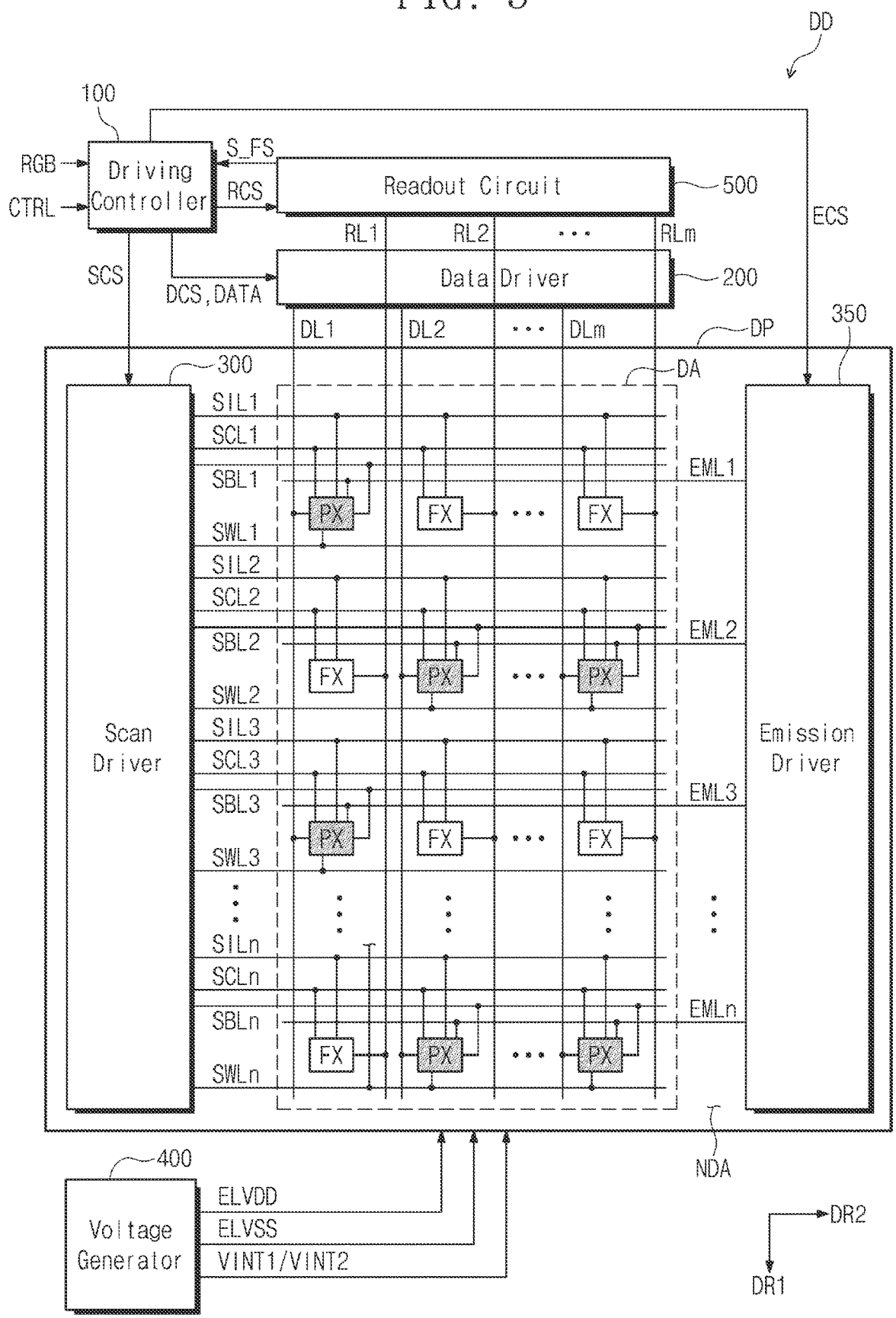
FIG. 3 is a block diagram of a display device according to some embodiments of the present disclosure.
Figure 4A:
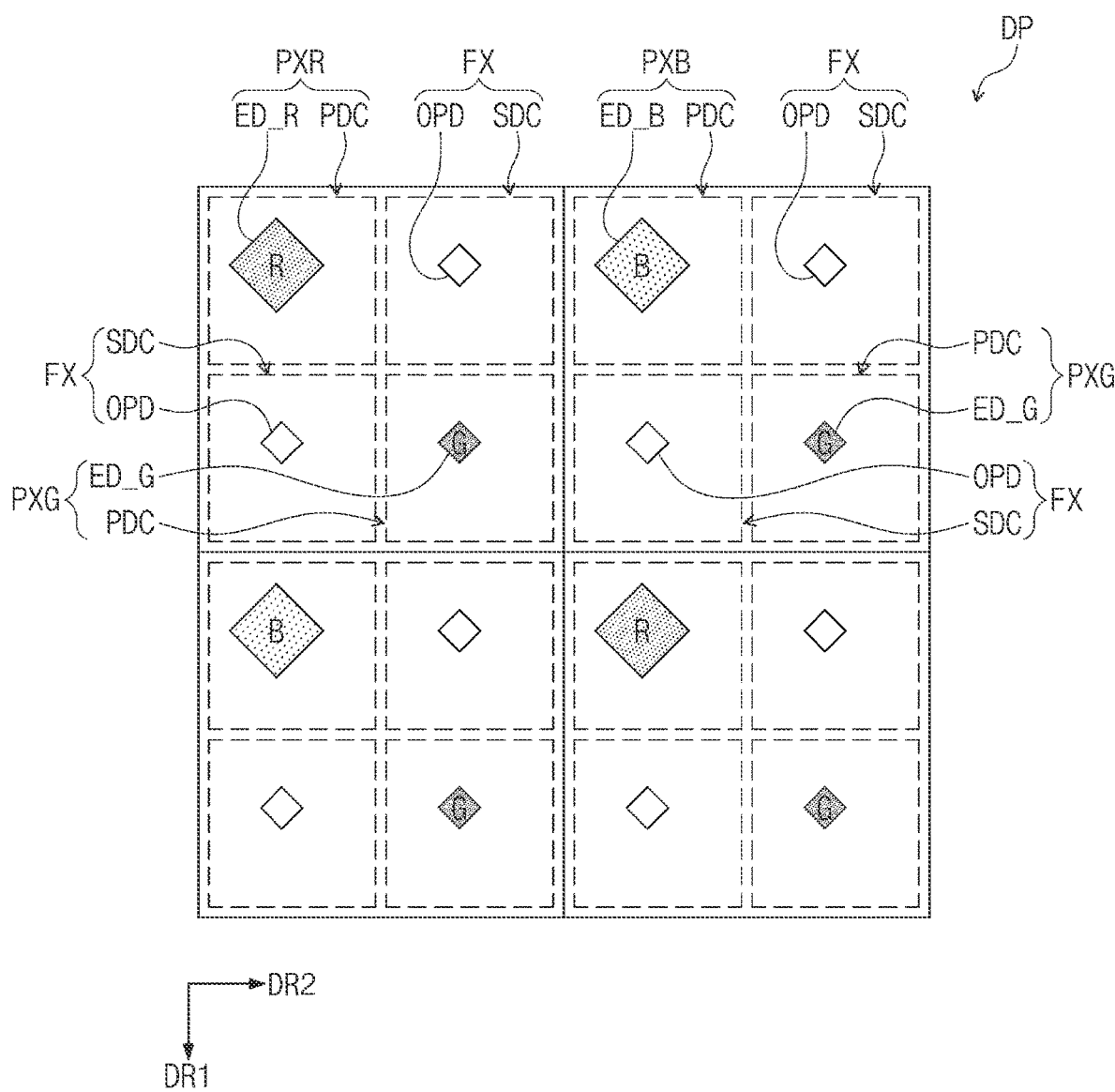
FIGS. 4A to 4C are enlarged plan views of a partial area of a display panel according to some embodiments of the present disclosure.
Figure 4B:
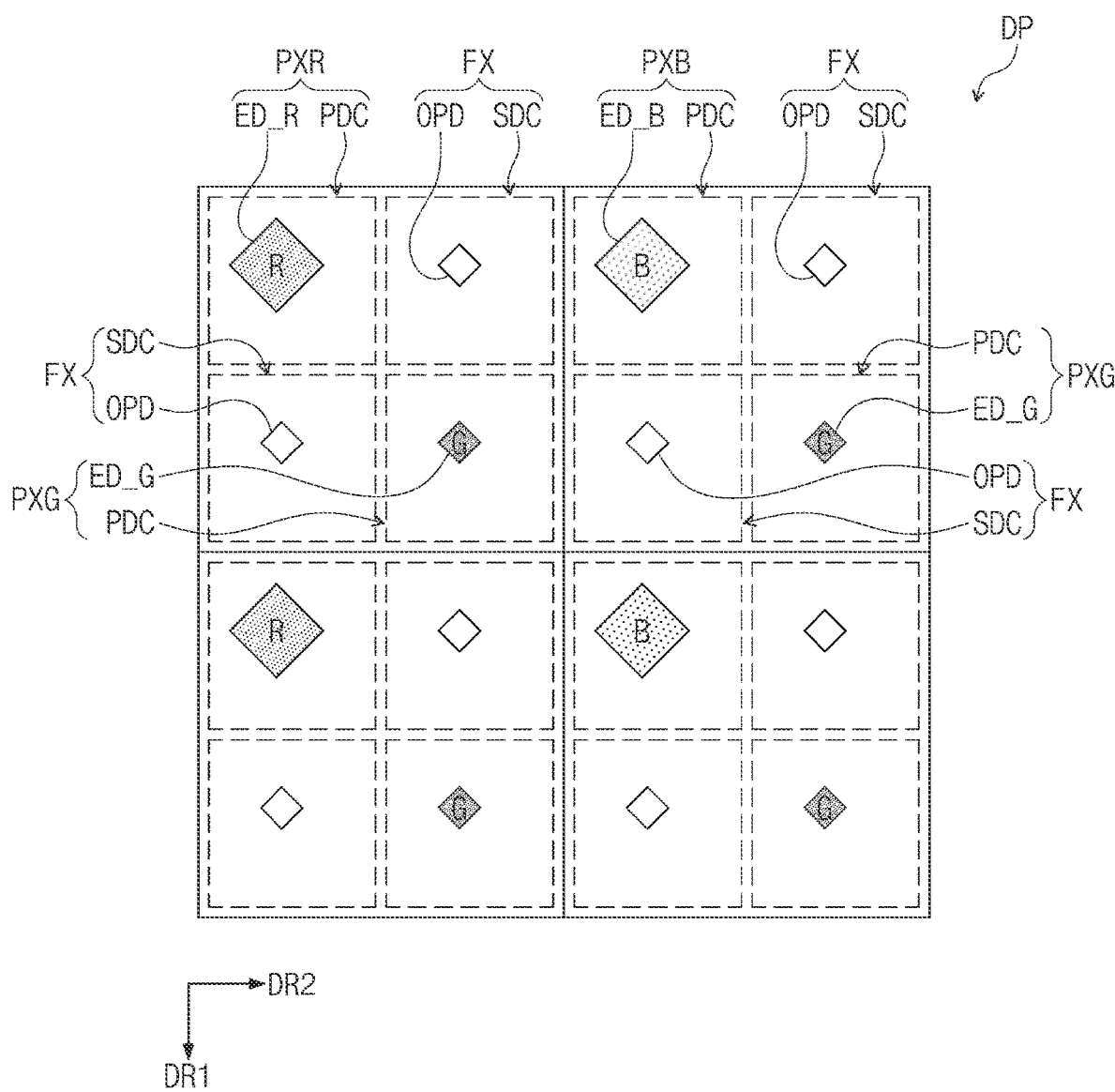
Figure 4C:
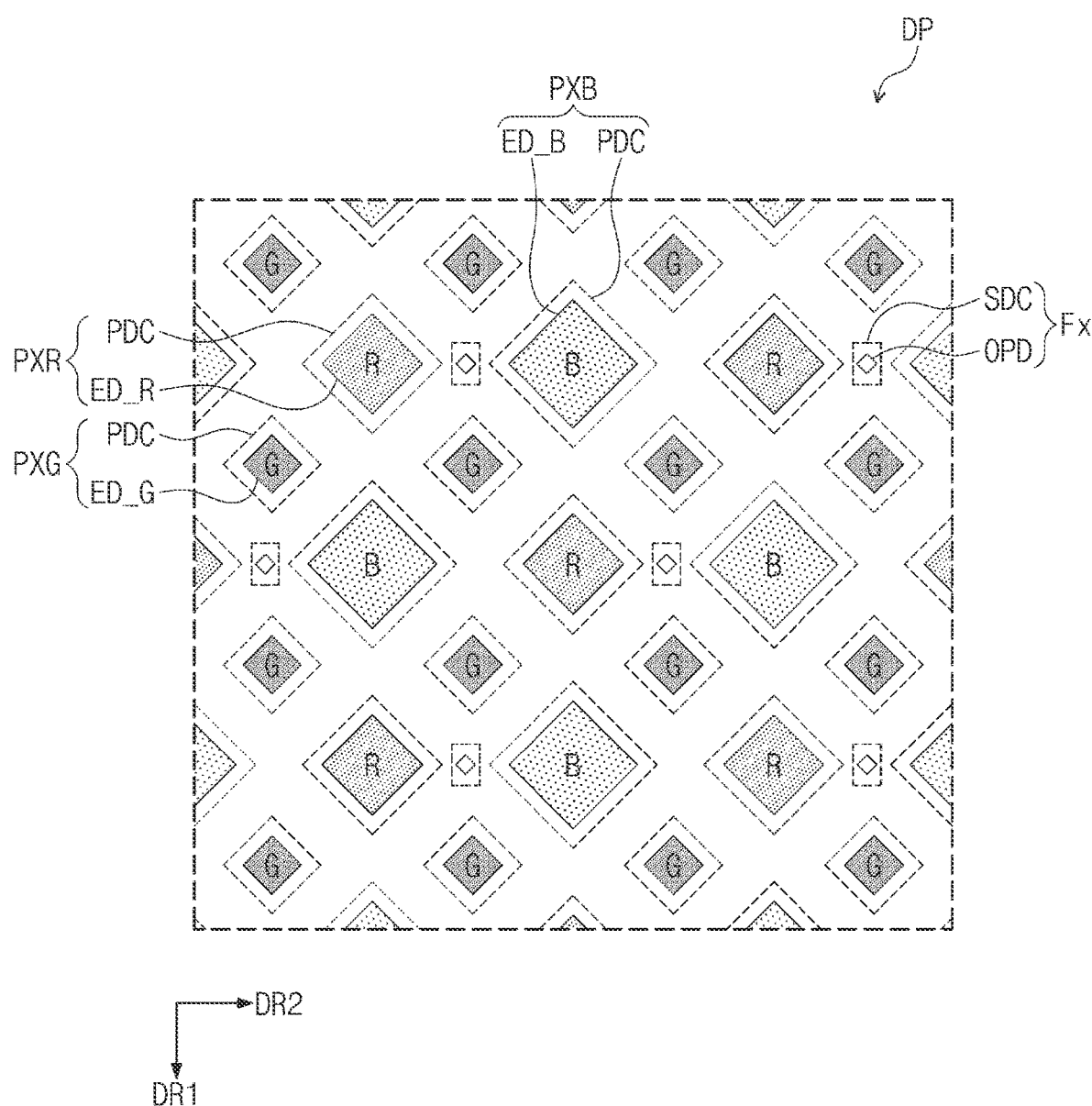

FIG. 3 is a block diagram of a display device according to some embodiments of the present disclosure, and FIGS. 4A to 4C are enlarged plan views of a partial area of a display panel according to embodiments of the present disclosure.

Referring to FIG. 3, the display device DD includes the display panel DP, a panel driver, and a driving controller 100. According to some embodiments of the present disclosure, the panel driver may include a data driver 200, a scan driver 300, an emission driver 350, a voltage generator 400, and a readout circuit 500.

The driving controller 100 receives an image signal RGB and a control signal CTRL. The driving controller 100 generates an image data signal DATA by converting a data format of the image signal RGB in compliance with the specification for an interface with the data driver 200. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals and outputs the data signals to a plurality of data lines DL1 to DLm to be described in more detail later. The data signals refer to analog voltages corresponding to a gray scale value of the image data signal DATA.

The scan driver 300 receives the first control signal SCS from the driving controller 100. The scan driver 300 may output scan signals to scan lines in response to the first control signal SCS.

The voltage generator 400 generates voltages necessary for an operation of the display panel DP. According to some embodiments, the voltage generator 400 generates a first driving voltage ELVDD, a second driving voltage ELVSS, a first initialization voltage VINT1, and a second initialization voltage VINT2.

The display panel DP may include a display area DA corresponding to the transparent area TA (illustrated in FIG. 1) and a non-display area NDA corresponding to the bezel area BZA (illustrated in FIG. 1).

The display panel DP may include a plurality of pixels PX located in the display area DA and a plurality of sensors FX located in the display area DA. According to some embodiments of the present disclosure, each of the plurality of sensors FX may be located between two adjacent pixels PX. The plurality of pixels PX and the plurality of sensors FX may be alternately arranged in the first and second directions DR1 and DR2. However, embodiments according to the present disclosure are not limited thereto. Two or more pixels may be located between two sensors adjacent to each other on the first direction DR1 from among the plurality of sensors FX, or two or more pixels may be located between two sensors adjacent to each other on the second direction DR2 from among the plurality of sensors FX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, data lines DL1 to DLm, and readout lines RL1 to RLm. The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn are arranged to be spaced from each other in the first direction DR1. The data lines DL1 to DLm and the readout lines RL1 to RLm extend in the first direction DR1 and are arranged to be spaced from each other in the second direction DR2.

The plurality of pixels PX are electrically connected with the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm. Each of the plurality of pixels PX may be electrically connected with four scan lines. For example, as illustrated in FIG. 3, the pixels PX of the first row may be connected with the first initialization scan line SIL1, the first compensation scan line SCL1, the first write scan line SWL1, and the first black scan line SBL1. Also, the pixels PX of the second row may be connected with the second initialization scan line SIL2, the second compensation scan line SCL2, the second write scan line SWL2, and the second black scan line SBL2.

The plurality of sensors FX may be connected with the initialization scan lines SIL1 to SILn, the compensation scan lines SCL1 to SCLn, and the readout lines RL1 to RLm. Each of the plurality of sensors FX may be electrically connected with two scan lines. For example, as illustrated in FIG. 3, the sensors FX of the first row may be connected with the first initialization scan line SIL1 and the first compensation scan line SCL1. Also, the sensors FX of the second row may be connected with the second initialization scan line SIL2 and the second compensation scan line SCL2.

The scan driver 300 may be located in the non-display area NDA of the display panel DP. The scan driver 300 receives the first control signal SCS from the driving controller 100. In response to the first control signal SCS, the scan driver 300 outputs initialization scan signals to the initialization scan lines SIL1 to SILn and may output compensation scan signals to the compensation scan lines SCL1 to SCLn. Also, in response to the first control signal SCS, the scan driver 300 may output write scan signals to the write scan lines SWL1 to SWLn and may output black scan signals to the black scan lines SBL1 to SBLn. Alternatively, the scan driver 300 may include a first scan driver and a second scan driver. The first scan driver may output the initialization scan signals and the compensation scan signals, and the second scan driver may output the write scan signals and the black scan signals.

The emission driver 350 may be located in the non-display area NDA of the display panel DP. The emission driver 350 receives the second control signal ECS from the driving controller 100. The emission driver 350 may output emission control signals to the emission control lines EML1 to EMLn in response to the second control signal ECS. Alternatively, the scan driver 300 may be connected with the emission control lines EML1 to EMLn. In this case, the scan driver 300 may output the emission control signals to the emission control lines EML1 to EMLn.

The readout circuit 500 receives the fourth control signal RCS from the driving controller 100. The readout circuit 500 may receive sensing signals from the readout lines RL1 to RLm in response to the fourth control signal RCS. The readout circuit 500 may process the sensing signals received from the readout lines RL1 to RLm and may provide processed sensing signals S_FS to the driving controller 100. The driving controller 100 may recognize biometric information based on the sensing signals S_FS.

As illustrated in FIGS. 4A to 4C, the display panel DP include pixels PXR, PXB, and PXG, and the sensors FX. Each pixel PXR, PXB, or PXG includes a light emitting element ED_R, ED_G, or ED_B and a pixel driving circuit PDC. Each of the sensors FX includes a light sensing element OPD and a sensor driving circuit SDC.

The pixels PXR, PXG, and PXB and the sensors FX are alternately located in the first direction DR1 and are alternately located in the second direction DR2. The pixels PXR, PXG, and PXB include a first pixels PXR including a light emitting element (hereinafter referred to as a "first light emitting element ED_R") outputting a light of a first color (e.g., red (R)), a second pixels PXG including a light emitting element (hereinafter referred to as a "second light emitting element ED_G") outputting a light of a second color (e.g., green (G)), and a third pixels PXB including a light emitting element (hereinafter referred to as a "third light emitting element ED_B") outputting a light of a third color (e.g., blue (B)).

As illustrated in FIG. 4A, the first pixels PXR and the third pixels PXB may be alternately repeated on the first and second directions DR1 and DR2. The second pixels PXG may be arranged along the first direction DR1 and the second direction DR2.

One sensor FX may be located between the first pixel PXR and the third pixel PXB adjacent to each other on each of the first and second directions DR1 and DR2. Also, one sensor FX may be located between two second pixels PXG on each of the first and second directions DR1 and DR2. However, the arrangement structure of the pixels PXR, PXB, and PXG and the sensors FX is not limited thereto.

As illustrated in FIG. 4B, on the first direction DR1, the sensors FX may be located between two first pixels PXR, between two second pixels PXG, and between two third pixels PXB. Furthermore, on the second direction DR2, the sensors FX may be located between the first pixel PXR and the third pixel PXB adjacent to each other and between two second pixels PXG adjacent to each other. In addition, the arrangement structure of the pixels PXR, PXB, and PXG and the sensors FX may be variously modified.

For example, the first pixels PXR and the third pixels PXB may be located at different columns or different rows. When the first pixels PXR are located at an odd-numbered column, the third pixels PXB may be located at an even-numbered column. When the first pixels PXR are arranged at an odd-numbered row, the third pixels PXB may be located at an even-numbered row. In this case, at least one second pixel PXG and at least one sensor FX may be located between two first pixels PXR adjacent to each other on the first and second directions DR1 and DR2. Also, at least one second pixel PXG and at least one sensor FX may be located between two third pixels PXB adjacent to each other on the first and second directions DR1 and DR2.

As illustrated in FIG. 4C, on the first and second directions DR1 and DR2, the first pixels PXR and the third pixels PXB may be alternately repeated. The second pixels PXG may be arranged along the first and second directions DR1 and DR2. One sensor FX may be located between two second pixels PXG on the first direction DR1, and one sensor FX may be located between the first pixel PXR and the third pixel PXB adjacent to each other on the second direction DR2. In detail, one sensor FX may be located per unit pixel that includes one first pixel PXR, two second pixels PXG, and one third pixel PXB. In addition, the arrangement structure of the pixels PXR, PXB, and PXG and the sensors FX may be variously modified.

As an example of the present disclosure, the first light emitting element ED_R may be greater in size than the second light emitting element ED_G. Also, a size of the third light emitting element ED_B may be greater than or equal to that of the first light emitting element ED_R. The size of each of the first to third light emitting elements ED_R, ED_G, and ED_B is not limited thereto, and may be variously modified. For example, according to some embodiments of the present disclosure, the first to third light emitting elements ED_R, ED_G, and ED_B may have the same size.

Also, an example in which the first to third light emitting elements ED_R, ED_G, and ED_B are in the shape of a quadrangle is illustrated, but embodiments according to the present disclosure are not limited thereto. For example, the first to third light emitting elements ED_R, ED_G, and ED_B may be implemented in the shape of a polygon, a circle, an oval, and the like. As another example, the first to third light emitting elements ED_R, ED_G, and ED_B may be implemented in different shapes. That is, the second light emitting element ED_G may be in the shape of a circle, and the first and third light emitting elements ED_R and ED_B may be in the shape of a quadrangle.

The light sensing element OPD may be smaller in size than the first and third light emitting elements ED_R and ED_B. As an example of the present disclosure, a size of the light sensing element OPD may be smaller than or equal to that of the second light emitting element ED_G. However, the size of the light sensing element OPD is not limited thereto, and may be variously modified. An example in which the light sensing element OPD is in the shape of a quadrangle is illustrated, but embodiments according to the present disclosure are not limited thereto. For example, the light sensing element OPD may be implemented in the shape of a polygon, a circle, an oval, and the like.

Each of the first to third light emitting elements ED_R, ED_G, and ED_B is electrically connected with the corresponding pixel driving circuit PDC. The pixel driving circuit PDC may include a plurality of transistors and a capacitor. The pixel driving circuits PDC respectively connected with the first to third light emitting elements ED_R, ED_G, and ED_B may have the same circuit configuration.

The light sensing element OPD is electrically connected with the corresponding sensor driving circuit SDC. The sensor driving circuit SDC may include a plurality of transistors. As an example of the present disclosure, the sensor driving circuit SDC and the pixel driving circuit PDC may be formed simultaneously through the same process. Also, the scan driver 300 may include transistors that are formed through the same process as the pixel driving circuit PDC and the sensor driving circuit SDC.

The pixel driving circuit PDC receives the first driving voltage ELVDD, the second driving voltage ELVSS, and the first and second initialization voltages VINT1 and VINT2 from the voltage generator 400. The sensor driving circuit SDC may receive at least one of the first driving voltage ELVDD, the second driving voltage ELVSS, or the first and second initialization voltages VINT1 and VINT2 from the voltage generator 400.

Figure 5:
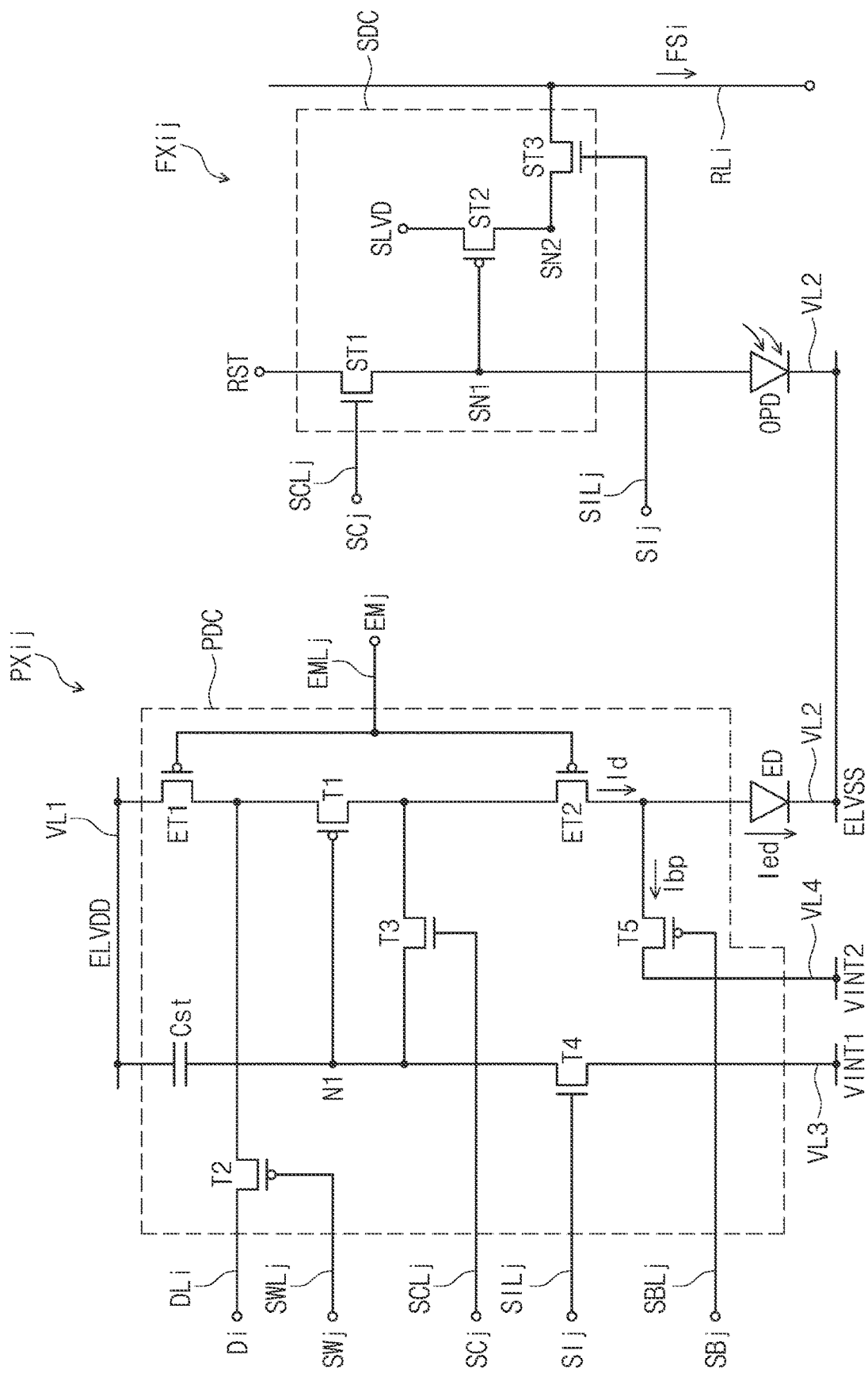
FIG. 5 is a circuit diagram of a pixel and a sensor according to some embodiments of the present disclosure.

FIG. 5 is a circuit diagram of a pixel and a sensor according to some embodiments of the present disclosure.

An equivalent circuit diagram of one pixel PXij of the plurality of pixels PX illustrated in FIG. 3 is illustrated in FIG. 5 as an example. Below, a circuit structure of the pixel PXij will be described. The plurality of pixels PX have the same structure, and thus, additional description associated with the remaining pixels other than the pixel PXij will be omitted to avoid redundancy. Also, an equivalent circuit diagram of one sensor FXij of the plurality of sensors FX illustrated in FIG. 3 is illustrated in FIG. 5 as an example. Below, a circuit structure of the sensor FXij will be described. The plurality of sensors FX have the same structure, and thus, additional description associated with the remaining sensors other than the sensor FXij will be omitted to avoid redundancy.

Referring to FIG. 5, the pixel PXij is connected with the i-th data line DLi of the data lines DL1 to DLm, the j-th initialization scan line SILj of the initialization scan lines SIL1 to SILn, the j-th compensation scan line SCLj of the compensation scan lines SCL1 to SCLn, the j-th write scan line SWLj of the write scan lines SWL1 to SWLn, the j-th black scan line SBLj of the black scan lines SBL1 to SBLn, and the j-th emission control line EMLj of the emission control lines EML1 to EMLn.

The pixel PXij includes the light emitting element ED and the pixel driving circuit PDC. The light emitting element ED may be a light emitting diode. According to some embodiments of the present disclosure, the light emitting element ED may be an organic light emitting diode including an organic emission layer.

The pixel driving circuit PDC includes first to fifth transistors T1, T2, T3, T4, and T5, first and second emission control transistors ET1 and ET2, and one capacitor Cst. At least one of the first to fifth transistors T1, T2, T3, T4, or T5 and the first and second emission control transistors ET1 and ET2 may be a transistor having a low-temperature polycrystalline silicon (LTPS) semiconductor layer. Some of the first to fifth transistors T1, T2, T3, T4, and T5 and the first and second emission control transistors ET1 and ET2 may be P-type transistors, and the others thereof may be N-type transistors. For example, the first, second, and fifth transistors T1, T2, and T5 and the first and second emission control transistors ET1 and ET2 are P-type transistors, and the third and fourth transistors T3 and T4 may be N-type transistors. At least one of the first to fifth transistors T1, T2, T3, T4, or T5 and the first and second emission control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second emission control transistors ET1 and ET2 may be LTPS transistors.

A configuration of the pixel driving circuit PDC according to the present disclosure is not limited to the embodiments illustrated with respect to FIG. 5. The pixel driving circuit PDC illustrated in FIG. 5 is only an example, and the configuration of the pixel driving circuit PDC may be modified and implemented. For example, each of the first to fifth transistors T1, T2, T3, T4, and T5 and the first and second emission control transistors ET1 and ET2 may be a P-type transistor or an N-type transistor.

The j-th initialization scan line SILj, the j-th compensation scan line SCLj, the j-th write scan line SWLj, the j-th black scan line SBLj, and the j-th emission control line EMLj may transfer a j-th initialization scan signal SIj, a j-th compensation scan signal SCj, a j-th write scan signal SW, a j-th black scan signal SBj, and a j-th emission control signal EMj to the pixel PXij, respectively. The i-th data line DLi transfers an i-th data signal Di to the pixel PXij. The i-th data signal Di may have a voltage level corresponding to the image signal RGB input to the display device DD (refer to FIG. 3).

First and second driving voltage lines VL1 and VL2 may transfer the first and second driving voltages ELVDD and ELVSS to the pixel PXij, respectively. Also, first and second initialization voltage lines VL3 and VL4 may transfer the first and second initialization voltages VINT1 and VINT2 to the pixel PXij, respectively.

The first transistor T1 is connected between the first driving voltage line VL1 receiving the first driving voltage ELVDD and the light emitting element ED. The first transistor T1 includes a first electrode connected with the first driving voltage line VL1 through the first emission control transistor ET1, a second electrode electrically connected with an anode of the light emitting element ED through the second emission control transistor ET2, and a third electrode connected with a first end of the capacitor Cst. The first transistor T1 may receive the data signal Di transferred through the i-th data line DLi depending on a switching operation of the second transistor T2 and then may supply a driving current Id to the light emitting element ED.

The second transistor T2 is connected between the i-th data line DLi and the first electrode of the first transistor T1. The second transistor T2 includes a first electrode connected with the i-th data line DLi, a second electrode connected with the first electrode of the first transistor T1, and a third electrode connected with the j-th write scan line SWLj. The second transistor T2 may be turned on depending on the write scan signal SW transferred through the j-th write scan line SWLj and then may transfer the i-th data signal Di transferred from the i-th data line DLi to the first electrode of the first transistor T1.

The third transistor T3 is connected between the second electrode of the first transistor T1 and a first node N1. The third transistor T3 includes a first electrode connected with the third electrode of the first transistor T1, a second electrode connected with the second electrode of the first transistor T1, and a third electrode connected with the j-th compensation scan line SCLj. The third transistor T3 may be turned on depending on the j-th compensation scan signal SCj transferred through the j-th compensation scan line SCLj and may connect the third electrode and the second electrode of the first transistor T1. In this case, the first transistor T1 may be diode-connected.

The fourth transistor T4 is connected between the first initialization voltage line VL3 to which the first initialization voltage VINT1 is applied and the first node N1. The fourth transistor T4 includes a first electrode connected with the third electrode of the first transistor T1, a second electrode connected with the first initialization voltage line VL3 through which the first initialization voltage VINT1 is transferred, and a third electrode connected with the j-th initialization scan line SILj. The fourth transistor T4 is turned on depending on the j-th initialization scan signal SIj transferred through the j-th initialization scan line SILj. The fourth transistor T4 thus turned on may transfer the first initialization voltage VINT1 to the third electrode of the first transistor T1 such that a potential of the third electrode of the first transistor T1 (i.e., a potential of the first node N1) is initialized.

The first emission control transistor ET1 includes a first electrode connected with the first driving voltage line VL1, a second electrode connected with the first electrode of the first transistor T1, and a third electrode connected with the j-th emission control line EMLj.

The second emission control transistor ET2 includes a first electrode connected with the second electrode of the first transistor T1, a second electrode connected with the anode of the light emitting element ED, and a third electrode connected with the j-th emission control line EMLj.

The first and second emission control transistors ET1 and ET2 are simultaneously turned on depending on the j-th emission control signal EMj transferred through the j-th emission control line EMLj. The first driving voltage ELVDD applied through the first emission control transistor ET1 thus turned on may be compensated for through the diode-connected first transistor T1 and then may be transferred to the light emitting element ED.

The fifth transistor T5 includes a first electrode connected with the second initialization voltage line VL4 through which the second initialization voltage VINT2 is transferred, a second electrode connected with the second electrode of the second emission control transistor ET2, and a third electrode connected with the j-th black scan line SBLj. A voltage level of the second initialization voltage VINT2 may be lower than or equal to that of the first initialization voltage VINT1. As an example of the present disclosure, each of the first and second initialization voltages VINT1 and VINT2 may be a voltage of −3.5 V.

As described above, the first end of the capacitor Cst is connected with the third electrode of the first transistor T1, and a second end of the capacitor Cst is connected with the first driving voltage line VL1. A cathode of the light emitting element ED may be connected with the second driving voltage line VL2 that transfers the second driving voltage ELVSS. A voltage level of the second driving voltage ELVSS may be lower than a voltage level of the first driving voltage ELVDD. As an example of the present disclosure, the voltage level of the second driving voltage ELVSS may be lower than the voltage level of the first and second initialization voltages VINT1 and VINT2.

During an active period AP1 (refer to FIG. 7) of the j-th initialization scan signal SIj, when the j-th initialization scan signal SIj of a high level is provided through the j-th initialization scan line SILj, the fourth transistor T4 is turned on in response to the j-th initialization scan signal SIj of the high level. The first initialization voltage VINT1 is transferred to the third electrode of the first transistor T1 through the fourth transistor T4 thus turned on, and the first node N1 is initialized to the first initialization voltage VINT1. Accordingly, the active period AP1 of the j-th initialization scan signal SIj may be an initialization period of the pixel PXij.

Next, the j-th compensation scan signal SCj is activated, and the third transistor T3 is turned on when the j-th compensation scan signal SCj of the high level is supplied through the j-th compensation scan line SCLj during an active period AP2 (refer to FIG. 7) of the j-th compensation scan signal SCj. The first transistor T1 is diode-connected by the third transistor T3 turned on and is forward-biased.

Also, the j-th write scan signal SW is activated within the active period AP2 of the j-th compensation scan signal SCj. The j-th write scan signal SW has a low level during an active period AP4 (refer to FIG. 7). During the active period AP4 of the j-th write scan signal SW, the second transistor T2 is turned on by the j-th write scan signal SW of the low level. In this case, a compensation voltage "Di-Vth" is applied to the third electrode of the first transistor T1. Here, the compensation voltage "Di-Vth" may correspond to a result of subtracting a threshold voltage Vth of the first transistor T1 from a voltage of the i-th data signal Di supplied from the i-th data line DLi. That is, a potential of the third electrode of the first transistor T1 may be the compensation voltage "Di-Vth".

The first driving voltage ELVDD and the compensation voltage "Di-Vth" may be respectively applied to opposite ends of the capacitor Cst, and charges corresponding to a voltage difference of the opposite ends of the capacitor Cst may be stored in the capacitor Cst. Herein, a high level period of the j-th compensation scan signal SCj may be referred to as a "compensation period" of the pixel PXij.

Meanwhile, the j-th black scan signal SBj is activated within the active period AP2 of the j-th compensation scan signal SCj. The j-th black scan signal SBj has the low level during an active period AP3 (refer to FIG. 7). During the active period AP3 of the j-th black scan signal SBj, the fifth transistor T5 is turned on by the j-th black scan signal SBj of the low level supplied through the j-th black scan line SBLj. A portion of the driving current Id may be drained through the fifth transistor T5 as a bypass current Ibp.

Assuming the case where the pixel PXij displays a black image, even though a minimum driving current of the first transistor T1 flows as the driving current Id, the light emitting element ED emits a light. That is, the pixel PXij fails to normally display a black image. Accordingly, the fifth transistor T5 of the pixel PXij according to some embodiments of the present disclosure may drain, as the bypass current Ibp, a portion of the minimum driving current of the first transistor T1 to a current path that is different from a current path toward the light emitting element ED. Herein, the minimum driving current of the first transistor T1 means a current flowing to the first transistor T1 under the condition that a gate-source voltage Vgs of the first transistor T1 is smaller than the threshold voltage Vth, that is, the first transistor T1 is turned off. As the minimum driving current (e.g., a current of 10 pA or less) flowing to the first transistor T1 is transferred to the light emitting element ED under the condition that the first transistor T1 is turned off, an image of a black gray scale is displayed. When the pixel PXij displays a black image, the bypass current Ibp has a relatively large influence on the minimum driving current; in contrast, when the pixel PXij displays an image such as a normal image or a white image, there is little influence of the bypass current Ibp on the driving current Id. Accordingly, assuming the case where the pixel PXij displays a black image, a current (i.e., the light emitting current Ied) that corresponds to a result of subtracting the bypass current Ibp flowing through the fifth transistor T5 from the driving current Id is provided to the light emitting element ED, and thus a black image may be clearly displayed. Accordingly, the pixel PXij may implement an accurate black gray scale image by using the fifth transistor T5, and thus, a contrast ratio may be improved.

Next, the j-th light emitting control signal EMj that is supplied from the j-th emission control line EMLj transitions from the high level to the low level. The first and second emission control transistors ET1 and ET2 are turned on by the j-th emission control signal EMj of the low level. In this case, because a difference is present between the voltage of the third electrode of the first transistor T1 and the first driving voltage ELVDD, the driving current Id is generated. The driving current Id thus generated is supplied to the light emitting element ED through the second emission control transistor ET2, and thus, a current Ied flows through the light emitting element ED.

Referring to FIG. 5, the sensor FXij is connected with the i-th readout line RLi of the readout lines RL1 to RLm, the j-th initialization scan line SILj, and the j-th compensation scan line SCLj. The sensor FXij may be further connected with the second driving voltage line VL2.

The sensor FXij includes the light sensing element OPD and the sensor driving circuit SDC. The light sensing element OPD may be a photodiode. As an example of the present disclosure, the light sensing element OPD may be an organic photodiode including an organic material as a photoelectric conversion layer. An anode of the light sensing element OPD may be connected with a first sensing node SN1, and a cathode thereof may be connected with the second driving voltage line VL2 transferring the second driving voltage ELVSS.

The sensor driving circuit SDC includes three transistors ST1 to ST3. The three transistors ST1 to ST3 may be a reset transistor ST1, an amplification transistor ST2, and an output transistor ST3, respectively. At least one of the reset transistor ST1, the amplification transistor ST2, or the output transistor ST3 may be an oxide semiconductor transistor. As an example of the present disclosure, the reset transistor ST1 and the output transistor ST3 may be oxide semiconductor transistors, and the amplification transistor ST2 may be an LTPS transistor. However, embodiments according to the present disclosure are not limited thereto. For example, at least the reset transistor ST1 may be an oxide semiconductor transistor, and the amplification transistor ST2 and the output transistor ST3 may be oxide semiconductor transistors or LTPS transistors.

Also, some of the reset transistor ST1, the amplification transistor ST2, and the output transistor ST3 may be P-type transistors, and the other(s) thereof may be an N-type transistor. As an example of the present disclosure, the amplification transistor ST2 may be a PMOS transistor, and the reset transistor ST1 and the output transistor ST3 may be NMOS transistors. However, embodiments according to the present disclosure are not limited thereto. For example, all the transistors ST1, ST2, and ST3 may be N-type transistors or P-type transistors.

Some (e.g., the reset transistor ST1 and the output transistor ST3) of the reset transistor ST1, the amplification transistor ST2, and the output transistor ST3 may be transistors of the same type as the third and fourth transistors T3 and T4 of the pixel PXij. A type of the amplification transistor ST2 may be the same as that of the first, second, and fifth transistors T1, T2, and T5 and the first and second emission control transistors ET1 and ET2 of the pixel PXij.

A circuit configuration of the sensor driving circuit SDC according to the present disclosure is not limited to an example illustrated in FIG. 5. The sensor driving circuit SDC illustrated in FIG. 5 is only an example, and the configuration of the sensor driving circuit SDC may be modified and implemented.

The reset transistor ST1 includes a first electrode receiving a reset signal RST, a second electrode connected with a first sensing node SN1, and a third electrode receiving a reset control signal. The reset transistor ST1 may reset a potential of the first sensing node SN1 to the reset signal RST in response to the reset control signal. The reset control signal may be the j-th compensation scan signal SCj that is supplied through the j-th compensation scan line SCLj. That is, the reset transistor ST1 may receive the j-th compensation scan signal SCj supplied through the j-th compensation scan line SCLj as the reset control signal. As an example of the present disclosure, the reset signal RST may be a signal whose voltage level is lower than that of the second driving voltage ELVSS at least during an active period of the j-th compensation scan signal SCj.

The reset transistor ST1 may include a plurality of sub-reset transistors that are connected in series. For example, the reset transistor ST1 may include two sub-reset transistors (hereinafter referred to as "first and second sub-reset transistors"). In this case, a third electrode of the first sub-reset transistor and a third electrode of the second sub-reset transistor are connected with the j-th compensation scan line SCLj. Also, a second electrode of the first sub-reset transistor and a first electrode of the second sub-reset transistor may be electrically connected. Also, the reset signal RST may be applied to a first electrode of the first sub-reset transistor, and a second electrode of the second sub-reset transistor may be electrically connected with the first sensing node SN1. However, the number of sub-reset transistors is not limited thereto and may be variously changed or modified.

The amplification transistor ST2 includes a first electrode receiving a sensing driving voltage SLVD, a second electrode connected with a second sensing node SN2, and a third electrode connected with the first sensing node SN1. The amplification transistor ST2 may be turned on depending on a potential of the first sensing node SN1 and may apply the sensing driving voltage SLVD to the second sensing node SN2. As an example of the present disclosure, the sensing driving voltage SLVD may correspond to one of the first driving voltage ELVDD and the first and second initialization voltages VINT1 and VINT2. When the sensing driving voltage SLVD corresponds to the first driving voltage ELVDD, the first electrode of the amplification transistor ST2 may be electrically connected with the first driving voltage line VL1. When the sensing driving voltage SLVD corresponds to the first initialization voltage VINT1, the first electrode of the amplification transistor ST2 may be electrically connected with the first initialization voltage line VL3; when the sensing driving voltage SLVD corresponds to the second initialization voltage VINT2, the first electrode of the amplification transistor ST2 may be electrically connected with the second initialization voltage line VL4.

The output transistor ST3 includes a first electrode connected with the second sensing node SN2, a second electrode connected with the i-th readout line RLi, and a third electrode receiving an output control signal. The output transistor ST3 may transfer a sensing signal FSi to the i-th readout line RLi in response to the output control signal. The output control signal may be the j-th initialization scan signal SIj that is supplied through the j-th initialization scan line SILj. That is, the output transistor ST3 may receive the j-th initialization scan signal SIj supplied through the j-th initialization scan line SILj as the output control signal.

Figure 6:
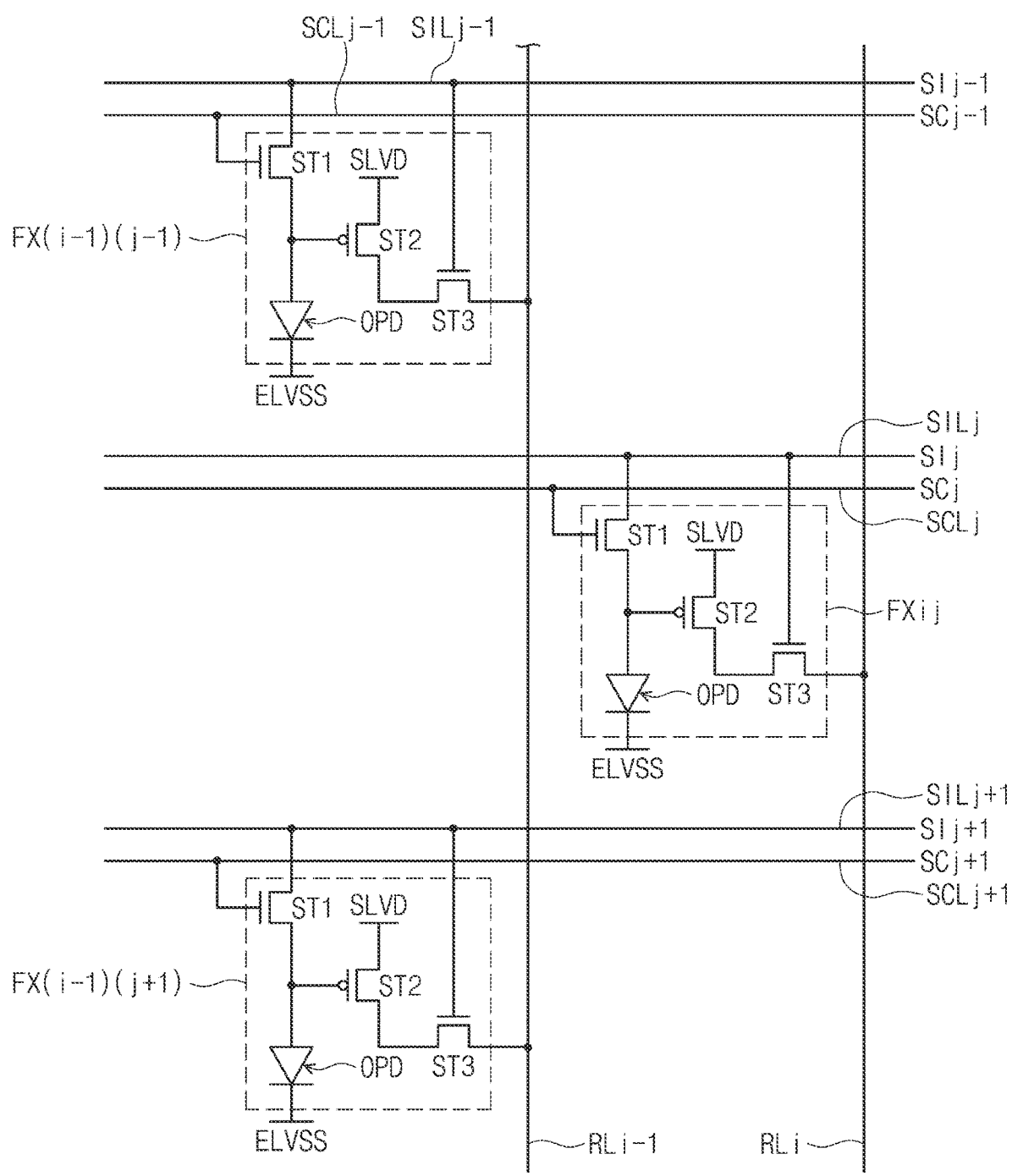
FIG. 6 is a circuit diagram of a connection relationship between a sensor and scan lines according to some embodiments of the present disclosure.
Figure 7:
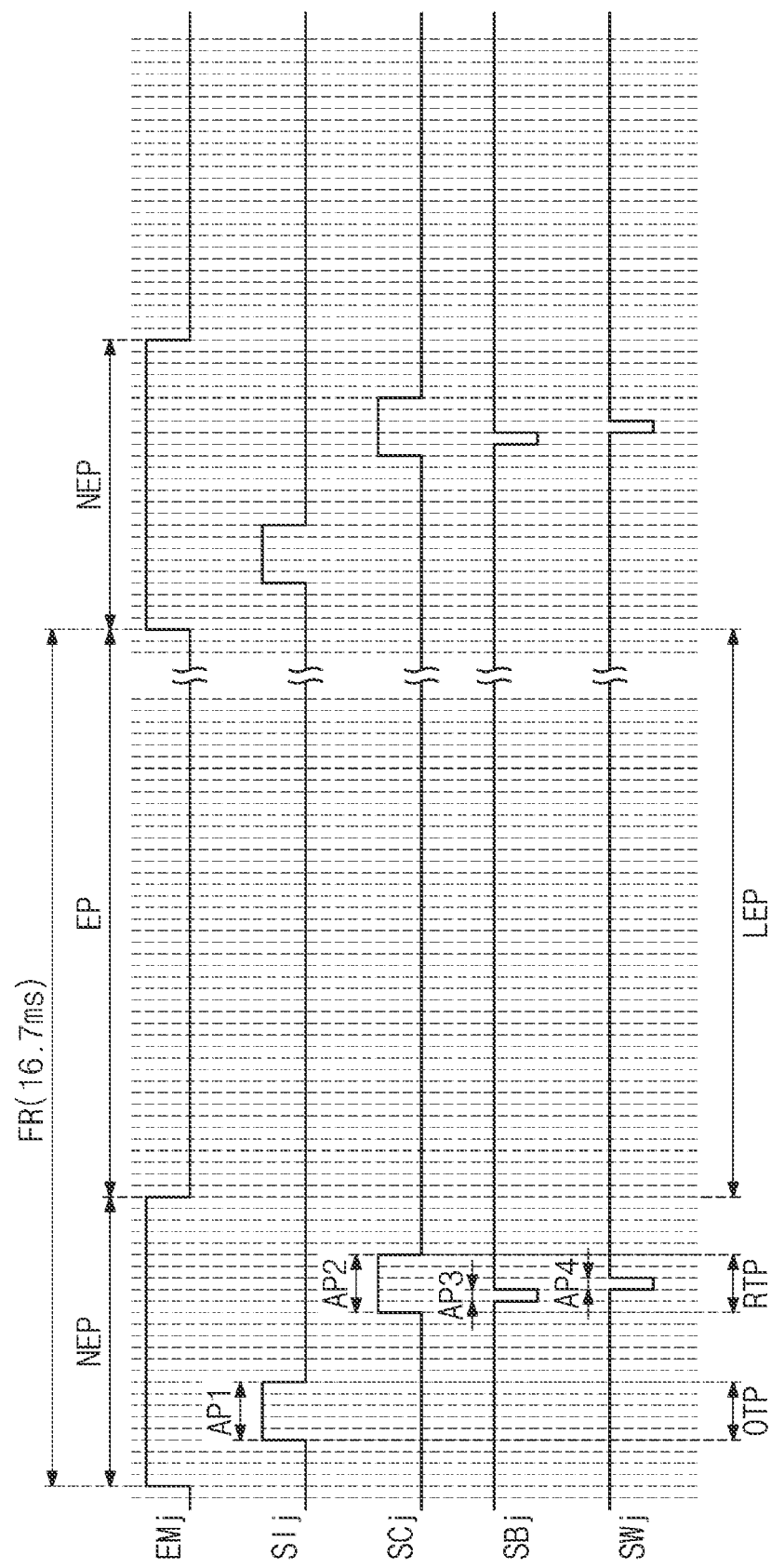
FIG. 7 is a waveform diagram for describing an operation of a sensor illustrated in FIG. 6.

FIG. 6 is a circuit diagram of a connection relationship between a sensor and scan lines according to some embodiments of the present disclosure, and FIG. 7 is a waveform diagram for describing an operation of a sensor illustrated in FIG. 6.

Sensors located at different rows are illustrated in FIG. 6. For convenience of description, a sensor located at the (j−1)-th row is referred to as a "previous-row sensor FX(i−1)(j−1)", a sensor located at the j-th row is referred to as a "current-row sensor FXij", and a sensor located at the (j+1)-th row is referred to as a "next-row sensor FX(i−1)(j+1)".

In the current-row sensor FXij, the reset transistor ST1 is connected with the j-th compensation scan line SCLj, the j-th initialization scan line SILj, and the i-th readout line RLi. In detail, the first electrode of the reset transistor ST1 of the current-row sensor FXij is connected with the j-th initialization scan line SILj, and the third electrode thereof is connected with the j-th compensation scan line SCLj. Accordingly, the reset transistor ST1 of the current-row sensor FXij receives the j-th compensation scan signal SCj as the reset control signal and receives the j-th initialization scan signal SIj as the reset signal RST (refer to FIG. 5). The output transistor ST3 of the current-row sensor FXij is connected with the j-th initialization scan line SILj. Accordingly, the output transistor ST3 receives the j-th initialization scan signal SIj as the output control signal.

According to some embodiments of the present disclosure, the previous-row and next-row sensors FX(i−1)(j−1) and FX(i−1)(j+1) may be connected with the (i−1)-th readout line RLi-1. Even in the previous-row and next-row sensors FX(i−1)(j−1) and FX(i−1)(j+1), the reset transistor ST1 is connected with the corresponding compensation scan line and the corresponding initialization scan line. In detail, the first electrode of the reset transistor ST1 of the previous-row sensor FX(i−1)(j−1) is connected with the (j−1)-th initialization scan line SILj-1, and the third electrode thereof is connected with the (j−1)-th compensation scan line SCLj-1. Accordingly, the reset transistor ST1 of the previous-row sensor FX(i−1)(j−1) receives the (j−1)-th compensation scan signal SCj-1 as the reset control signal and receives the (j−1)-th initialization scan signal SIj-1 as the reset signal RST. The output transistor ST3 of the previous-row sensor FX(i−1)(j−1) is connected with the (j−1)-th initialization scan line SILj-1 and receives the (j−1)-th initialization scan signal SIj-1 as the output control signal.

The first electrode of the reset transistor ST1 of the next-row sensor FX(i−1)(j+1) is connected with the (j+1)-th initialization scan line SILj+1, and the third electrode thereof is connected with the (j+1)-th compensation scan line SCLj+1. Accordingly, the reset transistor ST1 of the next-row sensor FX(i−1)(j+1) receives the (j+1)-th compensation scan signal SCj+1 as the reset control signal and receives the (j+1)-th initialization scan signal SIj+1 as the reset signal RST. The output transistor ST3 of the next-row sensor FX(i−1)(j+1) is connected with the (j+1)-th initialization scan line SILj+1 and receives the (j+1)-th initialization scan signal SIj+1 as the output control signal.

A structure in which a sensor connected with the i-th readout line RLi and a sensor connected with the (i−1)-th readout line RLi-1 are located at different rows is illustrated in FIG. 6, but embodiments according to the present disclosure are not limited thereto. That is, sensors connected with each readout line RLi may be located in units of one row, not two rows, on a column direction. Alternatively, sensors connected with each readout line RLi may be repeatedly located in units of three or more rows on a column direction.

Referring to FIGS. 5 to 7, one frame FR may include an emission period EP and a non-emission period NEP depending on an operation of the pixel PXij. The emission period EP may correspond to a low level period (i.e., an active period) of the j-th emission control signal EMj, and the non-emission period NEP may correspond to a high level period (i.e., an inactive period) of the j-th emission control signal EMj. As an example of the present disclosure, in the case where the display panel DP (illustrated in FIG. 3) operates at about 60 Hz, the one frame FR may have a duration time corresponding to about 16.7 ms. The duration time of the one frame FR may vary depending on a driving frequency of the display panel DP.

The one frame FR may include an output period OTP, a reset period RTP, and a light exposure period LEP that are distinguished depending on the operation of the sensor FXij. As an example of the present disclosure, the output period OTP and the reset period RTP may overlap the non-emission period NEP. The light exposure period LEP of the sensor FXij may correspond to the emission period EP. The light sensing element OPD is exposed to a light during the emission period EP. The light may be a light output from the light emitting element ED of the pixel PXij.

When the user's hand US_F (refer to FIG. 1) touches the display surface, the light sensing element OPD may generate photoelectrons corresponding to the light reflected by a ridge of a fingerprint or a valley between ridges, and the generated photoelectrons may be accumulated at the first sensing node SN1.

The amplification transistor ST2 may be a source follower amplifier that generates a source-drain current in proportion to the amount of charges of the first sensing node SN1, which are input to the third electrode of the amplification transistor ST2.

The j-th initialization scan signal SIj of the high level is supplied to the output transistor ST3 through the j-th initialization scan line SILj during the output period OTP.

The output period OTP may be defined as the active period AP1 (i.e., the high level period) of the j-th initialization scan signal SIj. When the output transistor ST3 is turned on in response to the j-th initialization scan signal SIj of the high level, the sensing signal FSi corresponding to a current flowing through the amplification transistor ST2 may be output to the i-th readout line RLi. The output period OTP of the sensor FXij may correspond to the initialization period of the pixel PXij.

Next, when the j-th compensation scan signal SCj of the high level is supplied through the j-th compensation scan line SCLj during the reset period RTP, the reset transistor ST1 is turned on. The reset period RTP may be defined as the active period AP2 (i.e., the high level period) of the j-th compensation scan signal SCj. In this case, the j-th initialization scan signal SIj is provided to the first electrode of the reset transistor ST1. The active period of the j-th initialization scan signal SIj may not overlap the active period of the j-th compensation scan signal SCj. Accordingly, the j-th initialization scan signal SIj may have the low level during the active period AP2 of the j-th compensation scan signal SCj. As such, during the reset period RTP, the first sensing node SN1 may be reset to a potential corresponding to the low level of the j-th initialization scan signal SIj. As an example of the present disclosure, the low level of the j-th initialization scan signal SIj may have a voltage level lower than the second driving voltage ELVSS. The reset period RTP of the sensor FXij may correspond to the compensation period of the pixel PXij.

Then, during the emission period EP, the light sensing element OPD may generate photoelectrons corresponding to a received light, and the generated photoelectrons may be accumulated at the first sensing node SN1.

As described above, the j-th initialization scan signal SIj and the j-th compensation scan signal SCj for driving the pixel PXij may be used to drive the current-row sensor FXij. For example, the j-th compensation scan signal SCj and the j-th initialization scan signal SIj that are respectively supplied to the third transistor T3 and the fourth transistor T4 of the pixel PXij may be respectively supplied to the reset transistor ST1 and the output transistor ST3 of the current-row sensor FXij. Accordingly, because a separate signal wire or circuit that is necessary to drive the sensors FXij, FX(i−1)(j−1), and FX(i−1)(j+1) is unnecessary, even though the sensors FXij, FX(i−1)(j−1), and FX(i−1)(j+1) are located in the display panel DP, the reduction in an aperture ratio may be minimized, reduced, or prevented.

Also, the reset transistor ST1 and the output transistor ST3 may be formed of an oxide semiconductor transistor. A leakage current of the oxide semiconductor transistor may be relatively small compared to the LTPS transistor. For example, a sensing noise due to a leakage current may decrease as the reset transistor ST1 periodically resetting the anode of the light sensing element OPD is formed of an oxide semiconductor transistor. As a result, sensing performance of the sensors FXij, FX(i−1)(j−1), and FX(i−1)(j+1) may be improved.

Figure 8:
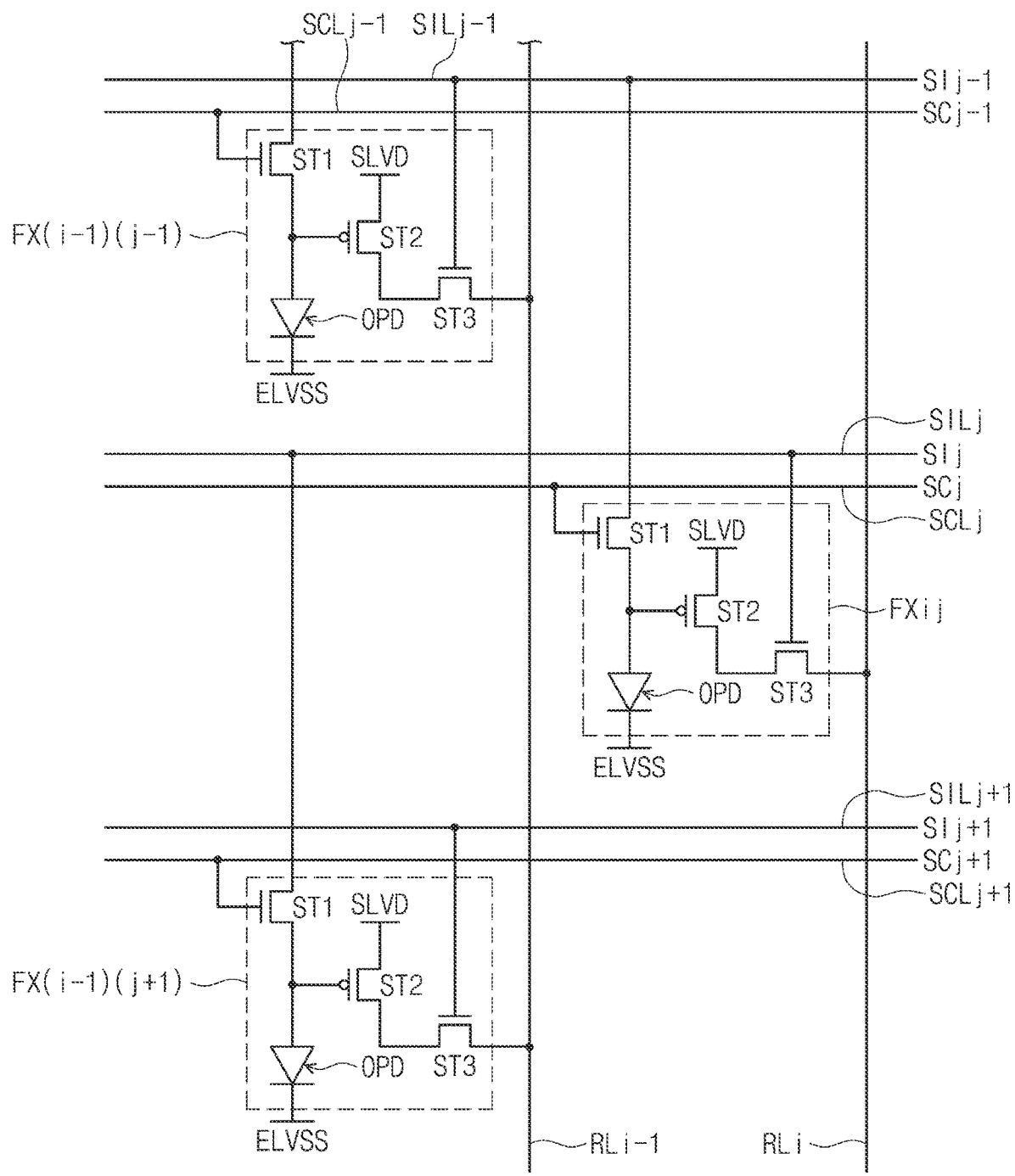
FIG. 8 is a circuit diagram of a connection relationship between a sensor and scan lines according to some embodiments of the present disclosure.
Figure 9:
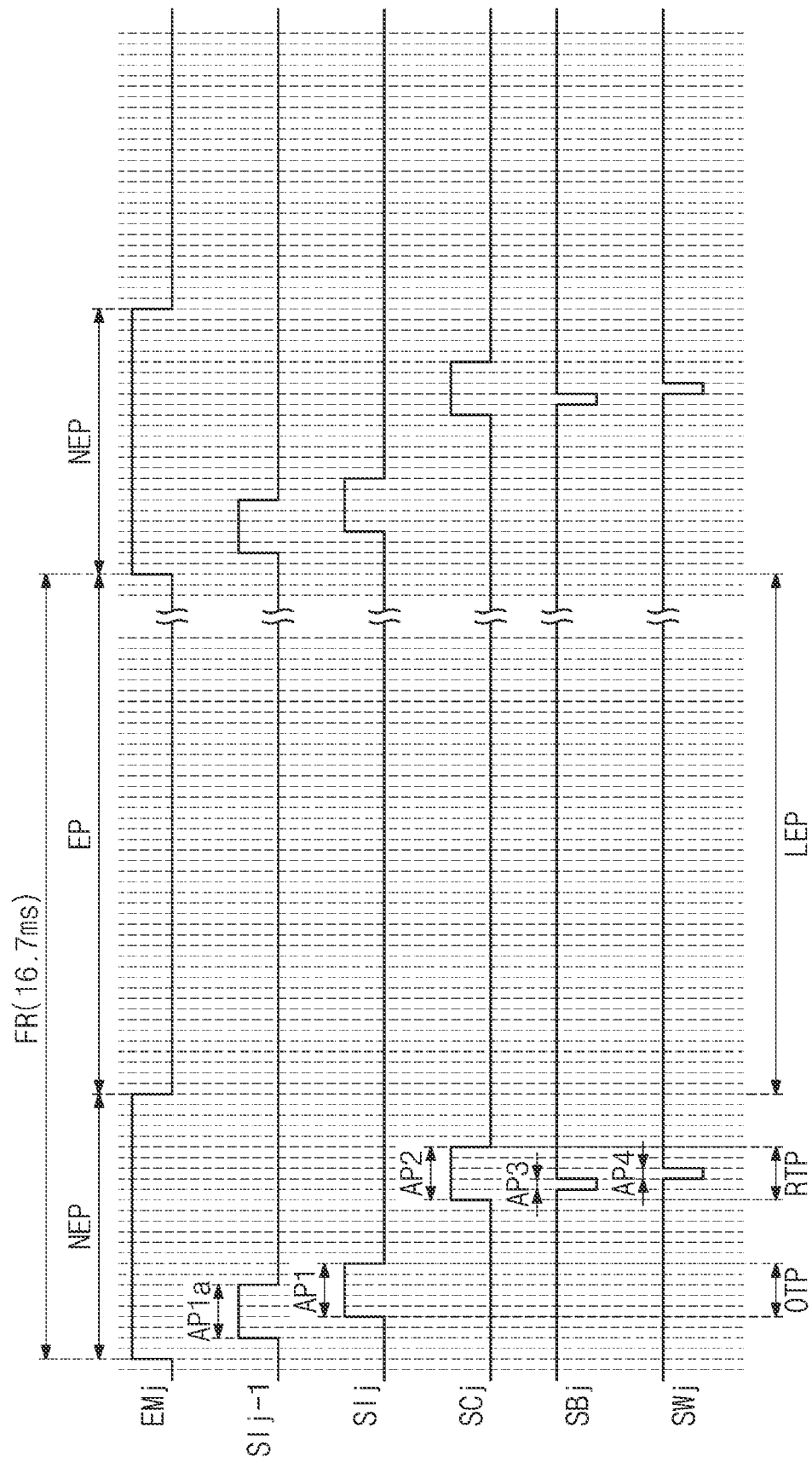
FIG. 9 is a waveform diagram for describing an operation of a sensor illustrated in FIG. 8.

FIG. 8 is a circuit diagram of a connection relationship between a sensor and scan lines according to some embodiments of the present disclosure, and FIG. 9 is a waveform diagram for describing an operation of a sensor illustrated in FIG. 8. Components, which are the same as the components illustrated in FIGS. 6 and 7, from among components illustrated in FIGS. 8 and 9 are marked by the same reference signs, and thus, additional description will be omitted to avoid redundancy.

Referring to FIG. 8, in the current-row sensor FXij, the reset transistor ST1 is connected with the j-th compensation scan line SCLj, the j-th initialization scan line SILj, the (j−1)-th initialization scan line SILj-1, and the i-th readout line RLi. In detail, the first electrode of the reset transistor ST1 of the current-row sensor FXij is connected with the (j−1)-th initialization scan line SILj-1, and the third electrode thereof is connected with the j-th compensation scan line SCLj. Accordingly, the reset transistor ST1 of the current-row sensor FXij receives the j-th compensation scan signal SCj as the reset control signal and receives the (j−1)-th initialization scan signal SIj-1 as the reset signal RST (refer to FIG. 5). Also, the output transistor ST3 of the current-row sensor FXij is connected with the j-th initialization scan line SILj. Accordingly, the output transistor ST3 receives the j-th initialization scan signal SIj as the output control signal.

As an example of the present disclosure, the previous-row and next-row sensors FX(i−1)(j−1) and FX(i−1)(j+1) are connected with the (i−1)-th readout line RLi-1.

Even in the previous-row and next-row sensors FX(i−1)(j−1) and FX(i−1)(j+1), the reset transistor ST1 is connected with the corresponding compensation scan line, the corresponding initialization scan line, and a previous initialization scan line. In detail, the first electrode of the reset transistor ST1 of the previous-row sensor FX(i−1)(j−1) is connected with the (j−2)-th initialization scan line, and the third electrode thereof is connected with the (j−1)-th compensation scan line SCLj-1. Accordingly, the reset transistor ST1 of the previous-row sensor FX(i−1)(j−1) receives the (j−1)-th compensation scan signal SCj-1 as the reset control signal and receives the (j−2)-th initialization scan signal as the reset signal RST. The output transistor ST3 of the previous-row sensor FX(i−1)(j−1) is connected with the (j−1)-th initialization scan line SILj-1 and receives the (j−1)-th initialization scan signal SIj-1 as the output control signal.

The first electrode of the reset transistor ST1 of the next-row sensor FX(i−1)(j+1) is connected with the j-th initialization scan line SILj, and the third electrode thereof is connected with the (j+1)-th compensation scan line SCLj+1. Accordingly, the reset transistor ST1 of the next-row sensor FX(i−1)(j+1) receives the (j+1)-th compensation scan signal SCj+1 as the reset control signal and receives the j-th initialization scan signal SIj as the reset signal RST. The output transistor ST3 of the next-row sensor FX(i−1)(j+1) is connected with the (j+1)-th initialization scan line SILj+1 and receives the (j+1)-th initialization scan signal SIj+1 as the output control signal.

Referring to FIG. 9, one frame FR may include the emission period EP and the non-emission period NEP depending on an operation of the pixel PXij. One frame FR may include the output period OTP, the reset period RTP, and the light exposure period LEP that are distinguished depending on the operation of the sensor FXij. As an example of the present disclosure, the output period OTP and the reset period RTP may overlap the non-emission period NEP. The light exposure period LEP of the sensor FXij may correspond to the emission period EP. The light sensing element OPD is exposed to a light during the emission period EP. The light may be a light output from the light emitting element ED of the pixel PXij.

The j-th initialization scan signal SIj of the high level is supplied to the output transistor ST3 through the j-th initialization scan line SILj during the output period OTP. The output period OTP may be defined as the active period AP1 (i.e., the high level period) of the j-th initialization scan signal SIj. When the output transistor ST3 is turned on in response to the j-th initialization scan signal SIj of the high level, the sensing signal FSi corresponding to a current flowing through the amplification transistor ST2 may be output to the i-th readout line RLi.

Next, when the j-th compensation scan signal SCj of the high level is supplied through the j-th compensation scan line SCLj during the reset period RTP, the reset transistor ST1 is turned on. The reset period RTP may be defined as the active period AP2 (i.e., the high level period) of the j-th compensation scan signal SCj. In this case, the (j−1)-th initialization scan signal SIj-1 is provided to the first electrode of the reset transistor ST1. An active period AP1a of the (j−1)th initialization scan signal SIj-1 may not overlap the active period AP2 of the j-th compensation scan signal SCj. Accordingly, the (j−1)-th initialization scan signal SIj-1 may have the low level during the active period AP2 of the j-th compensation scan signal SCj. As such, during the reset period RTP, the first sensing node SN1 may be reset to a potential corresponding to the low level of the (j−1)-th initialization scan signal SIj-1. As an example of the present disclosure, the low level of the (j−1)-th initialization scan signal SIj-1 may have a voltage level lower than the second driving voltage ELVSS.

Then, during the emission period EP, the light sensing element OPD may generate photoelectrons corresponding to a received light, and the generated photoelectrons may be accumulated at the first sensing node SN1.

As described above, the j-th initialization scan signal SIj and the j-th compensation scan signal SCj for driving the pixel PXij and the (j−1)-th initialization scan signal SIj-1 for driving a previous-row pixel may be used to drive the current-row sensor FXij. Accordingly, because a separate signal wire or circuit that is necessary to drive the sensors FXij, FX(i−1)(j−1), and FX(i−1)(j+1) is unnecessary, even though the sensors FXij, FX(i−1)(j−1), and FX(i−1)(j+1) are located in the display panel DP, the reduction in an aperture ratio may be minimized, reduced, or prevented.

Figure 10:
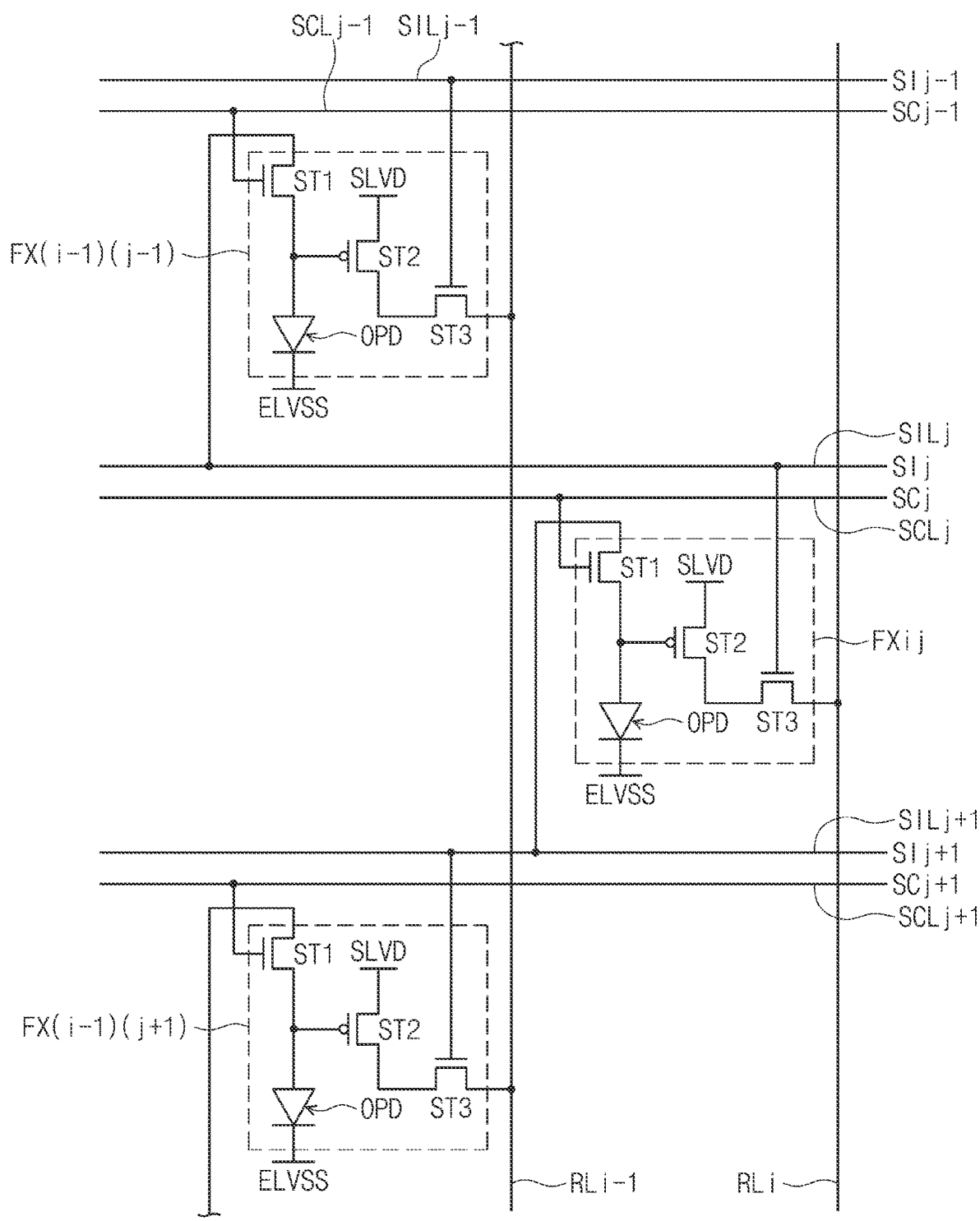
FIG. 10 is a circuit diagram of a connection relationship between a sensor and scan lines according to some embodiments of the present disclosure.
Figure 11:
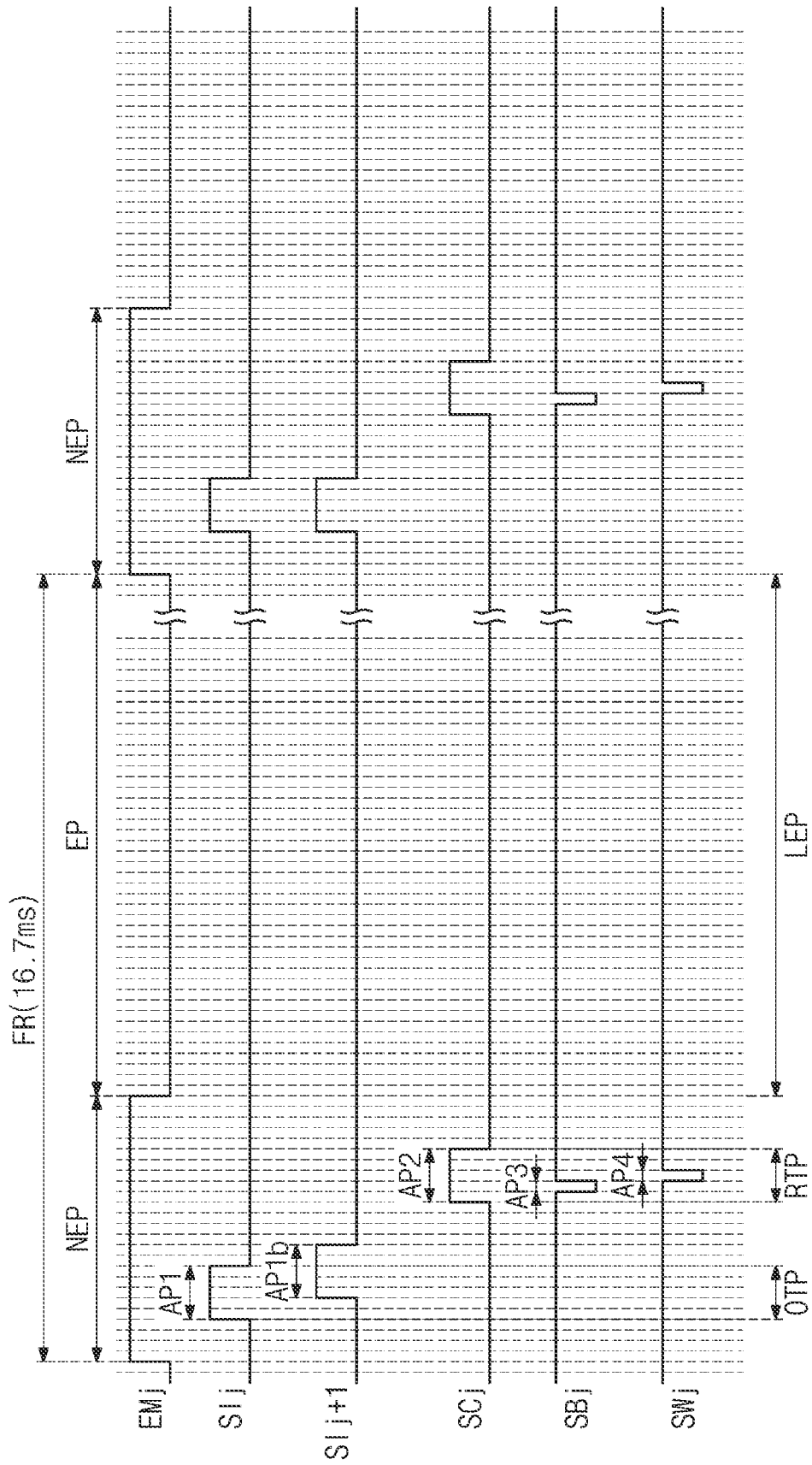
FIG. 11 is a waveform diagram for describing an operation of a sensor illustrated in FIG. 10.

FIG. 10 is a circuit diagram of a connection relationship between a sensor and scan lines according to some embodiments of the present disclosure, and FIG. 11 is a waveform diagram for describing an operation of a sensor illustrated in FIG. 10. Components, which are the same as the components illustrated in FIGS. 6 and 7, from among components illustrated in FIGS. 10 and 11 are marked by the same reference signs, and thus, additional description will be omitted to avoid redundancy.

Referring to FIG. 10, in the current-row sensor FXij, the reset transistor ST1 is connected with the j-th compensation scan line SCLj, the j-th initialization scan line SILj, the (j+1)-th initialization scan line SILj+1, and the i-th readout line RLi. In detail, the first electrode of the reset transistor ST1 of the current-row sensor FXij is connected with the (j+1)-th initialization scan line SILj+1, and the third electrode thereof is connected with the j-th compensation scan line SCLj. Accordingly, the reset transistor ST1 of the current-row sensor FXij receives the j-th compensation scan signal SCj as the reset control signal and receives the (j+1)-th initialization scan signal SIj+1 as the reset signal RST (refer to FIG. 5). Also, the output transistor ST3 of the current-row sensor FXij is connected with the j-th initialization scan line SILj. Accordingly, the output transistor ST3 receives the j-th initialization scan signal SIj as the output control signal.

As an example of the present disclosure, the previous-row and next-row sensors FX(i−1)(j−1) and FX(i−1)(j+1) are connected with the (i−1)-th readout line RLi−1. Even in the previous-row and next-row sensors FX(i−1)(j−1) and FX(i−1)(j+1), the reset transistor ST1 is connected with the corresponding compensation scan line, the corresponding initialization scan line, and a next initialization scan line.

Referring to FIG. 11, one frame FR may include the emission period EP and the non-emission period NEP depending on an operation of the pixel PXij. One frame FR may include the output period OTP, the reset period RTP, and the light exposure period LEP that are distinguished depending on the operation of the sensor FXij.

The j-th initialization scan signal SIj of the high level is supplied to the output transistor ST3 through the j-th initialization scan line SILj during the output period OTP. When the output transistor ST3 is turned on in response to the j-th initialization scan signal SIj of the high level, the sensing signal FSi corresponding to a current flowing through the amplification transistor ST2 may be output to the i-th readout line RLi.

Next, when the j-th compensation scan signal SCj of the high level is supplied through the j-th compensation scan line SCLj during the reset period RTP, the reset transistor ST1 is turned on. In this case, the (j+1)-th initialization scan signal SIj+1 is provided to the first electrode of the reset transistor ST1. An active period AP1b of the (j+1)th initialization scan signal SIj+1 may not overlap the active period AP2 of the j-th compensation scan signal SCj. Accordingly, the (j+1)-th initialization scan signal SIj+1 may have the low level during the active period AP2 of the j-th compensation scan signal SCj. As such, during the reset period RTP, the first sensing node SN1 may be reset to a potential corresponding to the low level of the (j+1)-th initialization scan signal SIj+1. As an example of the present disclosure, the low level of the (j+1)-th initialization scan signal SIj+1 may have a voltage level lower than the second driving voltage ELVSS.

Then, during the emission period EP, the light sensing element OPD may generate photoelectrons corresponding to a received light, and the generated photoelectrons may be accumulated at the first sensing node SN1.

As described above, the j-th initialization scan signal SIj and the j-th compensation scan signal SCJ for driving the pixel PXij and the (j+1)-th initialization scan signal SIj+1 for driving a next-row pixel may be used to drive the current-row sensor FXij. Accordingly, because a separate signal wire or circuit that is necessary to drive the sensors FXij, FX(i−1)(j−1), and FX(i−1)(j+1) is unnecessary, even though the sensors FXij, FX(i−1)(j−1), and FX(i−1)(j+1) are located in the display panel DP, the reduction in an aperture ratio may be minimized, reduced, or prevented.

The structure in which the (j−1)-th initialization scan signal SIj−1, the j-th initialization scan signal SIj, or the (j+1)-th initialization scan signal SIj+1 is supplied to the reset transistor ST1 of the current-row sensor FXij is illustrated in FIGS. 6 to 10 as an example, but embodiments according to the present disclosure are not limited thereto. That is, any initialization scan signal, which has an active period not overlapping the active period AP2 of the j-th compensation scan signal SCj, from among initialization scan signals may be supplied to the reset transistor ST1 as the reset signal RST.

Figure 12:
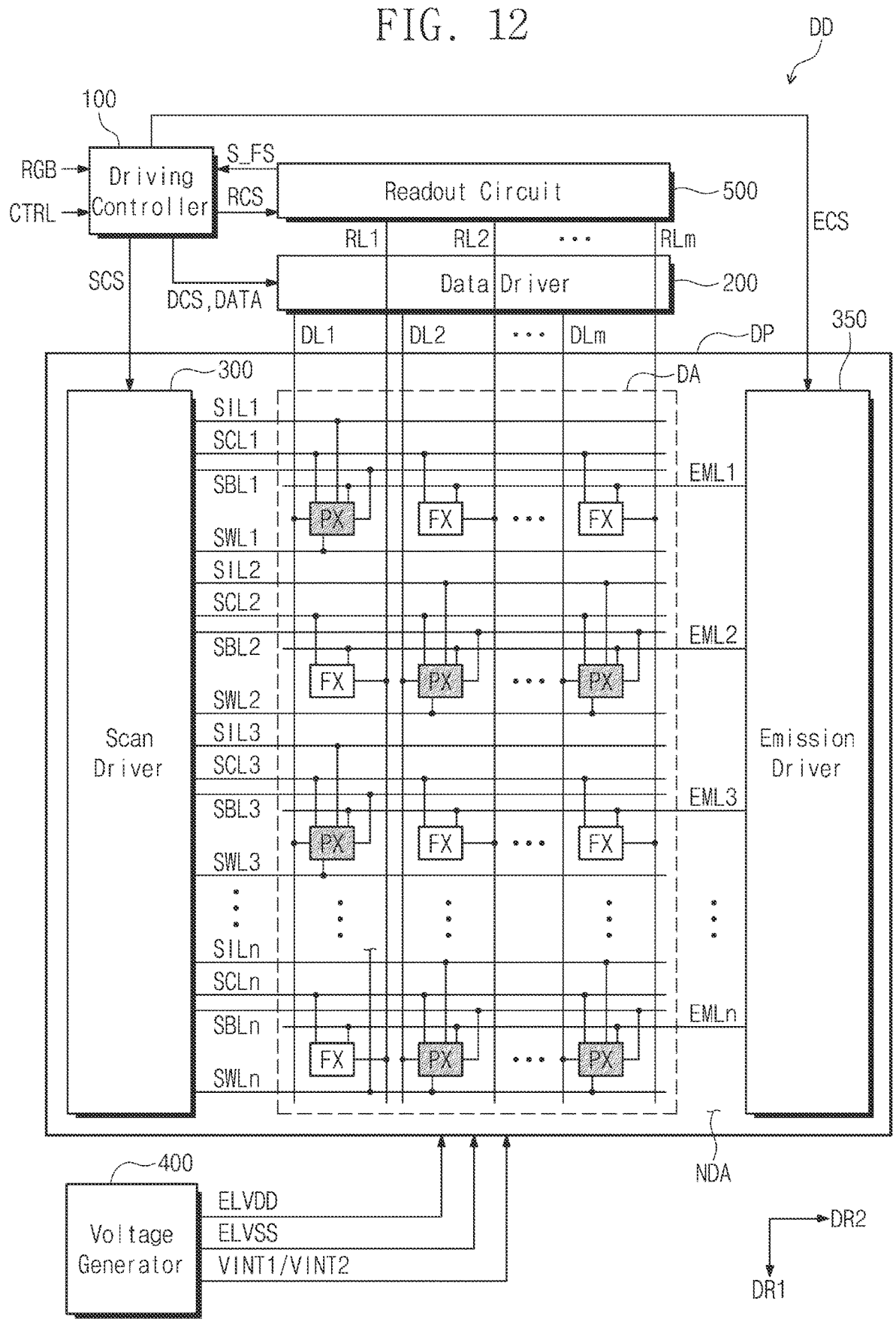
FIG. 12 is a block diagram of a display device according to some embodiments of the present disclosure.
Figure 13:
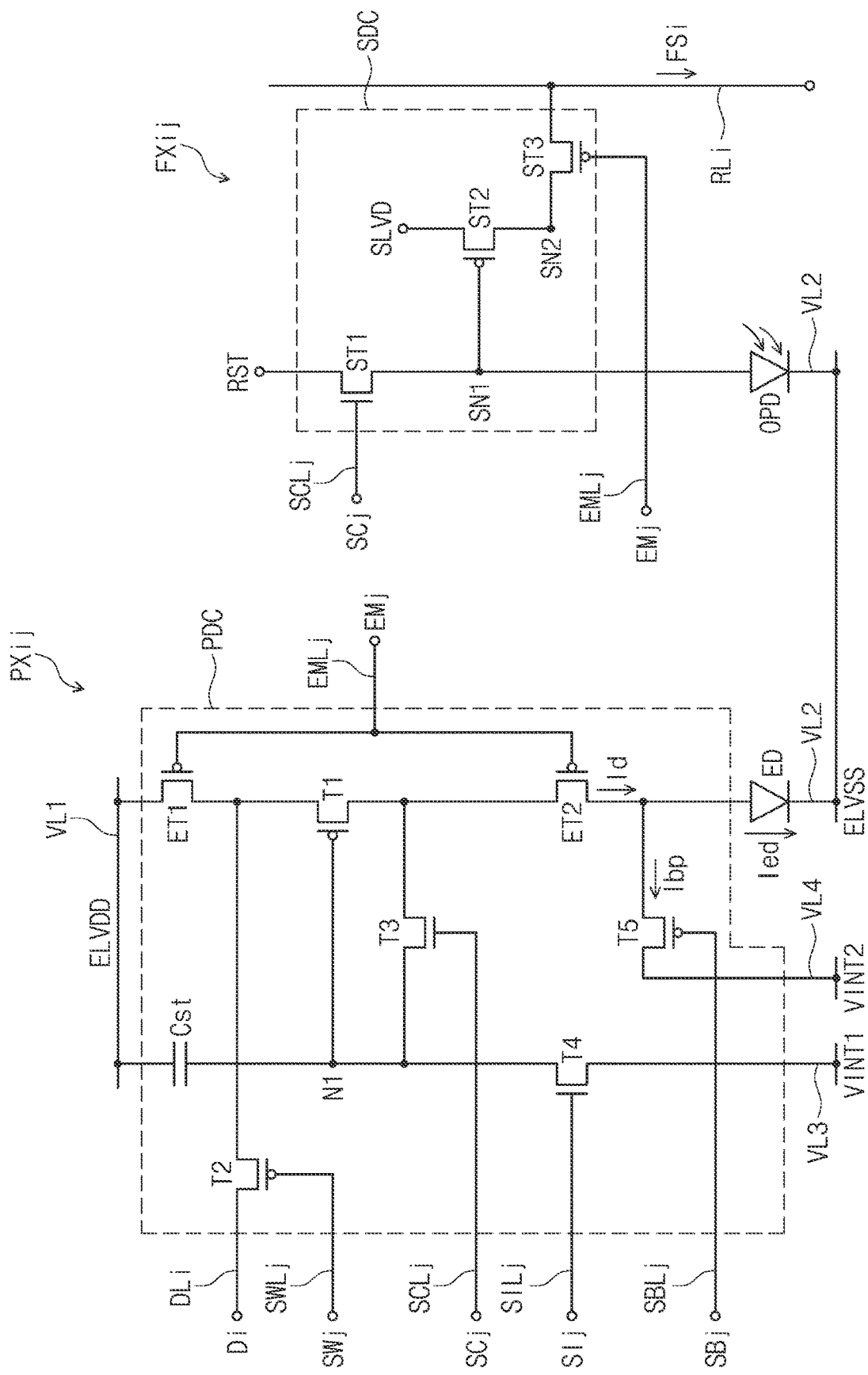
FIG. 13 is a circuit diagram of a pixel and a sensor according to some embodiments of the present disclosure.

FIG. 12 is a block diagram of a display device according to some embodiments of the present disclosure, and FIG. 13 is a circuit diagram illustrating a pixel and a sensor according to some embodiments of the present disclosure. Components, which are the same as the components illustrated in FIGS. 3 and 5, from among components illustrated in FIGS. 12 and 13 are marked by the same reference signs, and thus, additional description will be omitted to avoid redundancy.

Referring to FIG. 12, the plurality of sensors FX may be connected with the compensation scan lines SCL1 to SCLn, the emission control lines EML1 to EMLn, and the readout lines RL1 to RLm. Each of the plurality of sensors FX may be electrically connected with one scan line and one emission control line. For example, as illustrated in FIG. 12, the sensors FX of the first row may be connected with the first compensation scan line SCL1 and the first emission control line EML1. Also, the sensors FX of the second row may be connected with the second compensation scan line SCL2 and the second emission control line EML2.

Referring to FIG. 13, the sensor FXij is connected with the i-th readout line RLi of the readout lines RL1 to RLm, the j-th compensation scan line SCLj, and the j-th emission control line EMLj. The sensor FXij may be further connected with the second driving voltage line VL2.

The sensor FXij includes the light sensing element OPD and the sensor driving circuit SDC. The anode of the light sensing element OPD may be connected with the first sensing node SN1, and the cathode thereof may be connected with the second driving voltage line VL2 transferring the second driving voltage ELVSS.

The sensor driving circuit SDC includes the reset transistor ST1, the amplification transistor ST2, and the output transistor ST3. At least one of the reset transistor ST1, the amplification transistor ST2, or the output transistor ST3 may be an oxide semiconductor transistor. As an example of the present disclosure, the reset transistor ST1 may be an oxide semiconductor transistor, and the amplification transistor ST2 and the output transistor ST3 may be LTPS transistors.

Also, some of the reset transistor ST1, the amplification transistor ST2, and the output transistor ST3 may be P-type transistors, and the other(s) thereof may be an N-type transistor. As an example of the present disclosure, the amplification transistor ST2 and the output transistor ST3 may be PMOS transistors, and the reset transistor ST1 may be an NMOS transistor. However, embodiments according to the present disclosure are not limited thereto. For example, all the transistors ST1, ST2, and ST3 may be N-type transistors or P-type transistors.

Some (e.g., the reset transistor ST1) of the reset transistor ST1, the amplification transistor ST2, and the output transistor ST3 may be implemented with a transistor having the same type as each of the third and fourth transistors T3 and T4 of the pixel PXij. A type of the amplification transistor ST2 and the output transistor ST3 may be the same as that of the first, second, and fifth transistors T1, T2, and T5 and the first and second emission control transistors ET1 and ET2 of the pixel PXij.

A circuit configuration of the sensor driving circuit SDC according to the present disclosure is not limited to an example illustrated in FIG. 13. The sensor driving circuit SDC illustrated in FIG. 13 is only an example, and the configuration of the sensor driving circuit SDC may be modified and implemented.

The reset transistor ST1 and the amplification transistor ST2 are the same as those of FIG. 5, and thus, additional description will be omitted to avoid redundancy.

The output transistor ST3 includes the first electrode connected with the second sensing node SN2, the second electrode connected with the i-th readout line RLi, and the third electrode receiving an output control signal. The output transistor ST3 may transfer the sensing signal FSi to the i-th readout line RLi in response to the output control signal. The output control signal may be the j-th emission control signal EMj that is supplied through the j-th emission control line EMLj. That is, the output transistor ST3 may receive the j-th emission control signal EMj from the j-th emission control line EMLj as the output control signal.

Figure 14:
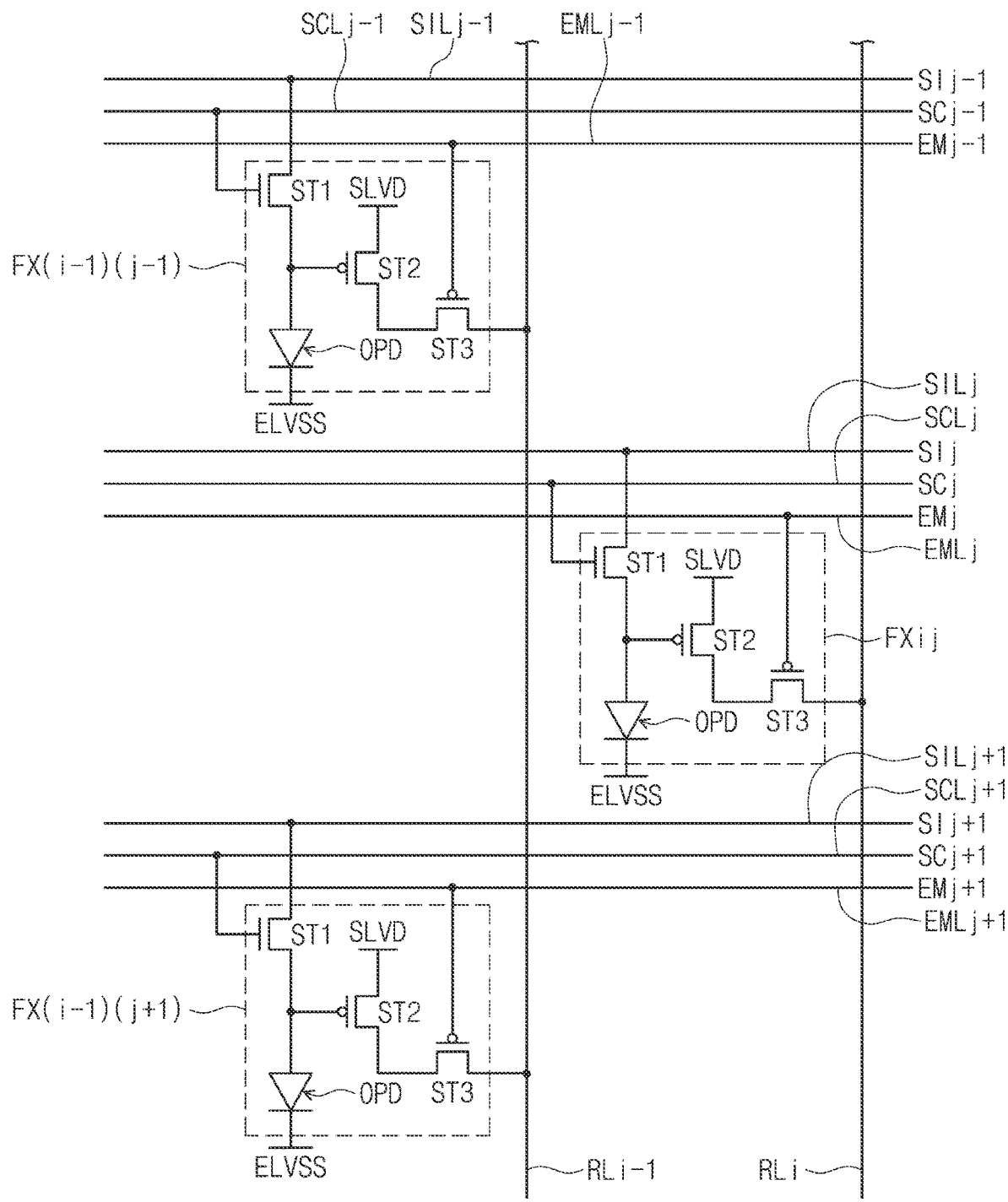
FIG. 14 is a circuit diagram of a connection relationship between a sensor and scan lines according to some embodiments of the present disclosure.
Figure 15:
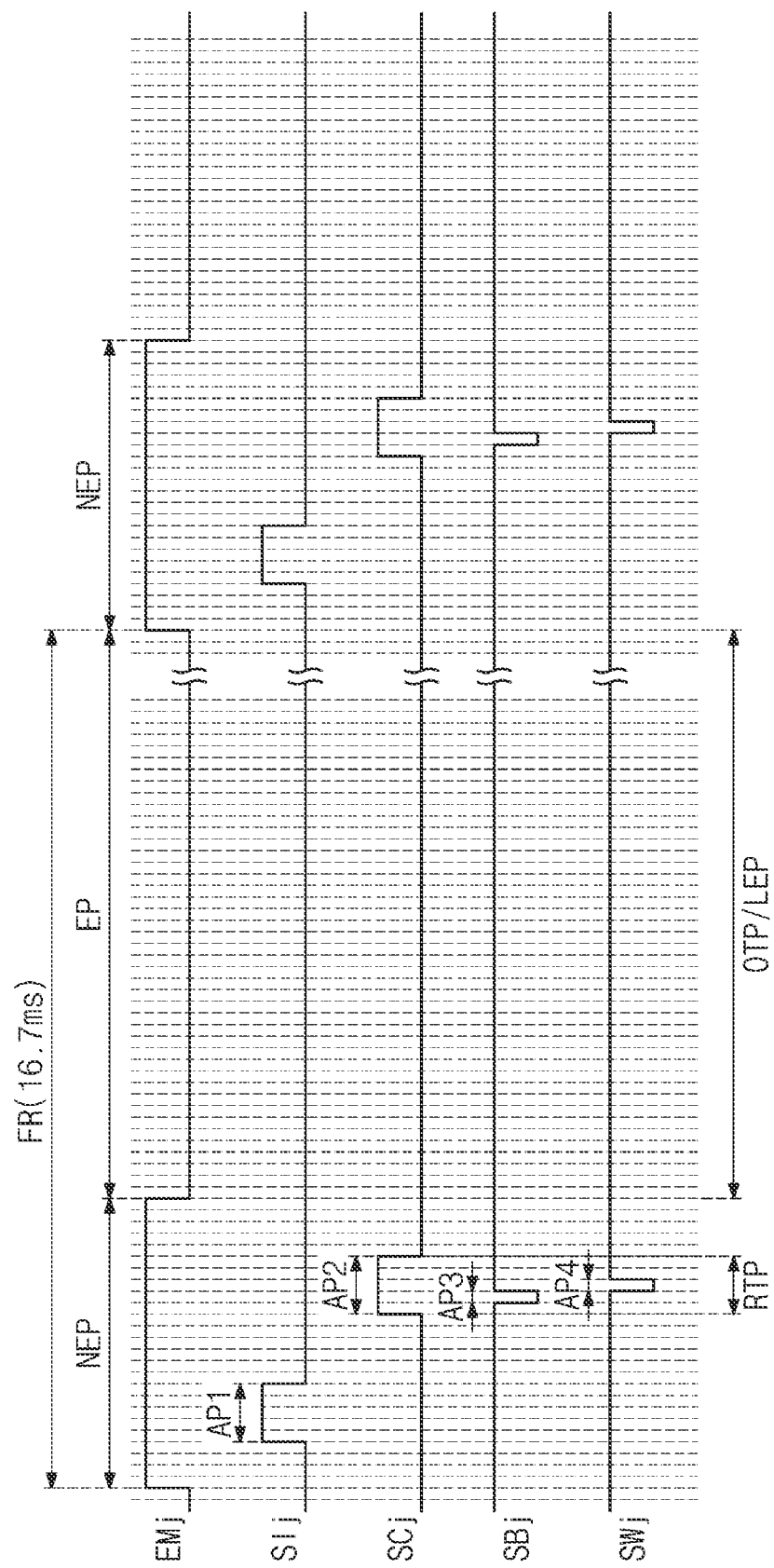
FIG. 15 is a waveform diagram for describing an operation of a sensor illustrated in FIG. 14.

FIG. 14 is a circuit diagram of a connection relationship between a sensor and scan lines according to some embodiments of the present disclosure, and FIG. 15 is a waveform diagram for describing an operation of a sensor illustrated in FIG. 14.

Referring to FIG. 14, in the current-row sensor FXij, the reset transistor ST1 is connected with the j-th compensation scan line SCLj, the j-th initialization scan line SILj, the j-th emission control line EMLj, and the i-th readout line RLi. In detail, the first electrode of the reset transistor ST1 of the current-row sensor FXij is connected with the j-th initialization scan line SILj, and the third electrode thereof is connected with the j-th compensation scan line SCLj. Accordingly, the reset transistor ST1 of the current-row sensor FXij receives the j-th compensation scan signal SCj as the reset control signal and receives the j-th initialization scan signal SIj as the reset signal RST (refer to FIG. 5). Also, the output transistor ST3 of the current-row sensor FXij is connected with the j-th emission control line EMLj. Accordingly, the output transistor ST3 receives the j-th emission control signal EMj as the output control signal.

As an example of the present disclosure, the previous-row and next-row sensors FX(i−1)(j−1) and FX(i−1)(j+1) are connected with the (i−1)-th readout line RLi−1. Even in the previous-row and next-row sensors FX(i−1)(j−1) and FX(i−1)(j+1), the output transistor ST3 is connected with the corresponding emission control line.

Referring to FIG. 15, one frame FR may include the emission period EP and the non-emission period NEP depending on an operation of the pixel PXij. One frame FR may include the output period OTP, the reset period RTP, and the light exposure period LEP that are distinguished depending on the operation of the sensor FXij. Herein, the light exposure period LEP may correspond to the emission period EP, and the output period OTP may also correspond to the emission period EP.

During the emission period EP, the light sensing element OPD may generate photoelectrons corresponding to a received light, and the generated photoelectrons may be accumulated at the first sensing node SN1. The j-th emission control signal EMj of the low level is supplied to the output transistor ST3 through the j-th emission control line EMLj during the emission period EP. When the output transistor ST3 is turned on in response to the j-th emission control signal EMj of the low level, the sensing signal FSi corresponding to a current flowing through the amplification transistor ST2 may be output to the i-th readout line RLi.

Next, when the j-th compensation scan signal SCj of the high level is supplied through the j-th compensation scan line SCLj during the reset period RTP, the reset transistor ST1 is turned on. The active period AP2 of the j-th compensation scan signal SCj corresponds to the reset period RTP. The j-th initialization scan signal SIj is provided to the first electrode of the reset transistor ST1 during the reset period RTP. The active period AP1 of the j-th initialization scan signal SIj may not overlap the active period AP2 of the j-th compensation scan signal SCj. Accordingly, the j-th initialization scan signal SIj may have the low level during the active period AP2 of the j-th compensation scan signal SCj. As such, during the reset period RTP, the first sensing node SN1 may be reset to a potential corresponding to the low level of the j-th initialization scan signal SIj. As an example of the present disclosure, the low level of the j-th initialization scan signal SIj may have a voltage level lower than the second driving voltage ELVSS.

As described above, the j-th initialization scan signal SIj and the j-th compensation scan signal SCj, and the j-th emission control signal EMj for driving the pixel PXij may be used to drive the current-row sensor FXij. Accordingly, because a separate signal wire or circuit that is necessary to drive the sensors FXij, FX(i−1)(j−1), and FX(i−1)(j+1) is unnecessary, even though the sensors FXij, FX(i−1)(j−1), and FX(i−1)(j+1) are located in the display panel DP, the reduction in an aperture ratio may be minimized, reduced, or prevented.

Figure 16:
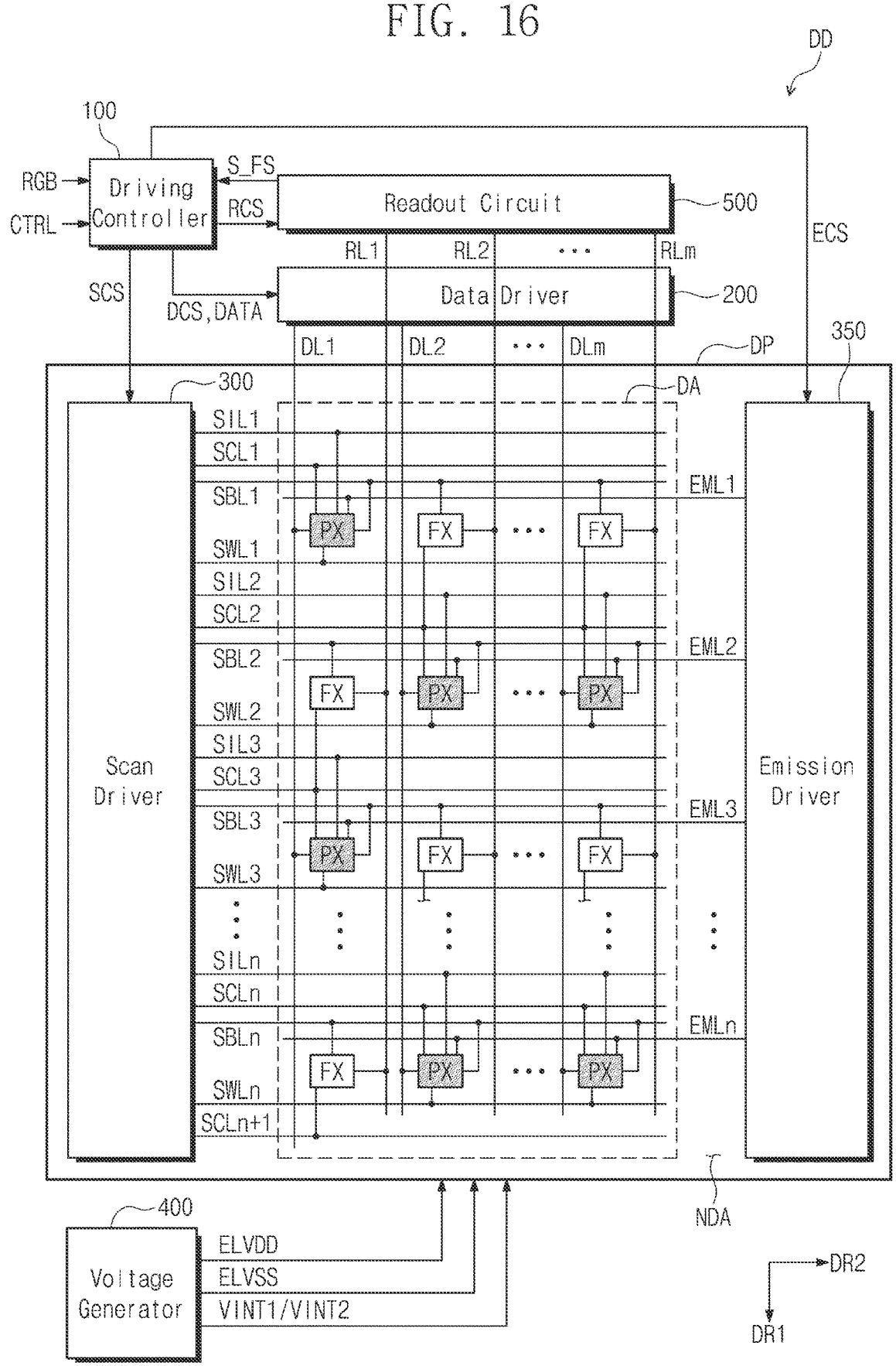
FIG. 16 is a block diagram illustrating a display device according to some embodiments of the present disclosure.
Figure 17:
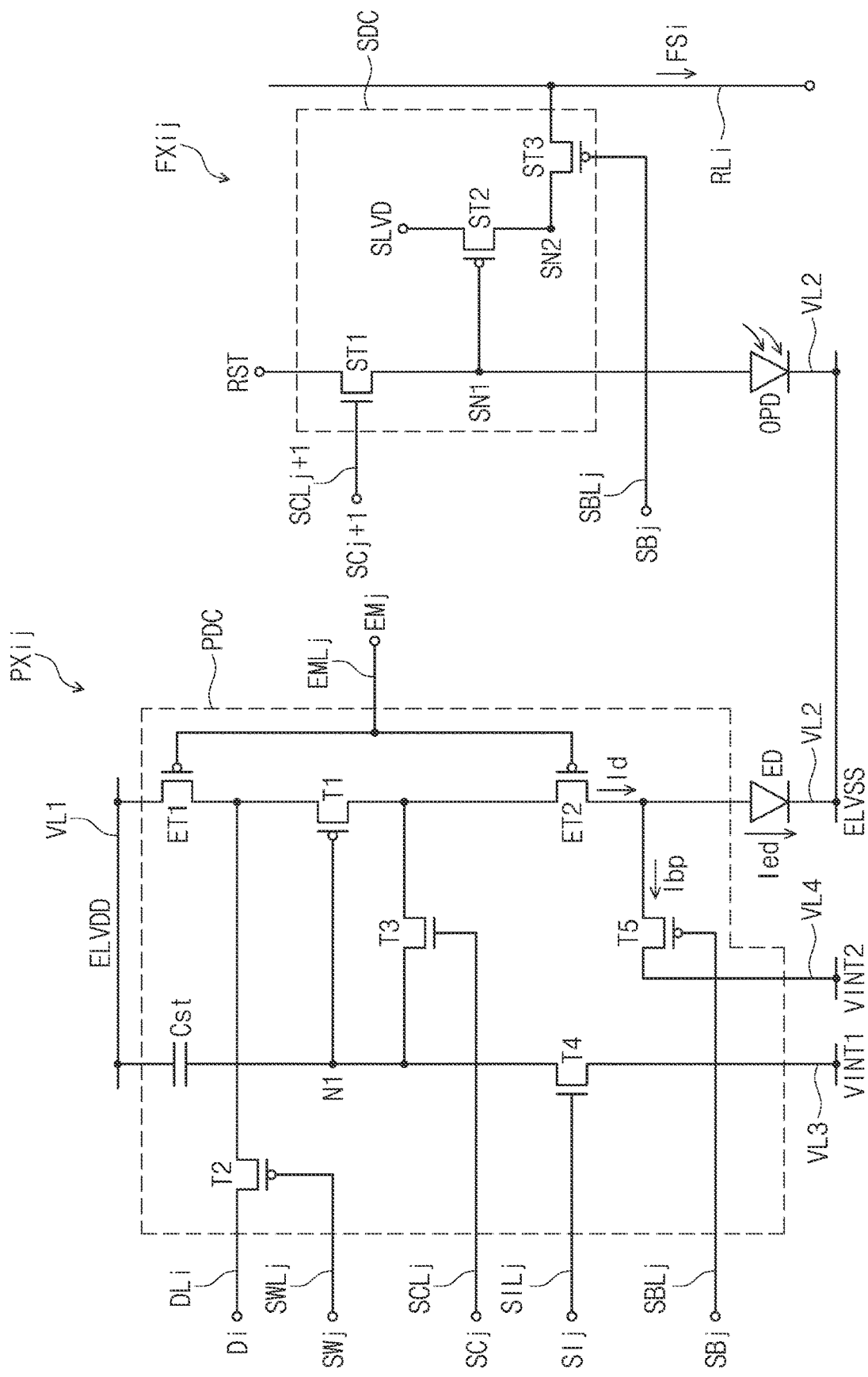
FIG. 17 is a circuit diagram of a pixel and a sensor according to some embodiments of the present disclosure.

FIG. 16 is a block diagram of a display device according to some embodiments of the present disclosure, and FIG. 17 is a circuit diagram illustrating a pixel and a sensor according to some embodiments of the present disclosure. Components, which are the same as the components illustrated in FIGS. 12 and 13, from among components illustrated in FIGS. 16 and 17 are marked by the same reference signs, and thus, additional description will be omitted to avoid redundancy.

Referring to FIG. 16, the plurality of sensors FX may be connected with the compensation scan lines SCL1 to SCLn, the black scan lines SBL1 to SBLn, and the readout lines RL1 to RLm. Each of the plurality of sensors FX may be electrically connected with two scan lines. For example, as illustrated in FIG. 16, the sensors FX of the first row may be connected with the second compensation scan line SCL2 and the first black scan line SBL1. Also, the sensors FX of the second row may be connected with the third compensation scan line SCL3 and the second black scan line SBL2.

Referring to FIG. 17, the sensor FXij is connected with the i-th readout line RLi, the (j+1)-th compensation scan line SCLj+1, and the j-th black scan line SBLj. The sensor FXij may be further connected with the second driving voltage line VL2.

The sensor FXij includes the light sensing element OPD and the sensor driving circuit SDC. The anode of the light sensing element OPD may be connected with the first sensing node SN1, and the cathode thereof may be connected with the second driving voltage line VL2 transferring the second driving voltage ELVSS.

The sensor driving circuit SDC includes the reset transistor ST1, the amplification transistor ST2, and the output transistor ST3. As an example of the present disclosure, the reset transistor ST1 may be an oxide semiconductor transistor, and the amplification transistor ST2 and the output transistor ST3 may be LTPS transistors.

Also, some of the reset transistor ST1, the amplification transistor ST2, and the output transistor ST3 may be P-type transistors, and the other(s) thereof may be an N-type transistor. As an example of the present disclosure, the amplification transistor ST2 and the output transistor ST3 may be PMOS transistors, and the reset transistor ST1 may be an NMOS transistor.

Some (e.g., the reset transistor ST1) of the reset transistor ST1, the amplification transistor ST2, and the output transistor ST3 may be implemented with a transistor having the same type as each of the third and fourth transistors T3 and T4 of the pixel PXij. A type of the amplification transistor ST2 and the output transistor ST3 may be the same as that of the first, second, and fifth transistors T1, T2, and T5 and the first and second emission control transistors ET1 and ET2 of the pixel PXij.

The amplification transistor ST2 is the same as that of FIG. 13, and thus, additional description will be omitted to avoid redundancy.

The reset transistor ST1 includes the first electrode receiving the reset signal RST, the second electrode connected with the first sensing node SN1, and the third electrode receiving a reset control signal. The reset control signal may be the (j+1)-th compensation scan signal SCj+1 that is supplied through the (j+1)-th compensation scan line SCLj+1. That is, the reset transistor ST1 may receive the (j+1)-th compensation scan signal SCj+1 from the (j+1)-th compensation scan line SCLj+1 as the reset control signal. As an example of the present disclosure, the reset signal RST may be a signal whose voltage level is lower than that of the second driving voltage ELVSS at least during an active period of the (j+1)-th compensation scan signal SCj+1.

The output transistor ST3 includes the first electrode connected with the second sensing node SN2, the second electrode connected with the i-th readout line RLi, and the third electrode receiving an output control signal. The output transistor ST3 may transfer the sensing signal FSi to the i-th readout line RLi in response to the output control signal. The output control signal may be the j-th black scan signal SBj that is supplied through the j-th black scan line SBLj. That is, the output transistor ST3 may receive the j-th black scan signal SBj from the j-th black scan line SBLj as the output control signal.

Figure 18:
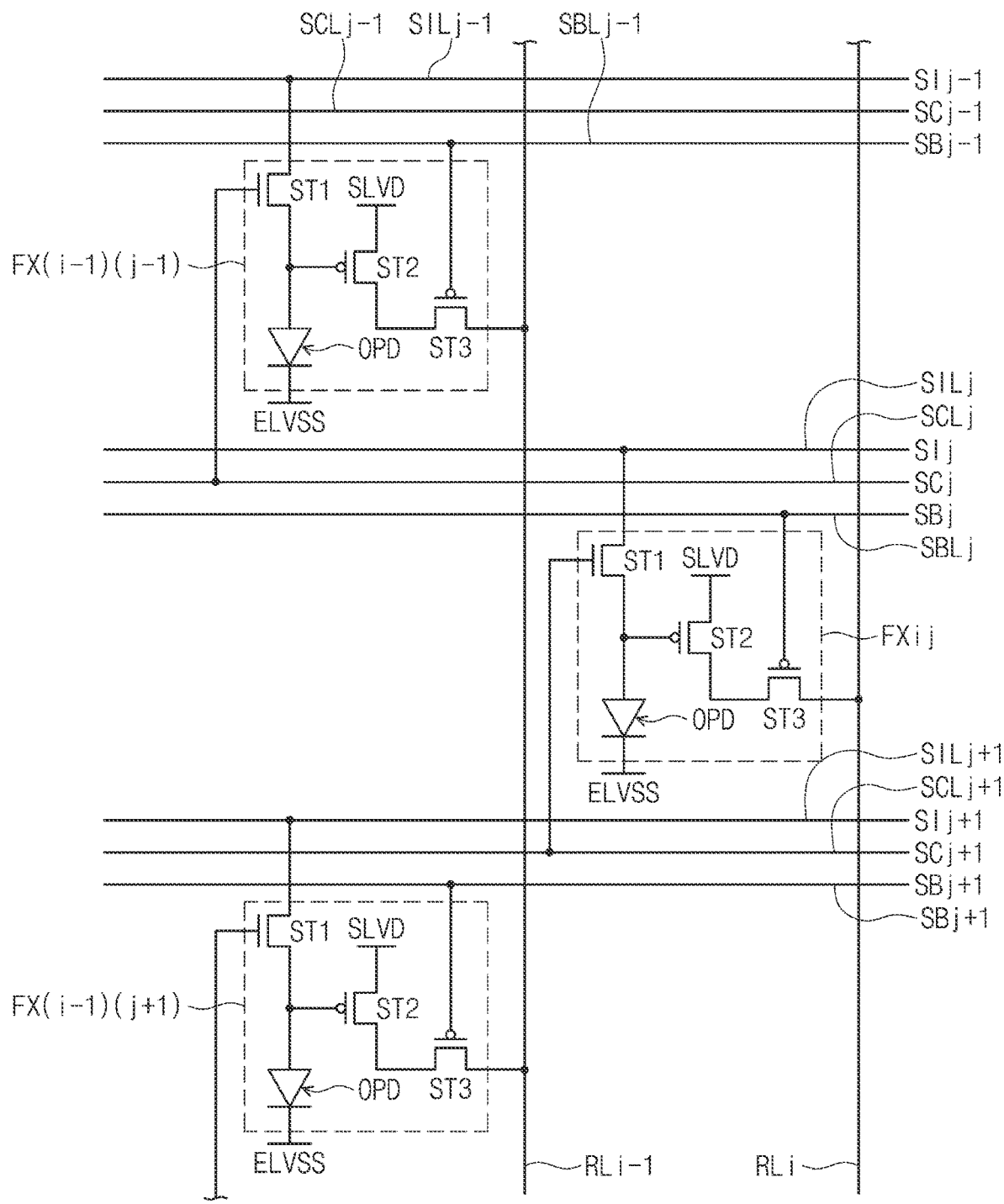
FIG. 18 is a circuit diagram of a connection relationship between a sensor and scan lines according to some embodiments of the present disclosure.
Figure 19:
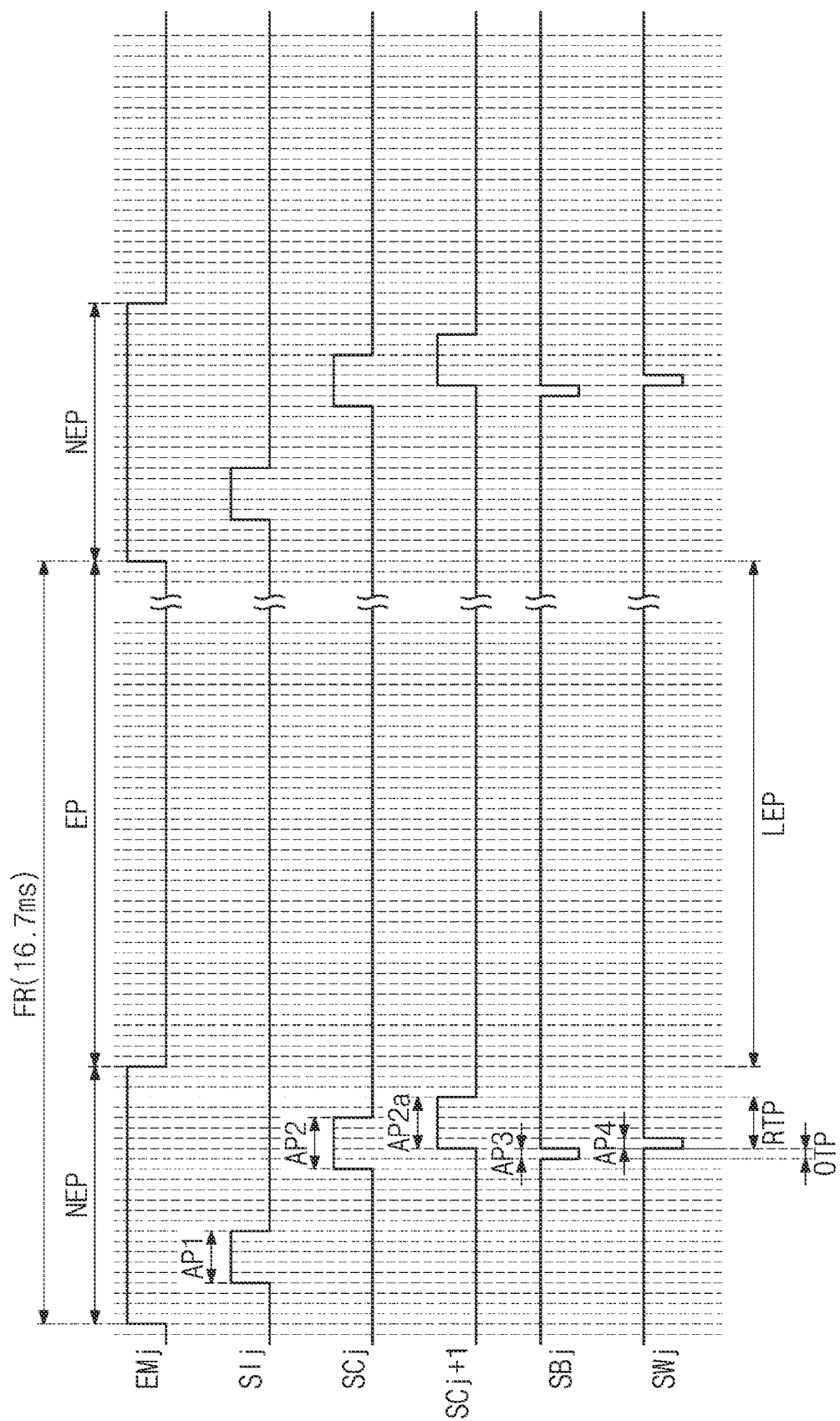
FIG. 19 is a waveform diagram for describing an operation of a sensor illustrated in FIG. 18.

FIG. 18 is a circuit diagram of a connection relationship between a sensor and scan lines according to some embodiments of the present disclosure, and FIG. 19 is a waveform diagram for describing an operation of a sensor illustrated in FIG. 18. Components, which are the same as the components illustrated in FIGS. 14 and 15, from among components illustrated in FIGS. 18 and 19 are marked by the same reference signs, and thus, additional description will be omitted to avoid redundancy.

Sensors located at different rows are illustrated in FIG. 18. For convenience of description, a sensor located at the (j−1)-th row is referred to as a "previous-row sensor FX(i−1)(j−1)", a sensor located at the j-th row is referred to as a "current-row sensor FXij", and a sensor located at the (j+1)-th row is referred to as a "next-row sensor FX(i−1)(j+1)".

In the current-row sensor FXij, the reset transistor ST1 is connected with the (j+1)-th compensation scan line SCLj+1, the j-th initialization scan line SILj, the j-th black scan line SBLj, and the i-th readout line RLi. In detail, the first electrode of the reset transistor ST1 of the current-row sensor FXij is connected with the j-th initialization scan line SILj, and the third electrode thereof is connected with the (j+1)-th compensation scan line SCLj+1. Accordingly, the reset transistor ST1 of the current-row sensor FXij receives the (j+1)-th compensation scan signal SCj+1 as the reset control signal and receives the j-th initialization scan signal SIj as the reset signal RST (refer to FIG. 5). The output transistor ST3 of the current-row sensor FXij is connected with the j-th black scan line SBLj. Accordingly, the output transistor ST3 receives the j-th black scan signal SBj as the output control signal.

As an example of the present disclosure, the previous-row and next-row sensors FX(i−1)(j−1) and FX(i−1)(j+1) are connected with the (i1)-th readout line RLi−1. Even in the previous-row and next-row sensors FX(i−1)(j−1) and FX(i−1)(j+1), the reset transistor ST1 is connected with the corresponding compensation scan line and the corresponding initialization scan line. In detail, the first electrode of the reset transistor ST1 of the previous-row sensor FX(i−1)(j−1) is connected with the (j−1)-th initialization scan line SILj−1, and the third electrode thereof is connected with the j-th compensation scan line SCLj. Accordingly, the reset transistor ST1 of the previous-row sensor FX(i−1)(j−1) receives the j-th compensation scan signal SCj as the reset control signal and receives the (j−1)-th initialization scan signal SIj-1 as the reset signal RST. The output transistor ST3 of the previous-row sensor FX(i−1)(j−1) is connected with the (j−1)-th black scan line SBLj−1 and receives the (j−1)-th black scan signal SBj−1 as the output control signal.

The first electrode of the reset transistor ST1 of the next-row sensor FX(i−1)(j+1) is connected with the (j+1)-th initialization scan line SILj+1, and the third electrode thereof is connected with the (j+2)-th compensation scan line. Accordingly, the reset transistor ST1 of the next-row sensor FX(i−1)(j+1) receives the (j+2)-th compensation scan signal SCj+2 as the reset control signal and receives the (j+1)-th initialization scan signal SIj+1 as the reset signal RST. The output transistor ST3 of the next-row sensor FX(i−1)(j+1) is connected with the (j+1)-th black scan line SBLj+1 and receives the (j+1)-th black scan signal SBj+1 as the output control signal.

One frame FR may include the output period OTP, the reset period RTP, and the light exposure period LEP that are distinguished depending on the operation of the sensor FXij. As an example of the present disclosure, the output period OTP and the reset period RTP may overlap the non-emission period NEP. The light exposure period LEP of the sensor FXij may correspond to the emission period EP. The light sensing element OPD is exposed to a light during the emission period EP. The light may be a light output from the light emitting element ED of the pixel PXij.

The j-th black scan signal SBj of the low level is supplied to the output transistor ST3 through the j-th black scan line SBLj during the output period OTP. The output period OTP may be defined as an active period AP3 (i.e., the low level period) of the j-th black scan signal SBj. When the output transistor ST3 is turned on in response to the j-th black scan signal SBj of the low level, the sensing signal FSi corresponding to a current flowing through the amplification transistor ST2 may be output to the i-th readout line RLi.

Next, when the (j+1)-th compensation scan signal SCj+1 of the high level is supplied through the (j+1)-th compensation scan line SCLj+1 during the reset period RTP, the reset transistor ST1 is turned on. The reset period RTP may be defined as an active period AP2a (i.e., the high level period) of the (j+1)-th compensation scan signal SCj+1. In this case, the j-th initialization scan signal SIj is provided to the first electrode of the reset transistor ST1. The active period AP1 of the j-th initialization scan signal SIj may not overlap the active period AP2a of the (j+1)-th compensation scan signal SCj+1. Accordingly, the j-th initialization scan signal SIj may have the low level during the active period AP2a of the (j+1)-th compensation scan signal SCj+1. As such, during the reset period RTP, the first sensing node SN1 may be reset to a potential corresponding to the low level of the j-th initialization scan signal SIj. As an example of the present disclosure, the low level of the j-th initialization scan signal SIj may have a voltage level lower than the second driving voltage ELVSS.

Then, during the emission period EP, the light sensing element OPD may generate photoelectrons corresponding to a received light, and the generated photoelectrons may be accumulated at the first sensing node SN1.

As described above, the j-th initialization scan signal SIj and the j-th black scan signal SBj for driving the pixel PXij and the (j+1)-th compensation scan signal SCj+1 for driving a next-row pixel may be used to drive the current-row sensor FXij. Accordingly, because a separate signal wire or circuit that is necessary to drive the sensors FXij, FX(i−1)(j−1), and FX(i−1)(j+1) is unnecessary, even though the sensors FXij, FX(i−1)(j−1), and FX(i−1)(j+1) are located in the display panel DP, the reduction in an aperture ratio may be minimized, reduced, or prevented.

Also, the reset transistor ST1 and the output transistor ST3 may be formed of an oxide semiconductor transistor. A leakage current of the oxide semiconductor transistor may be relatively small compared to the LTPS transistor. For example, a sensing noise due to a leakage current may decrease as the reset transistor ST1 periodically resetting the anode of the light sensing element OPD is formed of an oxide semiconductor transistor. As a result, sensing performance of the sensors FXij, FX(i−1)(j−1), and FX(i−1)(j+1) may be improved.

Also, the active period AP3 of the j-th black scan signal SBj may not overlap active periods of adjacent black scan signals SBj−1 and SBj+1. Accordingly, the output period OTP of the current-row sensor FXij may not overlap the output period OTP of the previous-row sensor FX(i−1)(j−1) or the output period OTP of the next-row sensor FX(i−1)(j+1). That is, a sensing signal associated with one sensor may be output from one readout line.

Figure 20:
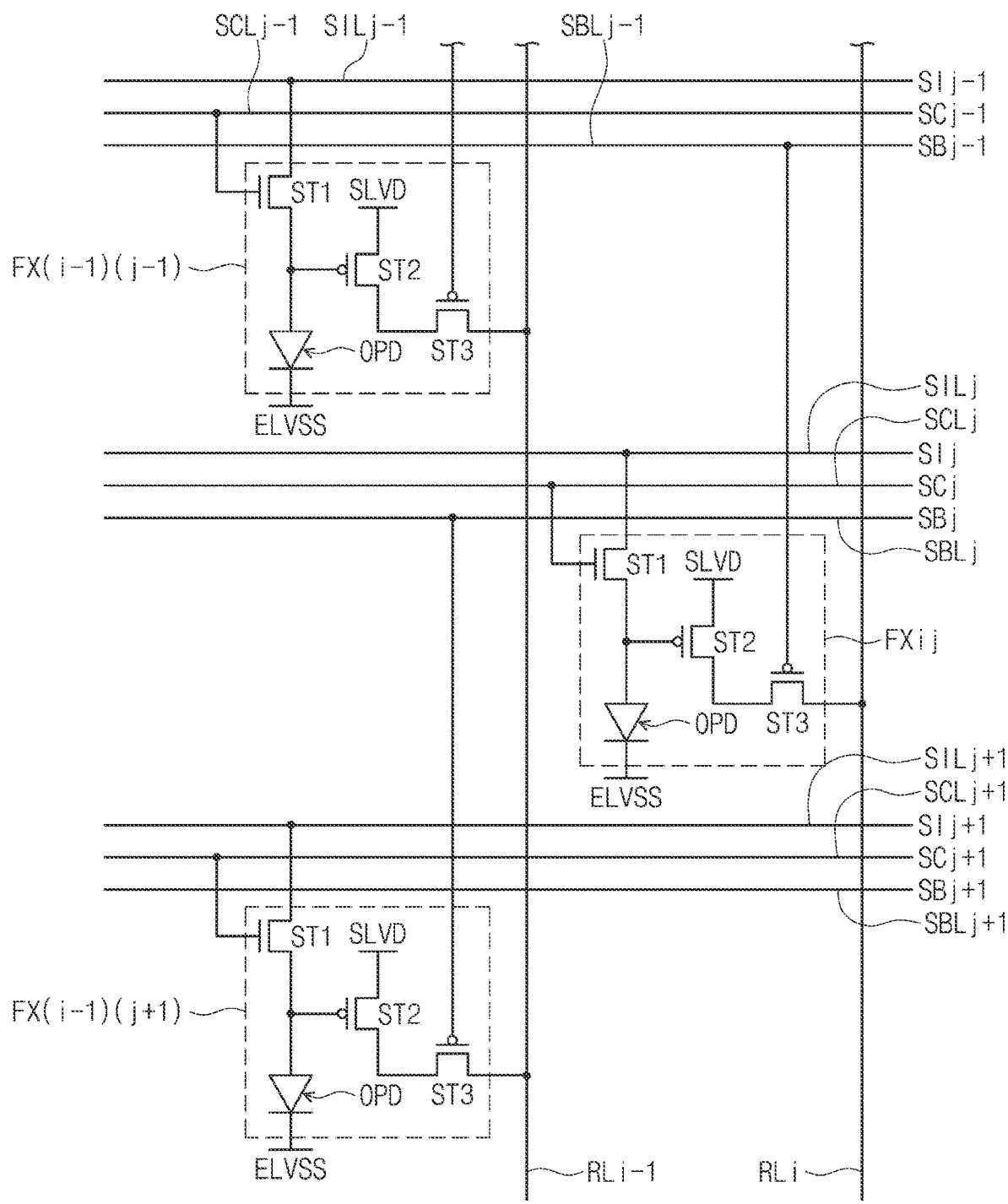
FIG. 20 is a circuit diagram of a connection relationship between a sensor and scan lines according to some embodiments of the present disclosure.
Figure 21:
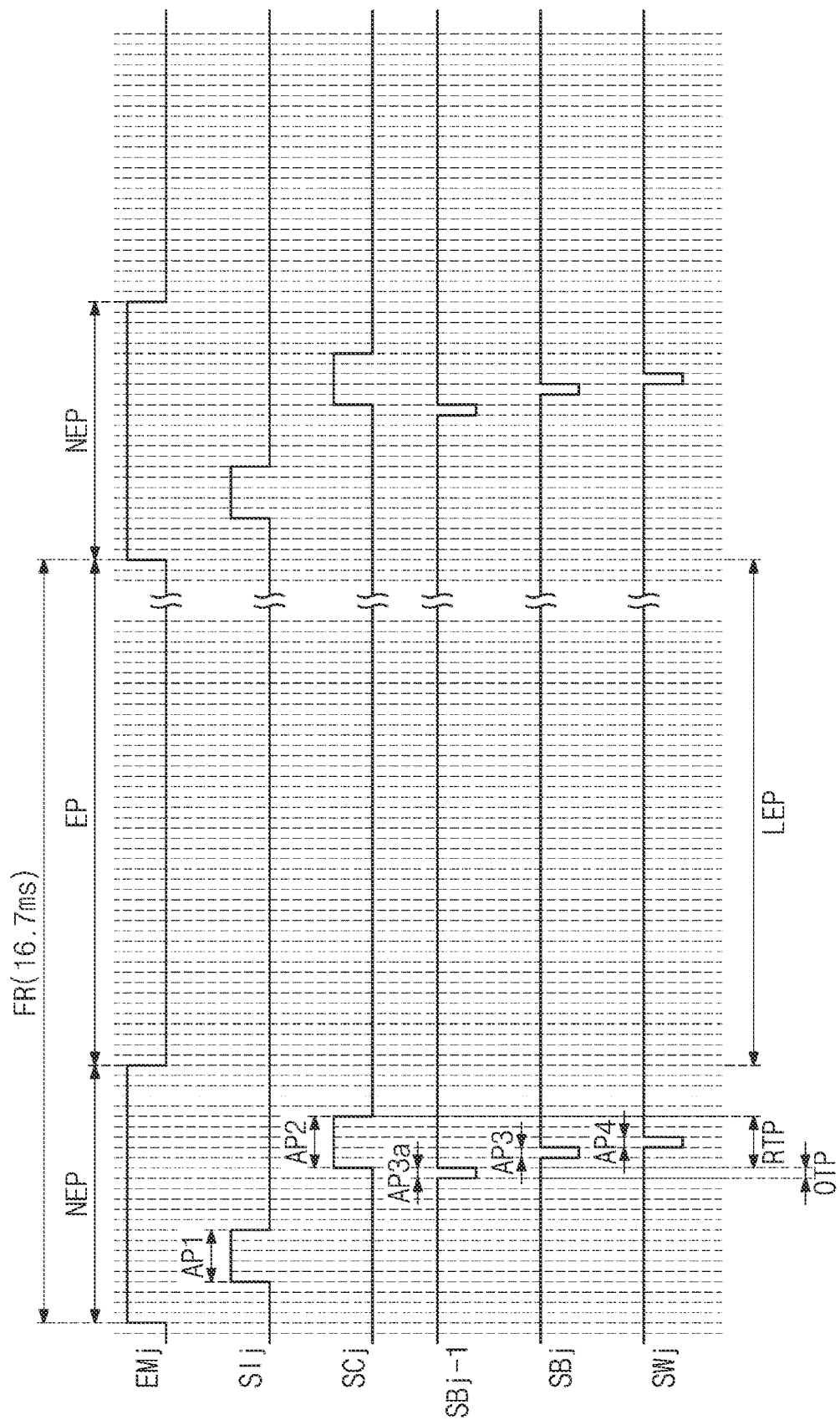
FIG. 21 is a waveform diagram for describing an operation of a sensor illustrated in FIG. 20.

FIG. 20 is a circuit diagram of a connection relationship between a sensor and scan lines according to some embodiments of the present disclosure, and FIG. 21 is a waveform diagram for describing an operation of a sensor illustrated in FIG. 20. Components, which are the same as the components illustrated in FIGS. 18 and 19, from among components illustrated in FIGS. 20 and 21 are marked by the same reference signs, and thus, additional description will be omitted to avoid redundancy.

Referring to FIG. 20, in the current-row sensor FXij, the reset transistor ST1 is connected with the j-th compensation scan line SCLj, the j-th initialization scan line SILj, the (j−1)-th black scan line SBLj−1, and the i-th readout line RLi. In detail, the first electrode of the reset transistor ST1 of the current-row sensor FXij is connected with the j-th initialization scan line SILj, and the third electrode thereof is connected with the j-th compensation scan line SCLj. Accordingly, the reset transistor ST1 of the current-row sensor FXij receives the j-th compensation scan signal SCj as the reset control signal and receives the j-th initialization scan signal SIj as the reset signal RST (refer to FIG. 5). The output transistor ST3 of the current-row sensor FXij is connected with the (j−1)-th black scan line SBLj−1. Accordingly, the output transistor ST3 receives the (j−1)-th black scan signal SBj−1 as the output control signal.

As an example of the present disclosure, the previous-row and next-row sensors FX(i−1)(j−1) and FX(i−1)(j+1) are connected with the (i−1)-th readout line RLi−1. Even in the previous-row and next-row sensors FX(i−1)(j−1) and FX(i−1)(j+1), the reset transistor ST1 is connected with the corresponding compensation scan line and the corresponding initialization scan line. In detail, the first electrode of the reset transistor ST1 of the previous-row sensor FX(i−1)(j−1) is connected with the (j−1)-th initialization scan line SILj−1, and the third electrode thereof is connected with the (j−1)-th compensation scan line SCLj−1. Accordingly, the reset transistor ST1 of the previous-row sensor FX(i−1)(j−1) receives the (j−1)-th compensation scan signal SCj−1 as the reset control signal and receives the (j−1)-th initialization scan signal SIj−1 as the reset signal RST. The output transistor ST3 of the previous-row sensor FX(i−1)(j−1) is connected with the (j−2)-th black scan line SBLj−2 and receives the (j−2)-th black scan signal SBj−2 as the output control signal.

The first electrode of the reset transistor ST1 of the next-row sensor FX(i−1)(j+1) is connected with the (j+1)-th initialization scan line SILj+1, and the third electrode thereof is connected with the (j+1)-th compensation scan line SCLj+1. Accordingly, the reset transistor ST1 of the next-row sensor FX(i−1)(j+1) receives the (j+1)-th compensation scan signal SCj+1 as the reset control signal and receives the (j+1)-th initialization scan signal SIj+1 as the reset signal RST. The output transistor ST3 of the next-row sensor FX(i−1)(j+1) is connected with the j-th black scan line SBLj and receives the j-th black scan signal SBj as the output control signal.

Referring to FIG. 21, one frame FR may include the output period OTP, the reset period RTP, and the light exposure period LEP that are distinguished depending on the operation of the sensor FXij. As an example of the present disclosure, the output period OTP and the reset period RTP may overlap the non-emission period NEP.

The (j−1)-th black scan signal SBj−1 of the low level is supplied to the output transistor ST3 through the (j−1)-th black scan line SBLj−1 during the output period OTP. The output period OTP may be defined as an active period AP3a (i.e., the low level period) of the (j−1)-th black scan signal SBj−1. When the output transistor ST3 is turned on in response to the (j−1)-th black scan signal SBj−1 of the low level, the sensing signal FSi corresponding to a current flowing through the amplification transistor ST2 may be output to the i-th readout line RLi.

Next, when the j-th compensation scan signal SCj of the high level is supplied through the j-th compensation scan line SCLj during the reset period RTP, the reset transistor ST1 is turned on. The reset period RTP may be defined as the active period AP2 (i.e., the high level period) of the j-th compensation scan signal SCj. In this case, the j-th initialization scan signal SIj is provided to the first electrode of the reset transistor ST1. The active period AP1 of the j-th initialization scan signal SIj may not overlap the active period AP2 of the j-th compensation scan signal SCj. Accordingly, the j-th initialization scan signal SIj may have the low level during the active period AP2 of the j-th compensation scan signal SCj. As such, during the reset period RTP, the first sensing node SN1 may be reset to a potential corresponding to the low level of the j-th initialization scan signal SIj. As an example of the present disclosure, the low level of the j-th initialization scan signal SIj may have a voltage level lower than the second driving voltage ELVSS.

Then, during the emission period EP, the light sensing element OPD may generate photoelectrons corresponding to a received light, and the generated photoelectrons may be accumulated at the first sensing node SN1.

As described above, the j-th initialization scan signal SIj and the j-th compensation scan signal SCJ for driving the pixel PXij and the (j−1)-th black scan signal SBj-1 for driving a previous-row pixel may be used to drive the current-row sensor FXij. Accordingly, because a separate signal wire or circuit that is necessary to drive the sensors FXij, FX(i−1)(j−1), and FX(i−1)(j+1) is unnecessary, even though the sensors FXij, FX(i−1)(j−1), and FX(i−1)(j+1) are located in the display panel DP, the reduction in an aperture ratio may be minimized, reduced, or prevented.

Figure 22:
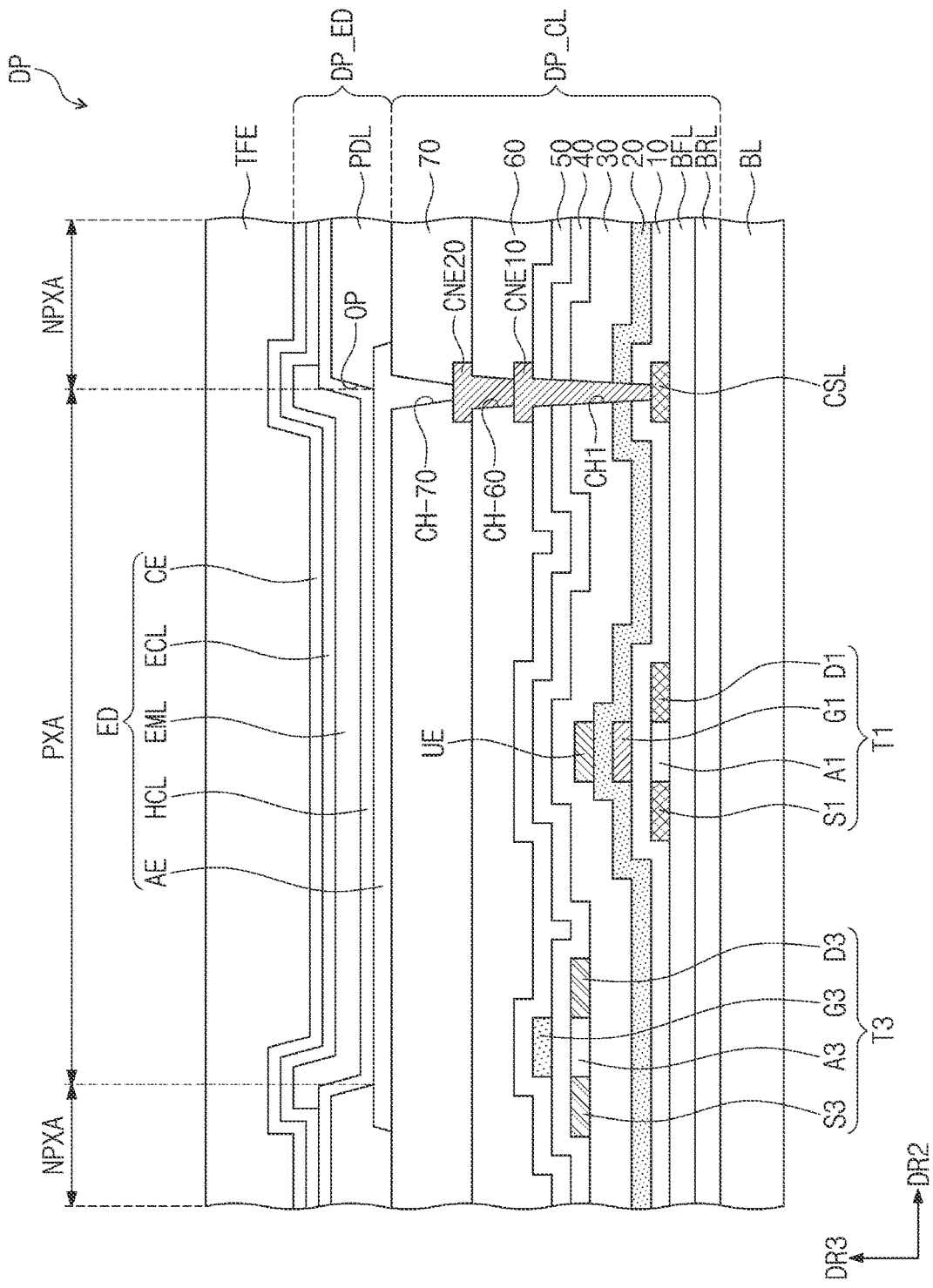
FIG. 22 is a cross-sectional view illustrating a pixel of a display panel according to some embodiments of the present disclosure.
Figure 23B:
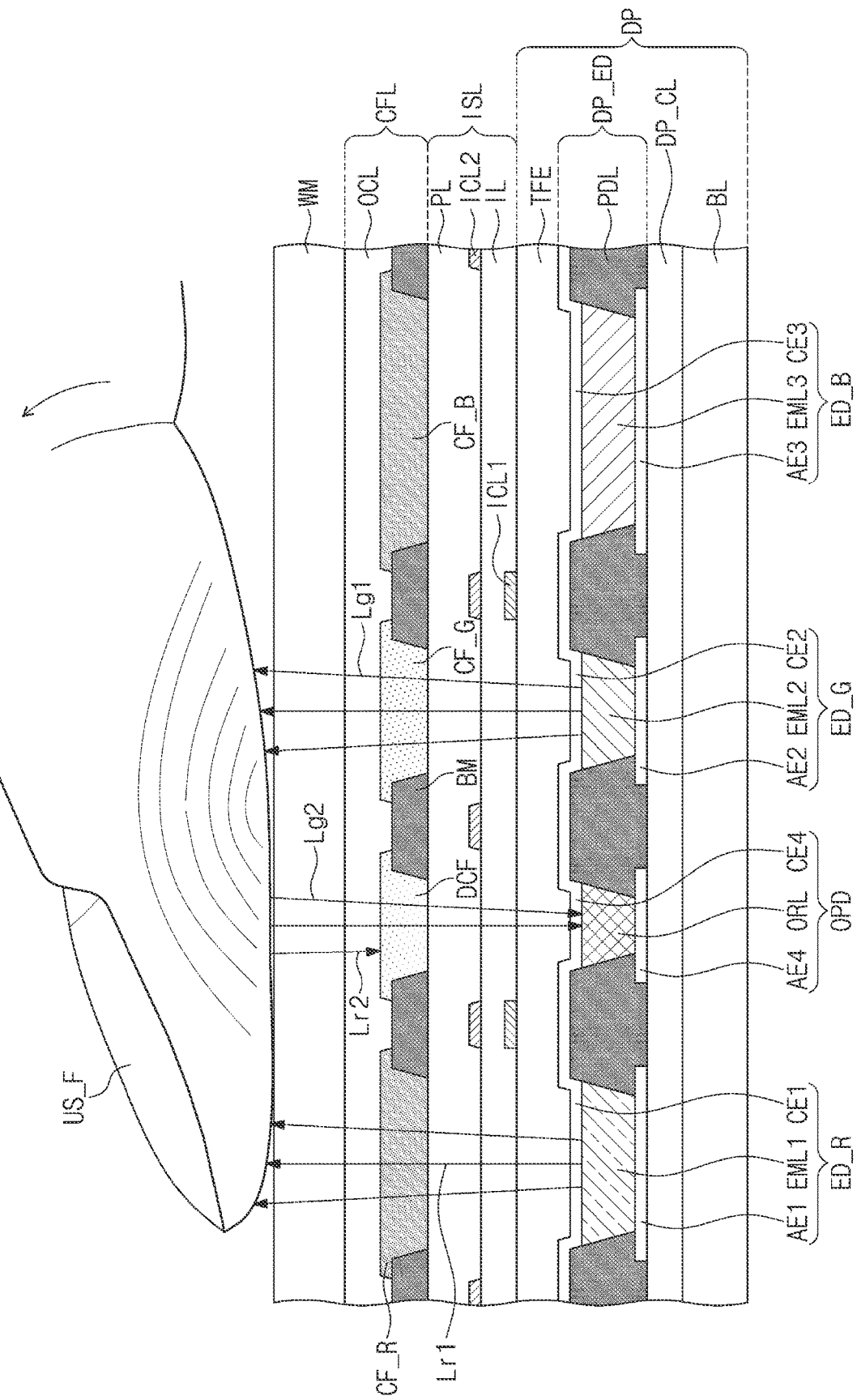

FIG. 22 is a cross-sectional view illustrating a pixel of a display panel according to some embodiments of the present disclosure, and FIGS. 23A and 23B are cross-sectional views illustrating a light emitting element and a light sensing element of a display panel according to some embodiments of the present disclosure.

Referring to FIGS. 22 and 23A, the display panel DP may include the base layer BL, the circuit layer DP_CL located on the base layer BL, the element layer DP_ED, and the encapsulation layer TFE.

The base layer BL may include a synthetic resin layer. The synthetic resin layer may include a thermosetting resin material. For example, the synthetic resin layer may be a polyimide-based resin layer, and the material thereof is not specifically limited. The synthetic resin layer may include at least one of acrylic resin, methacrylic resin, polyisoprene, vinyl resin, epoxy resin, urethane resin, cellulose resin, siloxane resin, polyamide resin, or perylene resin. In addition, the base layer BL may include a glass substrate, a metal substrate, an organic/inorganic composite substrate, or the like.

At least one inorganic layer is formed on an upper surface of the base layer BL. The inorganic layer may include at least one of aluminum oxide, titanium oxide, silicon oxide, silicon oxynitride, zirconium oxide, or hafnium oxide. The inorganic layer may be formed of multiple layers. The multiple inorganic layers may constitute a barrier layer BRL and/or a buffer layer BFL, which will be described in more detail later. The barrier layer BRL and the buffer layer BFL may be arranged selectively.

The barrier layer BRL prevents or reduces instances of foreign objects being introduced from the outside. The barrier layer BRL may include a silicon oxide layer, a silicon nitride layer, and the like, each of which includes a plurality of layers. The silicon oxide layers and the silicon nitride layers may be alternately stacked.

The buffer layer BFL may be located on the barrier layer BRL. The buffer layer BFL improves a bonding force between the base layer BL and a semiconductor pattern and/or a conductive pattern. The buffer layer BFL may include a silicon oxide layer and a silicon nitride layer. The silicon oxide layer and the silicon nitride layer may be alternately stacked.

A semiconductor pattern is located on the buffer layer BFL. Below, a semiconductor pattern directly located on the buffer layer BFL is defined as a first semiconductor pattern. The first semiconductor pattern may include a silicon semiconductor. The first semiconductor pattern may include polysilicon. However, embodiments according to the present disclosure are not limited thereto. For example, the first semiconductor pattern may include amorphous silicon.

FIG. 22 shows only a part of the first semiconductor pattern, and the first semiconductor pattern may be further located in another area of the pixel PXij (refer to FIG. 5). An electrical property of the first semiconductor pattern varies depending on whether it is doped or not. The first semiconductor pattern may include a doped area and an undoped area. The doped area may be doped with N-type dopant or P-type dopant. A P-type transistor includes a doped area doped with the P-type dopant, and an N-type transistor includes a doped area doped with the N-type dopant.

The doped area has higher conductivity than the undoped area, and operates substantially as an electrode or signal line. The undoped area corresponds substantially to the active (or channel) of a transistor. In other words, a portion of the first semiconductor pattern may be the active of the transistor, another portion thereof may be a source or drain of the transistor, and the other portion thereof may be a connection signal line (or connection electrode).

As illustrated in FIG. 22, a first electrode Si, a channel portion Al, and a second electrode D1 of the first transistor T1 are formed from the first semiconductor pattern. The first electrode S1 and the second electrode D1 of the first transistor T1 extend in opposite directions from the channel portion A1.

A portion of a connection signal line CSL formed from the semiconductor pattern is illustrated in FIG. 22. According to some embodiments, the connection signal line CSL may be electrically connected with a second electrode of the second emission control transistor ET2 (refer to FIG. 5) in a plan view.

A first insulating layer 10 is located on the buffer layer BFL. The first insulating layer 10 overlaps the plurality of pixels PX (refer to FIG. 3) in common and covers the first semiconductor pattern. The first insulating layer 10 may be an inorganic layer and/or an organic layer, and may have a single layer structure or a multi-layer structure. The first insulating layer 10 may include at least one of an aluminum oxide, a titanium oxide, a silicon oxide, a silicon oxynitride, a zirconium oxide, or a hafnium oxide. According to some embodiments, the first insulating layer 10 may be a silicon oxide layer having a single layer structure. An insulating layer of the circuit layer DP_CL to be described later as well as the first insulating layer 10 may be an inorganic layer and/or an organic layer, and may have a single layer structure or a multi-layer structure. The inorganic layer may include at least one of the materials described above.

A third electrode G1 of the first transistor T1 is located on the first insulating layer 10. The third electrode G1 may be a portion of a metal pattern. The third electrode G1 of the first transistor T1 overlaps the channel portion Al of the first transistor T1. In the process of doping the first semiconductor pattern, the third electrode G1 of the first transistor T1 may serve as a mask.

A second insulating layer 20 covering the third electrode G1 is located on the first insulating layer 10. The second insulating layer 20 overlaps the plurality of pixels PX in common. The second insulating layer 20 may be an inorganic layer and/or an organic layer, and may have a single layer structure or a multi-layer structure. According to some embodiments, the second insulating layer 20 may be a silicon oxide layer having a single layer structure.

An upper electrode UE may be located on the second insulating layer 20. The upper electrode UE may overlap the third electrode Gl. The upper electrode UE may be a portion of a metal pattern or a portion of a doped semiconductor pattern. A portion of the third electrode G1 and the upper electrode UE overlapping the portion of the third electrode G1 may define the capacitor Cst (refer to FIG. 5). According to some embodiments of the present disclosure, the upper electrode UE may be omitted.

According to some embodiments of the present disclosure, the second insulating layer 20 may be replaced with an insulating pattern. The upper electrode UE is located on the insulating pattern. The upper electrode UE may serve as a mask for forming an insulating pattern from the second insulating layer 20.

A third insulating layer 30 covering the upper electrode UE is located on the second insulating layer 20. According to some embodiments, the third insulating layer 30 may be a silicon oxide layer having a single layer structure. A semiconductor pattern is located on the third insulating layer 30. Below, the semiconductor pattern directly located on the third insulating layer 30 is defined as a second semiconductor pattern. The second semiconductor pattern may include a metal oxide. The oxide semiconductor may include a crystalline or amorphous oxide semiconductor. For example, the oxide semiconductor may include metal oxide of zinc (Zn), indium (In), gallium (Ga), tin (Sn), titanium (Ti), and the like, or a mixture of metal, such as zinc (Zn), indium (In), gallium (Ga), tin (Sn), or titanium (Ti), and oxide thereof. The oxide semiconductors may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), and the like.

FIG. 22 shows only a part of the second semiconductor pattern, and the second semiconductor pattern may be further located in another area of the pixel PXij (refer to FIG. 5). The second semiconductor pattern may include a plurality of areas that are distinguished depending on whether the metal oxide is reduced. An area (hereinafter referred to as a "reduction area") in which the metal oxide is reduced has higher conductivity than an area (hereinafter referred to as a "non-reduction area") in which the metal oxide is not reduced. The reduction area substantially has the role of an electrode or signal line. The non-reduction area corresponds substantially to a channel portion of a transistor. In other words, the portion of the second semiconductor pattern may be a channel portion of a transistor, and another portion thereof may be a first electrode or a second electrode of the transistor.

As illustrated in FIG. 22, a first electrode S3, a channel portion A3, and a second electrode D3 of the third transistor T3 are formed from the second semiconductor pattern. The first electrode S3 and the second electrode D3 include a metal reduced from a metal oxide semiconductor. The first electrode S3 and the second electrode D3 may have a given thickness from an upper surface of the second semiconductor pattern and may include a metal layer including the reduced metal.

A fourth insulating layer 40 covering the second semiconductor pattern is located on the third insulating layer 30. According to some embodiments, the fourth insulating layer 40 may be a silicon oxide layer having a single layer structure. A third electrode G3 of the third transistor T3 is located on the third insulating layer 30. The third electrode G3 may be a portion of a metal pattern. The third electrode G3 of the third transistor T3 overlaps the channel portion A3 of the third transistor T3.

According to some embodiments of the present disclosure, the fourth insulating layer 40 may be replaced with an insulating pattern. The third electrode G3 of the third transistor T3 is located on the insulating pattern. According to some embodiments, the third electrode G3 may have the same shape as the insulating pattern in a plan view. According to some embodiments, for convenience of description, one third electrode G3 is illustrated, but the third transistor T3 may include two third electrodes.

A fifth insulating layer 50 covering the third electrode G3 is located on the fourth insulating layer 40. According to some embodiments, the fifth insulating layer 50 may include a silicon oxide layer and a silicon nitride layer. The fifth insulating layer 50 may include a plurality of silicon oxide layers and a plurality of silicon nitride layers, which are alternately stacked.

According to some embodiments, the first electrode and the second electrode of the fourth transistor T4 (refer to FIG. 5) may be formed through the same process as the first electrode S3 and the second electrode D3 of the third transistor T3. Also, in the sensor FXij (refer to FIG. 5), the first and second electrodes of the reset transistor ST1 (refer to FIG. 5) and the first and second electrodes of the output transistor ST3 (refer to FIG. 5) may be formed through the same process as the first electrode S3 and the second electrode D3 of the third transistor T3.

At least one insulating layer is further located on the fifth insulating layer 50. According to some embodiments, a sixth insulating layer 60 and a seventh insulating layer 70 may be located on the fifth insulating layer 50. The sixth insulating layer 60 and the seventh insulating layer 70 may be organic layers and may have a single layer structure or a multi-layer structure. Each of the sixth insulating layer 60 and the seventh insulating layer 70 may be a polyimide-based resin layer having a single layer structure. However, embodiments according to the present disclosure are not limited thereto. For example, the sixth insulating layer 60 and the seventh insulating layer 70 may include at least one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin.

A first connection electrode CNE10 may be located on the fifth insulating layer 50. The first connection electrode CNE10 may be connected with the connection signal line CSL through a first contact hole CH1 penetrating the first to fifth insulating layers 10 to 50, and a second connection electrode CNE20 may be connected with the first connection electrode CNE10 through a contact hole CH-60 penetrating the sixth insulating layer 60. According to some embodiments of the present disclosure, at least one of the fifth insulating layer 50 to the seventh insulating layer 70 may be omitted.

The element layer DP_ED includes the light emitting element ED and a pixel defining layer PDL. An anode AE of the light emitting element ED is located on the seventh insulating layer 70. The anode AE of the light emitting element ED may be connected with the second connection electrode CNE20 through a contact hole CH-70 penetrating the seventh insulating layer 70.

An opening OP of the pixel defining layer PDL exposes at least a portion of the anode AE of the light emitting element ED. The opening OP of the pixel defining layer PDL may define an emission area PXA. For example, the plurality of pixels PX (refer to FIG. 3) may be arranged on a plane of the display panel DP (refer to FIG. 3) depending on a specific rule. An area in which the plurality of pixels PX are arranged may be defined as a pixel area, and one pixel area may include the emission area PXA and a non-emission area NPXA adjacent to the emission area PXA. The non-emission area NPXA may surround the emission area PXA.

A hole control layer HCL may be located in common in the emission area PXA and the non-emission area NPXA. A common layer such as the hole control layer HCL may be formed in common in the plurality of pixels PX. The hole control layer HCL may include a hole transport layer and a hole injection layer.

An emission layer EML is located on the hole control layer HCL. The emission layer EML may be located only in an area corresponding to the opening OP.

The emission layer EML may be formed for each of the plurality of pixels PX.

According to some embodiments, the patterned emission layer EML is illustrated, but the emission layer EML may be located in the plurality of pixels PX in common. In this case, the emission layer EML may generate a white light or a blue light. Also, the emission layer EML may have a multi-layer structure.

An electron control layer ECL is located on the emission layer EML. The electron control layer ECL may include an electron transport layer and an electron injection layer. A cathode CE of the light emitting element ED is located on the electron control layer ECL. The electron control layer ECL and the cathode CE are located in common in the plurality of pixels PX.

The encapsulation layer TFE is located on the cathode CE. The encapsulation layer TFE may cover the plurality of pixels PX. According to some embodiments, the encapsulation layer TFE directly covers the cathode CE. According to some embodiments of the present disclosure, the display panel DP may further include a capping layer directly covering the cathode CE. According to some embodiments of the present disclosure, the stacked structure of the light emitting element ED may have a vertically inverted structure in the structure shown in FIG. 22.

Referring to FIGS. 23A and 23B, a first electrode layer is located on the circuit layer DP_CL. The pixel defining layer PDL is formed on the first electrode layer. The first electrode layer may include first to third anodes AE1, AE2, and AE3. First to third openings OP1, OP2, and OP3 of the pixel defining layer PDL expose at least portions of the first to third anodes AE1, AE2, and AE3, respectively. According to some embodiments of the present disclosure, the pixel defining layer PDL may further include a black material. The pixel defining layer PDL may further include a black organic dye/pigment such as carbon black or aniline black. The pixel defining layer PDL may be formed by mixing a blue organic material and a black organic material. The pixel defining layer PDL may further include a liquid-repellent organic material.

As illustrated in FIG. 23A, the display panel DP may include first to third emission areas PXA-R, PXA-G, and PXA-B and first to third non-emission areas NPXA-R, NPXA-B, and NPXA-B adjacent to the first to third emission areas PXA-R, PXA-G, and PXA-B. The non-emission areas NPXA-R, NPXA-G, and NPXA-B may surround corresponding emission areas PXA-R, PXA-G, and PXA-B, respectively. According to some embodiments, the first emission area PXA-R is defined to correspond to a partial area of the first anode AE1 exposed by the first opening OP1. The second emission area PXA-G is defined to correspond to a partial area of the second anode AE2 exposed by the second opening OP2. The third emission area PXA-B is defined to correspond to a partial area of the third anode AE3 exposed by the third opening OP3. Non-pixel areas NPA may be defined between the first to third non-emission areas NPXA-R, NPXA-G, and NPXA-B.

An emission layer may be located on a first electrode layer. The emission layer may include first to third emission layers EML1 to EML3. The first to third emission layers EML1 to EML3 may be located in areas respectively corresponding to the first to third openings OP1, OP2, and OP3. The first to third emission layers EML1 to EML3 may be separately formed in first to third pixels PXR, PXG, and PXB (refer to FIGS. 4A). Each of the first to third emission layers EML1 to EML3 may include an organic material and/or an inorganic material. The first to third emission layers EML1 to EML3 may generate a light of a given color. For example, the first emission layer EML1 may generate a red light, the second emission layer EML2 may generate a green light, and, the third emission layer EML3 may generate a blue light.

According to some embodiments, an example in which the first to third emission layers EML1 to EML3 are patterned is illustrated, but one emission layer may be located in first to third emission areas PXA-R, PXA-G, and PXA-B in common. In this case, the emission layer may generate a white light or a blue light. Also, the emission layer may have a multi-layered structure that is referred to as "tandem".

Each of the first to third emission layers EML1 to EML3 may include a low molecular weight organic material or a high molecular weight organic material as a light emitting material. Alternatively, each of the first to third emission layers EML1 to EML3 may include a quantum dot material as a light emitting material. The core of a quantum dot may be selected from a group II-VI compound, a group III-V compound, a group IV-VI compound, a group IV element, a group IV compound, and a combination thereof.

A second electrode layer is located on the emission layer. The second electrode layer may include first to third cathodes CE1, CE2, and CE3. The first to third cathodes CE1, CE2, and CE3 may be electrically connected. As an example of the present disclosure, the first to third cathodes CE1, CE2, and CE3 may be integrally formed. In this case, the first to third cathodes CE1, CE2, and CE3 may be located in common in the first to third emission areas PXA-R, PXA-G, and PXA-B, the first to third non-emission areas NPXA-R, NPXA-G, and NPXA- B, and the non-pixel area NPA.

The element layer DP_ED may further include sensors OPD. Each of the sensors OPD may be a photodiode. The pixel defining layer PDL may further include a fourth opening OP4 that is provided to correspond to each sensor OPD.

Each of the sensors OPD may include a fourth anode AE4, a photoelectric conversion layer ORL, and a fourth cathode CE4. The fourth anode AE4 may be located on the same layer as the first electrode layer. That is, the fourth anode AE4 may be located on the circuit layer DP_CL and may be simultaneously formed through the same process as the first to third anodes AE1 to AE3.

The fourth opening OP4 of the pixel defining layer PDL exposes at least a portion of the fourth anode AE4. The photoelectric conversion layer ORL is located on the fourth anode AE4 exposed by the fourth opening OP4. The photoelectric conversion layer ORL may include an organic photo-sensing material. The fourth cathode CE4 may be located on the photoelectric conversion layer ORL. The fourth cathode CE4 and the first to third cathodes CE1 to CE3 may be simultaneously formed through the process of forming the first to third cathodes CE1 to CE3. As an example of the present disclosure, the fourth cathode CE4 may be integrally formed with the first to third cathodes CE1 to CE3.

Each of the fourth anode AE4 and the fourth cathode CE4 may receive an electrical signal. The fourth cathode CE4 and the fourth anode AE4 may receive different signals. Accordingly, a given electric field may be formed between the fourth anode AE4 and the fourth cathode CE4. The photoelectric conversion layer ORL generates an electrical signal corresponding to the light incident onto a sensor. The photoelectric conversion layer ORL may generate charges by absorbing the energy of the incident light. For example, the photoelectric conversion layer ORL may include a light-sensitive semiconductor material.

The charges generated by the photoelectric conversion layer ORL changes the electric field between the fourth anode AE4 and the fourth cathode CE4. The amount of charges generated by the photoelectric conversion layer ORL may vary depending on whether a light is incident onto the sensors OPD, the amount of light incident onto the sensors OPD, or the intensity of light incident onto the sensors OPD. As such, the electric field formed between the fourth anode AE4 and the fourth cathode CE4 may vary. The sensors OPD according to some embodiments of the present disclosure may obtain fingerprint information of the user through a change in the electric field between the fourth anode AE4 and the fourth cathode CE4.

However, this is illustrated by way of an example. Each of the sensors OPD may include a phototransistor that includes the photoelectric conversion layer ORL as an active layer. In this case, each of the sensors OPD may obtain fingerprint information by sensing the amount of current flowing through the phototransistor. Each of the sensors OPD according to some embodiments of the present disclosure may include various photoelectric conversion elements capable of generating electrical signals in response to a change in the amount of light, but embodiments according to the present disclosure are not limited to any one embodiment.

The encapsulation layer TFE is located on the element layer DP_ED. The encapsulation layer TFE includes at least one inorganic layer or at least one organic layer. According to some embodiments of the present disclosure, the encapsulation layer TFE may include two inorganic layers and an organic layer interposed therebetween. According to some embodiments of the present disclosure, a thin-film encapsulation layer may include a plurality of inorganic layers and a plurality of organic layers, which are alternately stacked.

The encapsulation inorganic layer protects the first to third light emitting elements ED_R, ED_G, and ED_B and the light sensing element OPD from moisture/oxygen, and the encapsulation organic layer protects the first to third light emitting elements ED_R, ED_G, and ED_B and the light sensing element OPD from foreign substances. The encapsulation inorganic layer may include a silicon nitride layer, a silicon oxynitride layer, a silicon oxide layer, a titanium oxide layer, an aluminum oxide layer, or the like, but is not limited particularly thereto. The encapsulation organic layer may include an acryl-based organic layer, and is not particularly limited.

The display device DD includes the input sensing layer ISL located on the display panel DP and the color filter layer CFL located on the input sensing layer ISL.

The input sensing layer ISL may be directly located on the encapsulation layer TFE. The input sensing layer ISL includes a first conductive layer ICL1, an insulating layer IL, a second conductive layer ICL2, and a protective layer PL.

The first conductive layer ICL1 may be located on the encapsulation layer TFE. FIGS. 23A and 23B show a structure in which the first conductive layer ICL1 is directly located on the encapsulation layer TFE, but embodiments according to the present disclosure are not limited thereto. The input sensing layer ISL may further include a base insulating layer interposed between the first conductive layer ICL1 and the encapsulation layer TFE. In this case, the encapsulation layer TFE may be covered by the base insulating layer, and the first conductive layer ICL1 may be located on the base insulating layer. As an example of the present disclosure, the base insulating layer may include an inorganic insulating material.

The insulating layer IL may cover the first conductive layer ICL1. The second conductive layer ICL2 is located on the insulating layer IL. A structure in which the input sensing layer ISL includes the first and second conductive layers ICL1 and ICL2 is illustrated, but embodiments according to the present disclosure are not limited thereto. For example, the input sensing layer ISL may include only one of the first and second conductive layers ICL1 and ICL2.

The protective layer PL may be located on the second conductive layer ICL2. The protective layer PL may include an organic insulating material. The protective layer PL may protect the first and second conductive layers ICL1 and ICL2 from moisture/oxygen, and may protect the first and second conductive layers ICL1 and ICL2 from foreign objects.

The color filter layer CFL may be located on the input sensing layer ISL. The color filter layer CFL may be directly located on the protective layer PL. The color filter layer CFL may include a first color filter CF_R, a second color filter CF_G, and a third color filter CF_B. The first color filter CF_R has a first color, the second color filter CF_G has a second color, and the third color filter CF_B has a third color. As an example of the present disclosure, the first color may be red, the second color may be green, and the third color may be blue.

The color filter layer CFL may further include a dummy color filter DCF. As an example of the present disclosure, when an area where the photoelectric conversion layer ORL is located is defined as a sensing area SA and a periphery of the sensing area SA is defined as a non-sensing area NSA, the dummy color filter DCF may be arranged to correspond to the sensing area SA. The dummy color filter DCF may overlap the sensing area SA and the non-sensing area NSA. As an example of the present disclosure, the dummy color filter DCF may have the same color as one of the first to third color filters CF_R, CF_G, and CF_B. As an example of the present disclosure, the dummy color filter DCF may have the same green color as the second color filter CF_G.

The color filter layer CFL may further include a black matrix BM. The black matrix BM may be arranged to correspond to the non-pixel area NPA. The black matrix BM may be arranged to overlap the first and second conductive layers ICL1 and ICL2 in the non-pixel area NPA. As an example of the present disclosure, the black matrix BM may overlap the non-pixel area NPA and the first to third non-emission areas NPXA-R, NPXA-G, and NPXA-B. The black matrix BM may not overlap the first to third emission areas PXA-R, PXR-G, and PXA-B.

The color filter layer CFL may further include an overcoat layer OCL. The overcoat layer OCL may include an organic insulating material. The overcoat layer OCL may be provided with a thickness sufficient to remove a step between the first to third color filters CF_R, CF_G, and CF_B. A material of the overcoat layer OCL may not be particularly limited as long as the material is capable of planarizing an upper surface of the color filter layer CFL with a given thickness and may include, for example, an acrylate-based organic material.

Referring to FIG. 23B, when the display device DD (refer to FIG. 1) operates, each of first to third light emitting elements ED_R to ED_B may output a light. The first light emitting elements ED_R outputs a first light, the second light emitting elements ED_G outputs a second light, and the third light emitting elements ED_B outputs a third light. Herein, a first light Lr1 may be a light in a red wavelength band, a second light Lg1 may be a light in a green wavelength band, and the third light may be a light in a blue wavelength band.

As an example of the present disclosure, each of the sensors OPD may receive lights from specific light emitting elements (e.g., second light emitting elements ED_G) among first to third light emitting elements ED_R, ED_G, and ED_B. That is, each of the sensors OPD may receive a second reflected light Lg2 reflected by a user's fingerprint after the second light Lg1 is output from the second light emitting elements ED_G. The second light Lg1 and the second reflected light Lg2 may be lights in a green wavelength band. The dummy color filter DCF is located under the sensors OPD. The dummy color filter DCF may have a green color. Accordingly, the second reflected light Lg2 may pass through the dummy color filter DCF and may be incident onto the sensors OPD.

Meanwhile, the first and third lights output from the first and third light emitting elements ED_R and ED_B may also be reflected by the user's hand US_F.

For example, when a light reflected by the user's hand US_F after the first light Lr1 is output from the first light emitting element ED_R is defined as a first reflected light Lr2, the first reflected light Lr2 may be absorbed without passing through the dummy color filter DCF. That is, because the first reflected light Lr2 fails to pass through the dummy color filter DCF, the first reflected light Lr2 may not be incident onto the sensors OPD. Likewise, even though the third light is reflected by the user's hand US_F, the third light may be absorbed by the dummy color filter DCF. Accordingly, only the second reflected light Lg2 may be provided to the sensors OPD.

According to some embodiments of the present disclosure, a display panel includes a pixel and a sensor, and the sensor includes a light sensing element and a sensor driving circuit. The sensor driving circuit includes a reset transistor that is used to reset an anode of the light sensing element, and the reset transistor is formed of an oxide semiconductor transistor. Accordingly, a leakage current coming from the driving of the sensor may decrease, and thus, sensing performance of the sensor may be relatively improved.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:
a plurality of pixels each including a light emitting element and a pixel driving circuit connected with the light emitting element and configured to drive the light emitting element; and
a plurality of sensors each including a light sensing element and a sensor driving circuit connected with the light sensing element and configured to output a sensing signal corresponding to a light,
wherein the sensor driving circuit includes:
a reset transistor including a first electrode configured to receive a reset signal, a second electrode connected with a first sensing node, and a third electrode configured to receive a reset control signal;
an amplification transistor including a first electrode configured to receive a sensing driving voltage, a second electrode connected with a second sensing node, and a third electrode connected with the first sensing node; and
an output transistor including a first electrode connected with the second sensing node, a second electrode connected with a sensing line, and a third electrode configured to receive an output control signal,
wherein the reset transistor is an oxide semiconductor transistor.

2. The display device of claim 1, wherein the pixel driving circuit includes:
a first transistor connected between a first driving voltage line configured to receive a first driving voltage and the light emitting element;
a second transistor connected between a data line and a first electrode of the first transistor; and
a third transistor connected between a second electrode of the first transistor and a first node, and
wherein the third transistor is an oxide semiconductor transistor.

3. The display device of claim 2, wherein the third transistor is configured to receive a first scan signal, and
wherein the reset transistor is configured to receive the first scan signal as the reset control signal.

4. The display device of claim 3, wherein the pixel driving circuit further includes:
a fourth transistor connected between an initialization line to which an initialization voltage is applied and the first node and configured to receive a second scan signal, and
wherein the fourth transistor is an oxide semiconductor transistor.

5. The display device of claim 4, wherein the output transistor is configured to receive the second scan signal as the output control signal.

6. The display device of claim 4, wherein the output transistor is an oxide semiconductor transistor.

7. The display device of claim 4, wherein the amplification transistor is configured to receive the first driving voltage or the initialization voltage as the sensing driving voltage.

8. The display device of claim 4, wherein the pixel driving circuit further includes:
a first emission control transistor connected between the first driving voltage line and the first electrode of the first transistor; and
a second emission control transistor connected between the second electrode of the first transistor and an anode of the light emitting element.

9. The display device of claim 8, wherein each of the first and second emission control transistors is configured to receive an emission control signal, and
wherein an active period of the emission control signal does not overlap an active period of each of the first and second scan signals.

10. The display device of claim 9, wherein the output transistor is configured to receive the emission control signal as the output control signal.

11. The display device of claim 10, wherein each of the output transistor and the first and second emission control transistors a low-temperature polycrystalline silicon transistor.

12. The display device of claim 4, wherein the reset transistor is configured to receive the second scan signal as the reset signal.

13. The display device of claim 12, wherein an active period of the second scan signal does not overlap an active period of the first scan signal.

14. The display device of claim 4, further comprising:
a plurality of initialization scan lines connected with the plurality of pixels, respectively; and
a plurality of compensation scan lines connected with the plurality of pixels, respectively, and
wherein each of the pixels is configured to receive the first scan signal from a corresponding compensation scan line of the plurality of compensation scan lines and to receive the second scan signal from a corresponding initialization scan line of the plurality of initialization scan lines.

15. The display device of claim 14, wherein the reset transistor is configured to receive, as the reset signal, an adjacent second scan signal output from an adjacent initialization scan line adjacent to the corresponding initialization scan line.

16. The display device of claim 15, wherein an active period of the adjacent second scan signal does not overlap an active period of the first scan signal.

17. The display device of claim 1, wherein the pixel driving circuit includes:
a first transistor connected between a first driving voltage line configured to receive a first driving voltage and the light emitting element;
a second transistor connected between a data line and a first electrode of the first transistor;
a third transistor connected between a second electrode of the first transistor and a first node and configured to receive a first scan signal;
a fourth transistor connected between a first initialization line to which a first initialization voltage is applied and the first node and configured to receive a second scan signal; and
a fifth transistor connected between a second initialization line to which a second initialization voltage is applied and an anode of the light emitting element and configured to receive a third scan signal.

18. The display device of claim 17, further comprising:
a plurality of initialization scan lines connected with the plurality of pixels, respectively;
a plurality of compensation scan lines connected with the plurality of pixels, respectively; and
a plurality of black scan lines connected with the plurality of pixels, respectively,
wherein each of the pixels is configured to receive the first scan signal from a corresponding compensation scan line of the plurality of compensation scan lines, to receive the second scan signal from a corresponding initialization scan line of the plurality of initialization scan lines, and to receive the third scan signal from a corresponding black scan line of the plurality of black scan lines.

19. The display device of claim 18, wherein the reset transistor is configured to receive, as the reset control signal, a next first scan signal supplied from a next compensation scan line of the corresponding compensation scan line.

20. The display device of claim 19, wherein the output transistor is configured to receive the third scan signal supplied from the corresponding black scan line as the output control signal, and
wherein an active period of the third scan signal does not overlap an active period of the next first scan signal.

21. The display device of claim 18, wherein the reset transistor is configured to receive, as the reset control signal, the first scan signal supplied from the corresponding compensation scan line.

22. The display device of claim 21, wherein the output transistor is configured to receive, as the output control signal, a previous third scan signal supplied from a previous black scan line of the corresponding black scan line, and
wherein an active period of the first scan signal does not overlap an active period of the previous third scan signal.

23. The display device of claim 18, wherein the reset transistor is configured to receive, as the reset signal, an adjacent second scan signal supplied from an adjacent initialization scan line adjacent to the corresponding initialization scan line.

24. The display device of claim 23, wherein the reset transistor and the third and fourth transistors are oxide semiconductor transistors, and
wherein the output transistor and the fifth transistor are low-temperature polycrystalline silicon transistors.

25. The display device of claim 1, wherein a cathode of the light emitting element and a cathode of the light sensing element are electrically connected with a second driving voltage line configured to receive a second driving voltage.

26. The display device of claim 25, wherein, during an active period of the reset control signal, the reset signal has a voltage level lower than the second driving voltage.

27. The display device of claim 25, wherein an anode of the light sensing element is electrically connected with the first sensing node.

28. The display device of claim 1, further comprising:
a base layer;
a circuit layer on the base layer and including the pixel driving circuit and the sensor driving circuit; and
an element layer on the circuit layer and including the light emitting element and the light sensing element.

29. The display device of claim 28, wherein the light emitting element includes an organic light emitting diode, and
wherein the light sensing element includes an organic photodiode.

30. A display device comprising:
a base layer;
a circuit layer on the base layer and including a pixel driving circuit and a sensor driving circuit; and
an element layer on the circuit layer and including a light emitting element connected with the pixel driving circuit and a light sensing element connected with the sensor driving circuit,
wherein the sensor driving circuit includes:
a reset transistor including a first electrode configured to receive a reset signal, a second electrode connected with a first sensing node, and a third electrode configured to receive a reset control signal;
an amplification transistor including a first electrode configured to receive a sensing driving voltage, a second electrode connected with a second sensing node, and a third electrode connected with the first sensing node; and an output transistor including a first electrode connected with the second sensing node, a second electrode connected with a sensing line, and a third electrode configured to receive an output control signal, wherein the reset transistor is an oxide semiconductor transistor.

31. The display device of claim 30, wherein the pixel driving circuit includes:
   a first transistor connected between a first driving voltage line configured to receive a first driving voltage and the light emitting element;
   a second transistor connected between a data line and a first electrode of the first transistor;
   a third transistor connected between a second electrode of the first transistor and a first node and configured to receive a first scan signal;
   a fourth transistor connected between a first initialization line to which a first initialization voltage is applied and the first node and configured to receive a second scan signal; and
   a fifth transistor connected between a second initialization line to which a second initialization voltage is applied and an anode of the light emitting element and configured to receive a third scan signal, and
   wherein the third and fourth transistors are oxide semiconductor transistors.

32. The display device of claim 31, wherein the reset transistor is configured to receive the first scan signal as the reset control signal.

33. The display device of claim 32, wherein the output transistor is configured to receive the second scan signal as the output control signal.

34. The display device of claim 33, wherein the output transistor is an oxide semiconductor transistor.

35. The display device of claim 31, wherein the reset transistor is configured to receive the second scan signal as the reset signal.

36. The display device of claim 35, wherein an active period of the second scan signal does not overlap an active period of the first scan signal.

37. The display device of claim 31, wherein the amplification transistor is configured to receive one of the first driving voltage, the first initialization voltage, and the second initialization voltage as the sensing driving voltage.

38. The display device of claim 30, wherein a cathode of the light emitting element and a cathode of the light sensing element are electrically connected with a second driving voltage line configured to receive a second driving voltage.

39. The display device of claim 38, wherein, during an active period of the reset control signal, the reset signal has a voltage level lower than the second driving voltage.

40. The display device of claim 38, wherein an anode of the light sensing element is electrically connected with the first sensing node.

* * * * *